(12) United States Patent
Godo et al.

(10) Patent No.: US 12,200,950 B2
(45) Date of Patent: Jan. 14, 2025

(54) ELECTRONIC DEVICE

(71) Applicant: Semiconductor Energy Laboratory Co., Ltd., Atsugi (JP)

(72) Inventors: Hiromichi Godo, Isehara (JP); Yoshiyuki Kurokawa, Sagamihara (JP); Kouhei Toyotaka, Isehara (JP); Kazuki Tsuda, Atsugi (JP); Satoru Ohshita, Hadano (JP); Hidefumi Rikimaru, Tama (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/278,199

(22) PCT Filed: Feb. 24, 2022

(86) PCT No.: PCT/IB2022/051614
§ 371 (c)(1),
(2) Date: Aug. 22, 2023

(87) PCT Pub. No.: WO2022/185151
PCT Pub. Date: Sep. 9, 2022

(65) Prior Publication Data
US 2024/0138167 A1 Apr. 25, 2024
US 2024/0237374 A9 Jul. 11, 2024

(30) Foreign Application Priority Data

Mar. 5, 2021 (JP) .................................. 2021-035374
Mar. 5, 2021 (JP) .................................. 2021-035409

(51) Int. Cl.
*H10K 39/34* (2023.01)
*G06F 3/01* (2006.01)
(Continued)

(52) U.S. Cl.
CPC ............. *H10K 39/34* (2023.02); *G06F 3/013* (2013.01); *G09G 3/3208* (2013.01); *H10K 59/65* (2023.02);
(Continued)

(58) Field of Classification Search
CPC .................. G06F 3/013; G09G 3/3208; G09G 2330/021; G09G 2354/00; G09G 2360/14; H10K 39/34; H10K 59/65
See application file for complete search history.

(56) References Cited

U.S. PATENT DOCUMENTS 5,206,749 A 4/1993 Zavracky et al.
5,256,562 A 10/1993 Vu et al.
(Continued)

FOREIGN PATENT DOCUMENTS

CN 112313701 A 2/2021
CN 212694165 U 3/2021
(Continued)

OTHER PUBLICATIONS

International Search Report (Application No. PCT/IB2022/051614) Dated Jun. 7, 2022.
(Continued)

*Primary Examiner* — Ryan A Lubit
(74) *Attorney, Agent, or Firm* — Eric J. Robinson; Robinson Intellectual Property Law Office, P.C.

(57) ABSTRACT

An electronic device having an eye tracking function is provided. The electronic device includes a display device and an optical system. The display device includes a first light-emitting element, a second light-emitting element, a sensor portion, and a driver circuit portion. The sensor portion includes a light-receiving element. The first light-emitting element has a function of emitting infrared light or visible light. The second light-emitting element has a func-
(Continued)

tion of emitting light of a color different from that of light emitted from the first light-emitting element. When the first light-emitting element emits infrared light, the light-receiving element has a function of detecting the infrared light that is emitted from the first light-emitting element and reflected by an eyeball of a user. When the first light-emitting element emits visible light, the light-receiving element has a function of detecting the visible light that is emitted from the first light-emitting element and reflected by the eyeball of the user. The first light-emitting element and the second light-emitting element are placed in one layer. The layer where the first light-emitting element and the second light-emitting element are positioned overlaps with the sensor portion.

21 Claims, 30 Drawing Sheets

(51) Int. Cl.
  *G09G 3/3208* (2016.01)
  *H10K 59/65* (2023.01)
(52) U.S. Cl.
  CPC .............. *G09G 2330/021* (2013.01); *G09G 2354/00* (2013.01); *G09G 2360/14* (2013.01)

(56) References Cited

U.S. PATENT DOCUMENTS

| | | | |
|---|---|---|---|
| 5,258,320 A | 11/1993 | Zavracky et al. | |
| 5,258,325 A | 11/1993 | Spitzer et al. | |
| 5,300,788 A | 4/1994 | Fan et al. | |
| 5,317,236 A | 5/1994 | Zavracky et al. | |
| 5,317,436 A | 5/1994 | Spitzer et al. | |
| 5,331,149 A | 7/1994 | Spitzer et al. | |
| 5,362,671 A | 11/1994 | Zavracky et al. | |
| 5,376,561 A | 12/1994 | Vu et al. | |
| 5,376,979 A | 12/1994 | Zavracky et al. | |
| 5,377,031 A | 12/1994 | Vu et al. | |
| 5,396,304 A | 3/1995 | Salerno et al. | |
| 5,420,055 A | 5/1995 | Vu et al. | |
| 5,438,241 A | 8/1995 | Zavracky et al. | |
| 5,444,557 A | 8/1995 | Spitzer et al. | |
| 5,453,405 A | 9/1995 | Fan et al. | |
| 5,467,154 A | 11/1995 | Gale et al. | |
| 5,475,514 A | 12/1995 | Salerno et al. | |
| 5,499,124 A | 3/1996 | Vu et al. | |
| 5,528,397 A | 6/1996 | Zavracky et al. | |
| 5,539,550 A | 7/1996 | Spitzer et al. | |
| 5,578,865 A | 11/1996 | Vu et al. | |
| 5,581,385 A | 12/1996 | Spitzer et al. | |
| 5,583,335 A | 12/1996 | Spitzer et al. | |
| 5,654,811 A | 8/1997 | Spitzer et al. | |
| 5,661,371 A | 8/1997 | Salerno et al. | |
| 5,666,175 A | 9/1997 | Spitzer et al. | |
| 5,692,820 A | 12/1997 | Gale et al. | |
| 5,702,963 A | 12/1997 | Vu et al. | |
| 5,705,424 A | 1/1998 | Zavracky et al. | |
| 5,713,652 A | 2/1998 | Zavracky et al. | |
| 5,736,768 A | 4/1998 | Zavracky et al. | |
| 5,743,614 A | 4/1998 | Salerno et al. | |
| 5,751,261 A | 5/1998 | Zavracky et al. | |
| 5,757,445 A | 5/1998 | Vu et al. | |
| 5,861,929 A | 1/1999 | Spitzer | |
| 6,043,800 A | 3/2000 | Spitzer et al. | |
| 6,072,445 A | 6/2000 | Spitzer et al. | |
| 6,121,950 A | 9/2000 | Zavracky et al. | |
| 6,140,980 A | 10/2000 | Spitzer et al. | |
| 6,143,582 A | 11/2000 | Vu et al. | |
| 6,232,136 B1 | 5/2001 | Zavracky et al. | |
| 6,317,175 B1 | 11/2001 | Salerno et al. | |
| 6,320,568 B1 | 11/2001 | Zavracky | |
| 6,403,985 B1 | 6/2002 | Fan et al. | |
| 6,414,783 B2 | 7/2002 | Zavracky et al. | |
| 6,424,020 B1 | 7/2002 | Vu et al. | |
| 6,486,929 B1 | 11/2002 | Vu et al. | |
| 6,511,187 B1 | 1/2003 | Salerno et al. | |
| 6,521,940 B1 | 2/2003 | Vu et al. | |
| 6,558,008 B1 | 5/2003 | Salerno et al. | |
| 6,593,978 B2 | 7/2003 | Vu et al. | |
| 6,608,654 B2 | 8/2003 | Zavracky et al. | |
| 6,627,953 B1 | 9/2003 | Vu et al. | |
| 6,636,185 B1 | 10/2003 | Spitzer et al. | |
| 6,919,935 B2 | 7/2005 | Vu et al. | |
| 7,075,501 B1 | 7/2006 | Spitzer et al. | |
| 8,987,651 B2 | 3/2015 | Kurokawa | |
| 9,264,693 B2 | 2/2016 | Kurokawa | |
| 9,541,386 B2 | 1/2017 | Kurokawa | |
| 10,319,266 B1* | 6/2019 | Percival | G02B 27/0172 |
| 10,607,524 B2* | 3/2020 | Jia | G06F 3/013 |
| 2003/0020084 A1 | 1/2003 | Fan et al. | |
| 2003/0057425 A1 | 3/2003 | Zavracky et al. | |
| 2003/0117369 A1 | 6/2003 | Spitzer et al. | |
| 2004/0085292 A1 | 5/2004 | Spitzer et al. | |
| 2015/0311258 A1* | 10/2015 | Kim | H10K 39/32 257/40 |
| 2020/0091214 A1* | 3/2020 | Ikeda | H01L 27/14689 |
| 2020/0329561 A1 | 10/2020 | Lee | |
| 2021/0208438 A1* | 7/2021 | Ni | G06F 3/042 |
| 2021/0279449 A1* | 9/2021 | Yamazaki | G06V 40/176 |
| 2021/0287602 A1* | 9/2021 | Chen | H04B 10/116 |
| 2021/0325677 A1* | 10/2021 | Gao | G02B 27/0093 |
| 2022/0007952 A1* | 1/2022 | Lee | A61B 5/7207 |
| 2022/0107517 A1* | 4/2022 | Yaroshchuk | G02B 3/14 |
| 2023/0144505 A1 | 5/2023 | Negoro et al. | |

FOREIGN PATENT DOCUMENTS

| | | | |
|---|---|---|---|
| CN | 113692784 A | 11/2021 | |
| DE | 69325110 | 12/1999 | |
| EP | 0725939 A | 8/1996 | |
| EP | 0853254 A | 7/1998 | |
| EP | 0909972 A | 4/1999 | |
| EP | 0935389 A | 8/1999 | |
| EP | 1237191 A | 9/2002 | |
| EP | 3957138 A | 2/2022 | |
| JP | 07-504764 | 5/1995 | |
| JP | 2008-091037 A | 4/2008 | |
| JP | 2011-215353 A | 10/2011 | |
| JP | 2019-500660 | 1/2019 | |
| JP | 2019-512726 | 5/2019 | |
| KR | 2021-0022642 A | 3/2021 | |
| TW | 202044956 | 12/2020 | |
| WO | WO-1992/012453 | 7/1992 | |
| WO | WO-1992/013363 | 8/1992 | |
| WO | WO-1993/015589 | 8/1993 | |
| WO | WO-1993/016491 | 8/1993 | |
| WO | WO-1993/018428 | 9/1993 | |
| WO | WO-1994/007177 | 3/1994 | |
| WO | WO-1994/010600 | 5/1994 | |
| WO | WO-1994/010794 | 5/1994 | |
| WO | WO-1994/018791 | 8/1994 | |
| WO | WO-1995/025983 | 9/1995 | |
| WO | WO-2018224910 A1 * | 12/2018 | G06N 3/0454 |
| WO | WO-2019/243955 | 12/2019 | |
| WO | WO-2020/214380 | 10/2020 | |

OTHER PUBLICATIONS

Written Opinion (Application No. PCT/IB2022/051614) Dated Jun. 7, 2022.

* cited by examiner

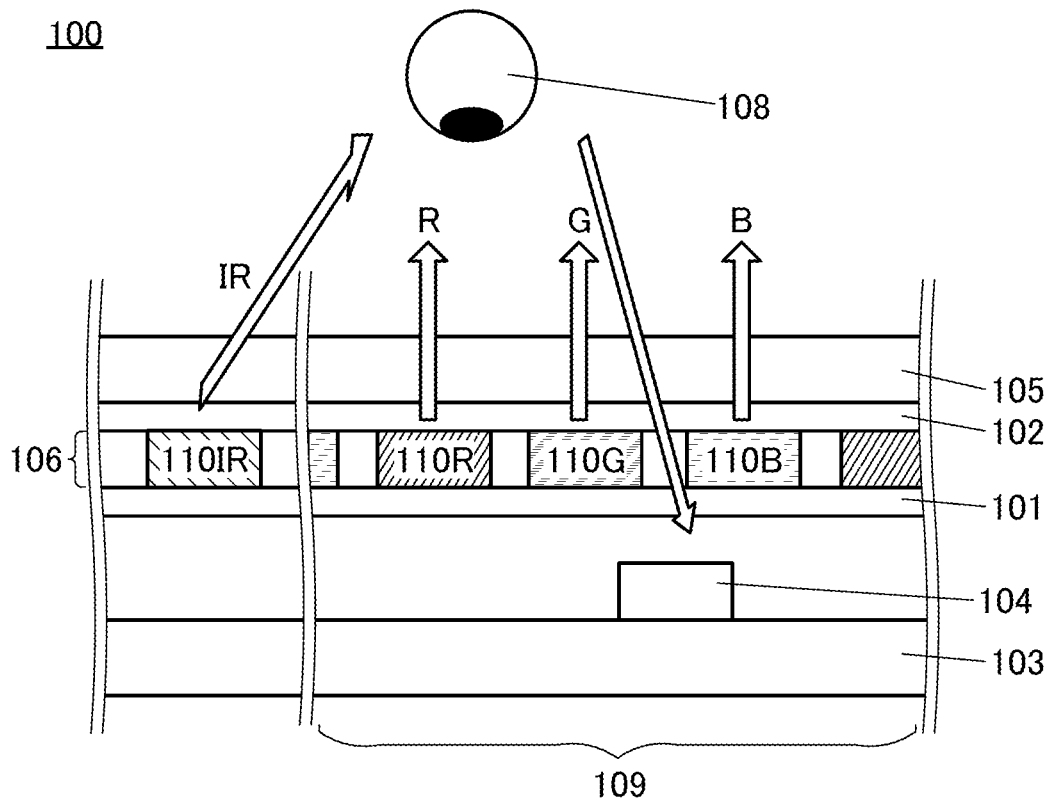
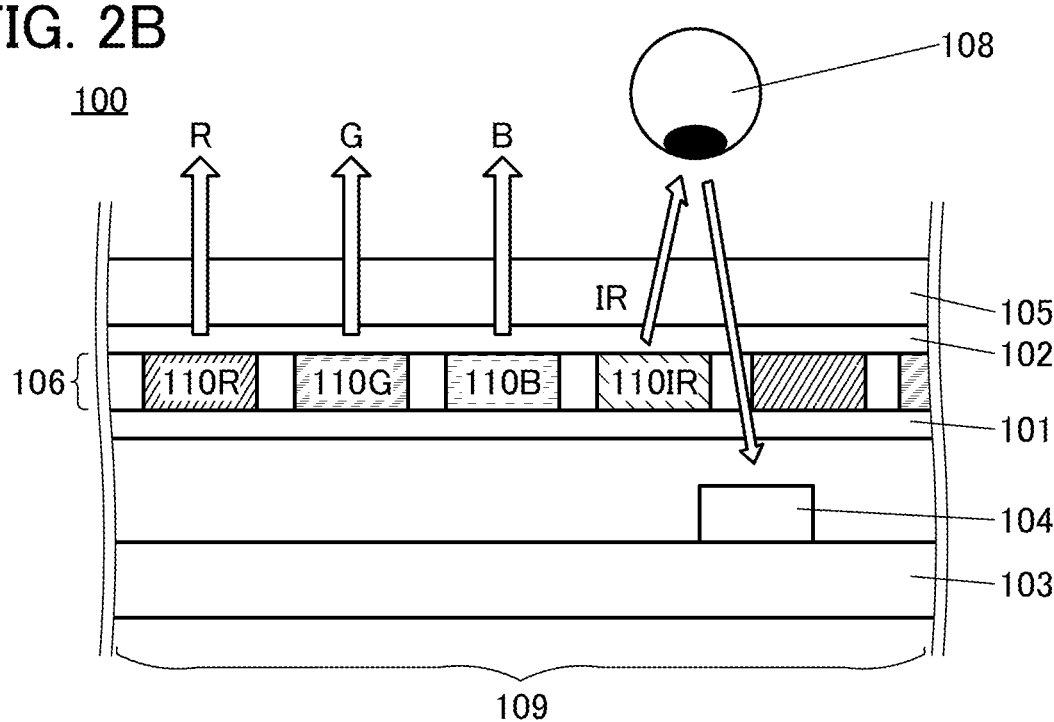

380B

380C

ELECTRONIC DEVICE

TECHNICAL FIELD

One embodiment of the present invention relates to a display device or an electronic device.

Note that one embodiment of the present invention is not limited to the above technical field. Examples of a technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof. A semiconductor device refers to any device that can function by utilizing semiconductor characteristics.

BACKGROUND ART

In recent years, devices for virtual reality (VR) or augmented reality (AR) have been attracting attention. Furthermore, devices with an eye tracking function for VR or AR have been developed. Such devices with an eye tracking function for VR or AR can be used for analysis of consumer behavior, image processing, avatar creation, and an operation using gaze, for example.

For example, Patent Document 1 discloses a head-mounted display that performs eye tracking by utilizing an image of light from a light source reflected by a cornea.

REFERENCE

Patent Document

[Patent Document 1] Japanese Translation of PCT International Application No. 2019-512726

SUMMARY OF THE INVENTION

Problems to be Solved by the Invention

Conventional devices for VR or AR each include a display, a light source, a camera, and a lot of sensors, and thus housings become bulky. In addition, power consumption is high.

In view of the above problems, an object of one embodiment of the present invention is to provide an electronic device with an eye tracking function in which its housing is less bulky. Another object of one embodiment of the present invention is to provide a low power consuming electronic device with an eye tracking function. Another object of one embodiment of the present invention is to provide a small or lightweight electronic device with an eye tracking function. Another object of one embodiment of the present invention is to provide an electronic device with an eye tracking function that is provided with a high-resolution display device. Another object of one embodiment of the present invention is to provide an electronic device with an eye tracking function that is provided with a highly reliable display device. Another object of one embodiment of the present invention is to provide an electronic device with a novel structure.

Note that the description of these objects does not preclude the existence of other objects. Note that one embodiment of the present invention does not have to achieve all these objects. Note that objects other than these can be derived from the description of the specification, the drawings, the claims, and the like.

Means for Solving the Problems

One embodiment of the present invention is an electronic device with an eye tracking function including a display device and an optical system; the display device includes a first light-emitting element, a second light-emitting element, a sensor portion, and a driver circuit portion; the sensor portion includes a light-receiving element; the first light-emitting element has a function of emitting infrared light; the second light-emitting element has a function of emitting visible light; the light-receiving element has a function of detecting the infrared light that is emitted from the first light-emitting element and reflected by an eyeball of a user; the first light-emitting element and the second light-emitting element are placed in one layer; and the layer where the first light-emitting element and the second light-emitting element are positioned overlaps with the sensor portion.

In the above electronic device, it is preferable that the display device further include a first substrate and a second substrate; the first substrate be placed between the first light-emitting element and the second light-emitting element and the sensor portion; the second substrate overlap with the first substrate with the first light-emitting element and the second light-emitting element therebetween; the first substrate have a light-transmitting property at least with respect to infrared light; and the second substrate have a light-transmitting property with respect to visible light and infrared light.

In any one of the above electronic devices, the light-receiving element is preferably formed over a silicon substrate.

Another embodiment of the present invention is an electronic device with an eye tracking function including a display device and an optical system; the display device includes a first light-emitting element, a second light-emitting element, a sensor portion, and a driver circuit portion; the sensor portion includes a light-receiving element; the first light-emitting element has a function of emitting infrared light; the second light-emitting element has a function of emitting visible light; the light-receiving element has a function of detecting the infrared light that is emitted from the first light-emitting element and reflected by an eyeball of a user; and the first light-emitting element, the second light-emitting element, and the sensor portion are placed parallel to a top surface of a pixel electrode included in the first light-emitting element and the second light-emitting element.

In the above electronic device, it is preferable that the display device further include the first substrate and the second substrate; the first substrate overlap with the second substrate with the first light-emitting element, the second light-emitting element, and the sensor portion therebetween; and the second substrate have a light-transmitting property with respect to visible light and infrared light.

In any one of the above electronic devices, the first light-emitting element is preferably placed outside the display region. Alternatively, the first light-emitting element is preferably placed in the display region.

In any one of the above electronic devices, the sensor portion is preferably placed in the display region. Alternatively, the sensor portion is preferably placed outside the display region.

In any one of the above electronic devices, it is preferable that the display device further include an image processing portion, and eye tracking be performed using the first light-emitting element, the sensor portion, and the image processing portion. Furthermore, the image processing portion preferably includes an arithmetic circuit having a function of performing a product-sum operation. In addition, the arithmetic circuit preferably includes a transistor including a metal oxide in a channel formation region.

In any one of the above electronic devices, the second light-emitting element preferably has a function of emitting light of red, green, or blue.

In any one of the above electronic devices, it is preferable that a light-emitting layer included in the first light-emitting element and a light-emitting layer included in the second light-emitting element each include a light-emitting organic compound.

Another embodiment of the present invention is an electronic device with an eye tracking function. The electronic device includes a display device and an optical system. The display device includes a first light-emitting element, a second light-emitting element, an organic photodiode, and a driver circuit portion. The first light-emitting element and the second light-emitting element have a function of emitting visible light. The organic photodiode has a function of detecting the visible light emitted from the first light-emitting element and reflected by an eyeball of a user. The first light-emitting element is placed outside the display region in a top view. The second light-emitting element is placed inside the display region in the top view. The first light-emitting element, the second light-emitting element, and the organic photodiode are placed in one layer.

In the above electronic device, it is preferable that the display device further include the first substrate and the second substrate; the first light-emitting element, the second light-emitting element, and the organic photodiode be placed between the first substrate and the second substrate; the first light-emitting element, the second light-emitting element, and the organic photodiode be placed parallel to a top surface of the first substrate; and the second substrate have a light-transmitting property with respect to visible light.

In the above electronic device, the organic photodiode is preferably placed inside the display region in the top view. Alternatively, the organic photodiode is preferably placed outside the display region in the top view.

In the above electronic device, it is preferable that the display device further include an image processing portion, and eye tracking be performed using the first light-emitting element, the organic photodiode, and the image processing portion. Furthermore, the image processing portion preferably includes an arithmetic circuit having a function of performing a product-sum operation. In addition, the arithmetic circuit preferably includes a transistor including a metal oxide in a channel formation region.

In the above electronic device, the first light-emitting element preferably has a function of emitting red light.

In the above electronic device, it is preferable that a light-emitting layer included in the first light-emitting element and a light-emitting layer included in the second light-emitting element include a light-emitting organic compound.

Effect of the Invention

One embodiment of the present invention can provide an electronic device with an eye tracking function in which its housing is less bulky. Another embodiment of the present invention can provide a low power consuming electronic device with an eye tracking function. Another embodiment of the present invention can provide a small or lightweight electronic device with an eye tracking function. Another embodiment of the present invention can provide an electronic device with an eye tracking function that is provided with a high-resolution display device. Another embodiment of the present invention can provide an electronic device with an eye tracking function that is provided with a highly reliable display device. Another embodiment of the present invention can provide an electronic device with a novel structure.

Note that the description of these effects does not preclude the existence of other effects. One embodiment of the present invention does not need to have all of these effects. Note that effects other than these can be derived from the description of the specification, the drawings, the claims, and the like.

BRIEF DESCRIPTION OF THE DRAWINGS

FIG. 2A and FIG. 2B are diagrams illustrating structure examples of a display device.

MODE FOR CARRYING OUT THE INVENTION

Figure 1A:
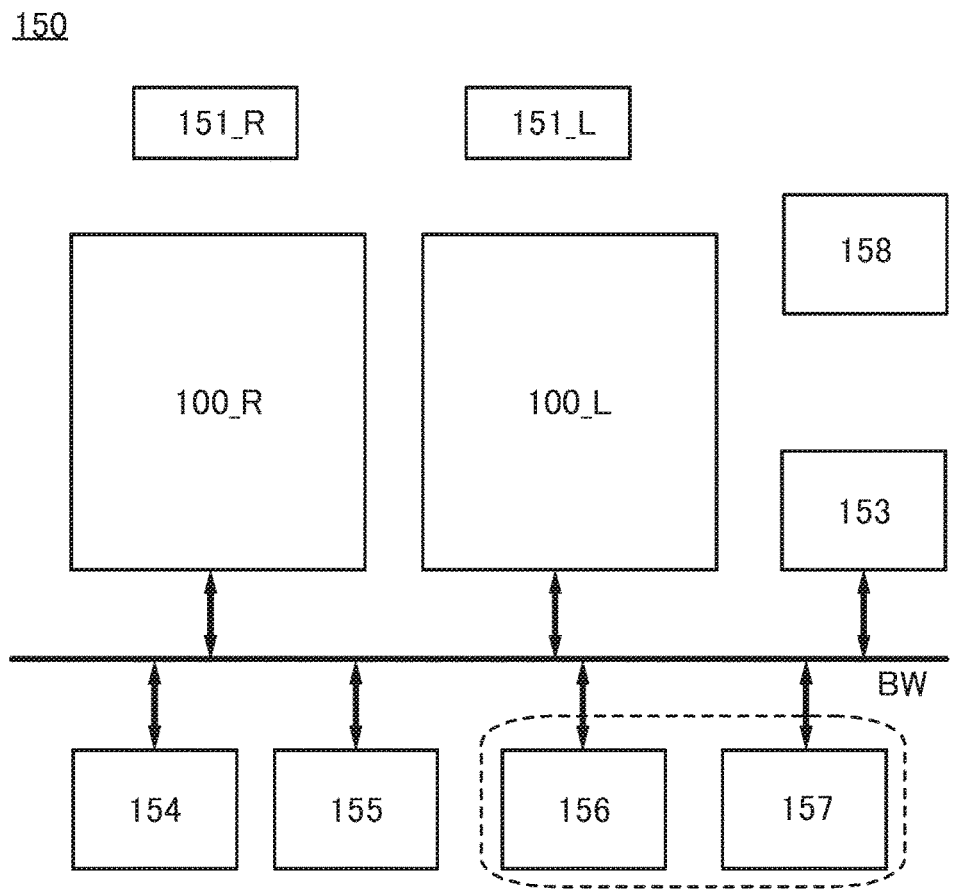
FIG. 1A and FIG. 1B are diagrams illustrating a structure example of an electronic device.

Embodiments will be described below with reference to the drawings. Note that the embodiments can be implemented in many different modes, and it is readily understood by those skilled in the art that modes and details thereof can be changed in various ways without departing from the spirit and scope thereof. Therefore, the present invention should not be construed as being limited to the description of embodiments below.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, ordinal numbers such as "first" and "second" are used in order to avoid confusion among components and do not limit the number.

In addition, in this specification and the like, the term "film" and the term "layer" can be interchanged with each other. For example, in some cases, the term "conductive layer" and the term "insulating layer" can be interchanged with the term "conductive film" and the term "insulating film", respectively.

In this specification and the like, "parallel" indicates a state where two straight lines are placed at an angle greater than or equal to −10° and less than or equal to 10°. Accordingly, the case where the angle is greater than or equal to −5° and less than or equal to 5° is also included. Furthermore, "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Moreover, "substantially perpendicular" indicates a state where two straight lines are placed at an angle greater than or equal to 60° and less than or equal to 120°.

Note that in this specification, an EL layer means a layer containing at least a light-emitting substance (also referred to as a light-emitting layer) or a stacked-layer body including the light-emitting layer provided between a pair of electrodes of a light-emitting element.

In this specification and the like, a display panel that is one embodiment of a display device has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

In this embodiment, structure examples and operation examples of electronic devices of embodiments of the present invention will be described.

One embodiment of the present invention is an electronic device that is provided with a display device including a light-emitting element (it can also be referred to as a light-emitting device) and a light-receiving element (it can also be referred to as a light-receiving device or a photoelectric conversion device). The display device includes two or more light-emitting elements emitting light of different colors, and includes at least a light-emitting element emitting infrared light. Note that although infrared light is invisible light, a "color" described in this specification and the like may include infrared light. The light-emitting elements each include a pair of electrodes and an EL layer therebetween. The light-emitting elements are preferably organic EL elements (organic electroluminescent elements). The two or more light-emitting elements that exhibit different colors include EL layers containing different materials. For example, four kinds of light-emitting elements emitting visible light of red (R), green (G), and blue (B) and infrared light (IR) are included, whereby an electronic device that is provided with a full-color display device with an eye tracking function can be achieved.

Here, one embodiment of the present invention includes a light-emitting element having a function of emitting infrared light and a light-receiving element having a function of detecting the infrared light. Thus, one embodiment of the present invention can achieve an eye tracking function utilizing infrared light. That is, an eyeball of a user is irradiated with the infrared light emitted from the light-emitting element, and the infrared light reflected by the eyeball of the user is detected by the light-receiving element, whereby the user's gaze can be tracked.

In this case, one embodiment of the present invention performs eye tracking using invisible infrared light, and thus can perform the eye tracking without hindering display by the electronic device. Since unintended light is not recognized by the user, a stress-free use of the electronic device can be offered.

Furthermore, the light-emitting element of infrared light is provided in a manner similar to those of light-emitting elements for display (R, G, B, and the like), which eliminates the need for providing a light-emitting apparatus of infrared light for eye tracking. This can contribute to space saving of the electronic device, leading to a reduction in the size and weight of the electronic device or an increase in the size of a battery.

Another embodiment of the present invention is an electronic device provided with a display device including a light-emitting element and a light-receiving element. The display device includes two or more light-emitting elements that emit light of different colors. The two or more light-emitting elements that exhibit different colors include EL layers containing different materials. For example, three kinds of light-emitting elements emitting visible light of red (R), green (G), and blue (B) are included, whereby an electronic device that is provided with a full-color display device with an eye tracking function can be achieved.

Here, another embodiment of the present invention includes a light-emitting element having a function of emitting visible light and a light-receiving element having a function of detecting the visible light. Thus, another embodiment of the present invention can achieve an eye tracking function utilizing visible light. That is, an eyeball of a user is irradiated with the visible light emitted from the light-emitting element, and the visible light reflected by the eyeball of the user is detected by the light-receiving element, whereby the user's gaze can be tracked.

In this case, another embodiment of the present invention performs eye tracking using visible light emitted from a light-emitting element provided outside a display region, whereby the eye tracking can be performed without hindering display by the electronic device.

Furthermore, the light-emitting element of visible light for the eye tracking is provided in a manner similar to those of light-emitting elements for display (R, G, B, and the like), which eliminates the need for providing a light-emitting apparatus of visible light for the eye tracking. This can contribute to space saving of the electronic device, leading to a reduction in the size and weight of the electronic device or an increase in the size of a battery.

Furthermore, when an element formed without using a metal mask or an FMM (a fine metal mask or a high-resolution metal mask) (such element is referred to as an element having an MML structure in some cases) is used, an electronic device that is provided with a display device having both an eye tracking function and high resolution. Note that the details of the MML structure will be described in Embodiment 4.

First, a structure example and an operation example of an electronic device with an eye tracking function utilizing infrared light are described. Note that the following description includes a description of a structure example and an operation example of an electronic device with an eye tracking function utilizing visible light in some cases.

Structure Example 1 of Electronic Device

A structure of an electronic device of one embodiment of the present invention is described with reference to block diagrams illustrated in FIG. 1A and FIG. 1B. An electronic device 150 illustrated in FIG. 1A includes a display device 100 (100_R and 100_L), an optical system 151 (151_R and 151_L), a motion detection portion 153, an audio 154, a camera 155, a control portion 156, a communication portion 157, and a battery 158. The display device 100, the motion detection portion 153, the audio 154, the camera 155, the control portion 156, and the communication portion 157 can transmit and receive various kinds of signals to and from one another through a bus wiring BW.

Figure 1B:
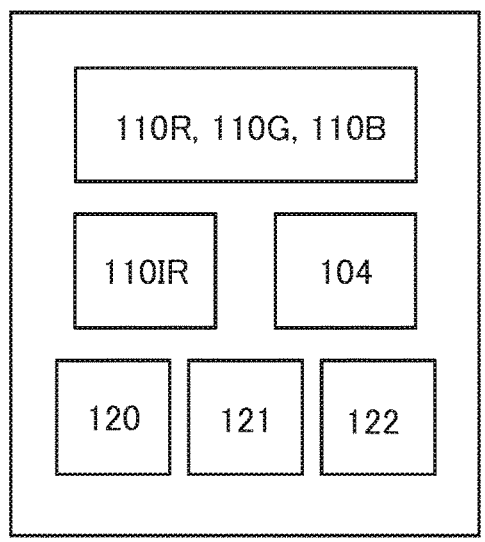

As illustrated in FIG. 1B, the display device 100 includes a light-emitting element 110R, a light-emitting element 110G, and a light-emitting element 110B that serve as display elements, a light-emitting element 110IR that serves as a light source, a sensor portion 104, a driver circuit portion 120, an image processing portion 121, and a frame memory 122. The driver circuit portion 120 includes a gate driver circuit and a source driver circuit. Note that one or more gate driver circuits may be provided and one or more source driver circuits may be provided. Although in the example illustrated in FIG. 1A, two display devices 100, one for the right eye and the other for the left eye, are provided, one or three or more display devices may be provided.

Note that hereafter, in the description common to the light-emitting element 110R, the light-emitting element 110G, the light-emitting element 110B, the light-emitting element 110IR, and a light-emitting element 110LS that is described later, the alphabets are omitted from the reference numerals and the term "light-emitting element 110" is used in some cases. Alternatively, in the case where the term "light-emitting element 110" is used, it refers to one or more of the light-emitting element 110R, the light-emitting element 110G, the light-emitting element 110B, the light-emitting element 110IR, and the light-emitting element 110LS in some cases.

The optical system 151 includes a lens, for example. Furthermore, a reflective plate, a half mirror, a waveguide, and the like may be included as needed. Although in the example illustrated in FIG. 1A, two optical systems 151, one for the right eye and the other for the left eye, are provided, one or three or more optical systems may be provided.

The audio 154 includes, for example, one or more of a microphone and a speaker. The motion detection portion 153 includes an inertial sensor and has a function of sensing the motion of a user's body. Note that the inertial sensor here refers to a sensor for sensing the acceleration and angular velocity of an object. The control portion 156 includes a CPU, a GPU, and a memory. The communication portion 157 can transmit and receive data to and from another terminal or a server on a network through wireless communication. Note that in FIG. 1A, the control portion 156 and the communication portion 157 surrounded by a dotted line may be provided separately from the electronic device 150. In that case, the electronic device can be less bulky.

Image data generated by the control portion 156 is transmitted to the display device 100 through the bus wiring BW. The image data is stored in the frame memory 122 and then displayed by the light-emitting element 110R, the light-emitting element 110G, and the light-emitting element 110B through the source driver included in the driver circuit portion 120.

Data (analog data) obtained by the sensor portion 104 is converted into digital data in the image processing portion 121 and transmitted to the control portion 156. For example, the sensor portion 104 obtains an image of an eye of the user, and the image processing portion 121 identifies the position of the user's gaze from the obtained image. The control portion 156 receives the position data of the gaze from the image processing portion 121 and the position data is reflected in image data seen by the user.

The image processing portion 121 has a function of image analysis. By the image analysis, the position of the user's gaze can be identified from the image of the eye of the user obtained by the sensor portion 104. That is, eye tracking can be performed using the image processing portion 121. For the above image analysis, a neural network, an arithmetic circuit having a function of performing a product-sum operation, or the like can be used. That is, the image processing portion 121 includes at least one of a processing device capable of executing a program including a neural network and an arithmetic circuit having a function of performing a product-sum operation.

It is particularly preferable that an arithmetic circuit having a function of performing a product-sum operation be used for the above image analysis. The use of the arithmetic circuit enables the image analysis to be performed with low power. Therefore, it is possible to reduce power consumption of the display device of one embodiment of the present invention or the electronic device provided with the display device. Note that details of the arithmetic circuit having a function of performing a product-sum operation will be described in Embodiment 3.

For the above image analysis, a neural network may be used. It is especially preferable to use deep learning for the neural network. For the deep learning, a convolutional neural network (CNN), a recurrent neural network (RNN), an autoencoder (AE), a variational autoencoder (VAE), random forest, a support vector machine, gradient boosting, a generative adversarial network (GAN), or the like is preferably used, for example.

Structures of a display device provided for the electronic device of one embodiment of the present invention will be described below with reference to FIG. 2A to FIG. 6B.

Structure Example 1 of Display Device

A schematic view of the display device 100 illustrated in FIG. 1B that is included in the electronic device of one embodiment of the present invention is illustrated in FIG. 2A and FIG. 2B, FIG. 3A and FIG. 3B, FIG. 5A and FIG. 5B, and FIG. 6A and FIG. 6B. The display device 100 illustrated in FIG. 2A includes a substrate 101, a substrate 102, the light-emitting element 110, and the sensor portion 104. The light-emitting element 110 includes the light-emitting elements serving as display elements and the light-emitting element serving as a light source, and is positioned in a layer 106. The sensor portion 104 is provided over a support plate 103, the substrate 101 is provided over the sensor portion 104, the light-emitting element 110 is provided over the substrate 101, the substrate 102 is provided over the light-emitting element 110, and a protective member 105 is provided over the substrate 102. The display device 100 illustrated in FIG. 2A has a structure in which the light-emitting element 110IR serving as a light source is provided outside a display region 109. Note that the details of the components will be described later.

For example, a structure may be employed where the light-emitting element 110R exhibiting red, the light-emitting element 110G exhibiting green, the light-emitting element 110B exhibiting blue, and the light-emitting element 110IR emitting infrared light are each used as the light-emitting element 110. In this case, the light-emitting element 110R, the light-emitting element 110G, and the light-emitting element 110B function as display elements and the light-emitting element 110IR functions as a light source. There is no particular limitation on the number of the light-emitting elements 110IR, and one or more light-emitting elements 110IR may be included. The light-emitting element 110 is placed in a region interposed between the substrate 101 and the substrate 102. Furthermore, the substrate 101 is placed between the support plate 103 and the light-emitting element 110, and the substrate 102 is placed between the light-emitting element 110 and the protective member 105.

Light emitted from the light-emitting element 110IR preferably includes infrared light, and further preferably includes near-infrared light. For example, near-infrared light having one or more peaks in the range of a wavelength greater than or equal to 700 nm and less than or equal to 2500 nm can be favorably used. Here, the peak refers to the maximum value or the local maximum value. Note that the infrared light is classified into near-infrared light, mid-infrared light, or far-infrared light depending on the wavelength. In other words, the near-infrared light is included in the infrared light.

The sensor portion 104 illustrated in FIG. 2A includes a light-receiving element having a function of detecting infrared light. The light-receiving element preferably has light sensitivity with respect to infrared light, preferably near-infrared light emitted from the light-emitting element 110IR.

As illustrated in FIG. 2A, an image is displayed using light emitted from the light-emitting element 110R, the light-emitting element 110G, and the light-emitting element 110B. In addition, infrared light emitted from the light-emitting element 110IR is reflected by an eyeball 108 of a user and the reflected light is detected by the light-receiving element in the sensor portion 104, so that eye tracking is performed. Thus, the substrate 102 and the protective member 105 need to transmit both the visible light from the light-emitting element 110R, the light-emitting element 110G, and the light-emitting element 110B, and the infrared light reflected by the light-emitting element 110IR and the eyeball 108. It is thus preferable that the substrate 102 and the protective member 105 each have a light-transmitting property with respect to visible light and infrared light. Moreover, the infrared light reflected by the eyeball 108 needs to pass through the substrate 101. It is thus preferable that the substrate 101 have a light-transmitting property with respect to at least infrared light.

For each of the substrate 101 and the substrate 102, an insulator such as glass, quartz, ceramic, sapphire, or stabilized zirconia (e.g., yttria-stabilized zirconia), a resin such as an insulating resin or a conductive resin, a semiconductor such as silicon, germanium, silicon carbide, silicon germanium, gallium arsenide, indium phosphide, or zinc oxide, a metal, an alloy, or the like can be used. Note that the substrate on the side where light from the light-emitting element 110 is extracted is formed using a material that transmits the light. When the substrate 101 and the substrate 102 are formed using a flexible material, the display device 100 can have increased flexibility and moreover, the display device 100 can be reduced in weight and thickness. Furthermore, a polarizing plate may be used as the substrate 101 or the substrate 102.

For each of the substrate 101 and the substrate 102, any of the following may be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for one or both of the substrate 101 and the substrate 102.

Alternatively, the display device of one embodiment of the present invention may have a structure illustrated in FIG. 2B. The display device 100 illustrated in FIG. 2B is different from the display device 100 illustrated in FIG. 2A in that the light-emitting element 110IR serving as a light source is provided in the display region 109. The other components are similar to those of the display device 100 illustrated in FIG. 2A and thus, for their details, the above description relating to FIG. 2A or the like can be referred to.

As described above, in the display device 100 illustrated in FIG. 2A and FIG. 2B, the layer 106 where the light-emitting element 110 including the light-emitting element 110IR is positioned is over and overlaps with the sensor portion 104. In the layer 106 where the light-emitting element 110 is positioned, a common electrode is provided to be shared by the light-emitting elements 110 in some cases. Therefore, without a complicated optical system, the eyeball 108 can be irradiated with light and the light reflected by the eyeball 108 can be received. Furthermore, a distance between the light-emitting element 110IR and the light-receiving element in the sensor portion 104 is relatively small. This can increase the detection sensitivity with respect to the reflected light from the eyeball 108. Since the optical system structure can be simplified, the size of the display device can be reduced. Note that the light-emitting element 110IR may include a portion overlapping with the sensor portion 104 or may include no portion overlapping with the sensor portion 104.

Figure 3A:
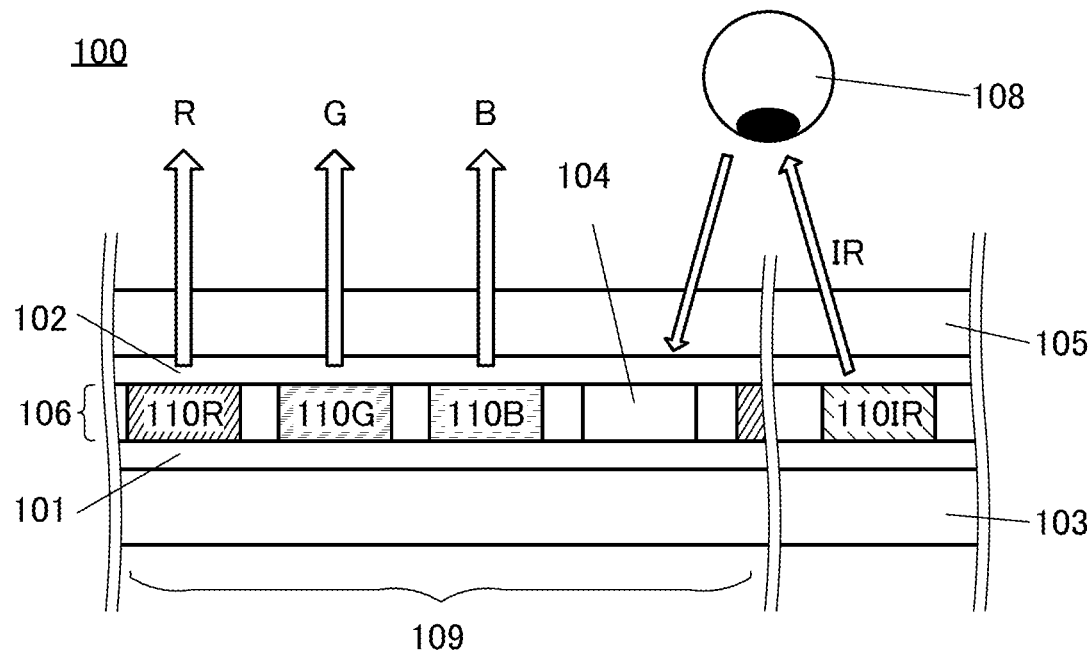
FIG. 3A and FIG. 3B are diagrams illustrating structure examples of a display device.
Figure 3B:
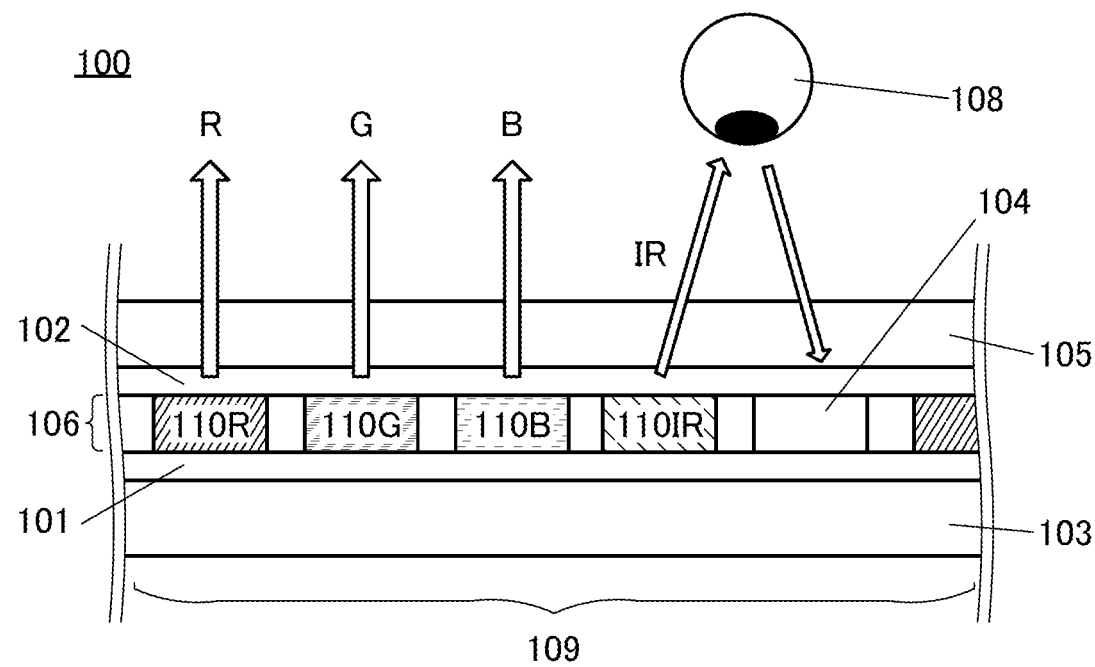

Note that the one embodiment of the present invention is not limited thereto, and the sensor portion 104 may be provided between the substrate 101 and the substrate 102 together with the light-emitting element 110 as illustrated in FIG. 3A and FIG. 3B. In other words, the light-emitting element 110 and the sensor portion 104 may be placed parallel to a top surface of the substrate 101. The sensor portion 104 may be positioned in the layer 106 where the light-emitting element 110 is positioned. Specifically, the display device 100 illustrated in FIG. 3A is different from the display device 100 illustrated in FIG. 2A in that the sensor portion 104 and the light-emitting element 110 are provided between the substrate 101 and the substrate 102. Furthermore, the display device 100 illustrated in FIG. 3B is different from the display device 100 illustrated in FIG. 2B in that the sensor portion 104 and the light-emitting element 110 are provided between the substrate 101 and the substrate 102. In each of the display devices 100 illustrated in FIG. 3A and FIG. 3B, since the sensor portion 104 is provided over the substrate 101, the substrate 101 may have a low light-transmitting property with respect to infrared light or does not need to have a light-transmitting property with respect to infrared light in some cases.

At least one of a pair of electrodes included in the light-emitting element functions as a pixel electrode. In the display device 100 illustrated in FIG. 3A and FIG. 3B, it can be said that the light-emitting element 110 and the sensor portion 104 are placed parallel to a top surface of the pixel electrode included in the light-emitting element 110.

Figure 4:
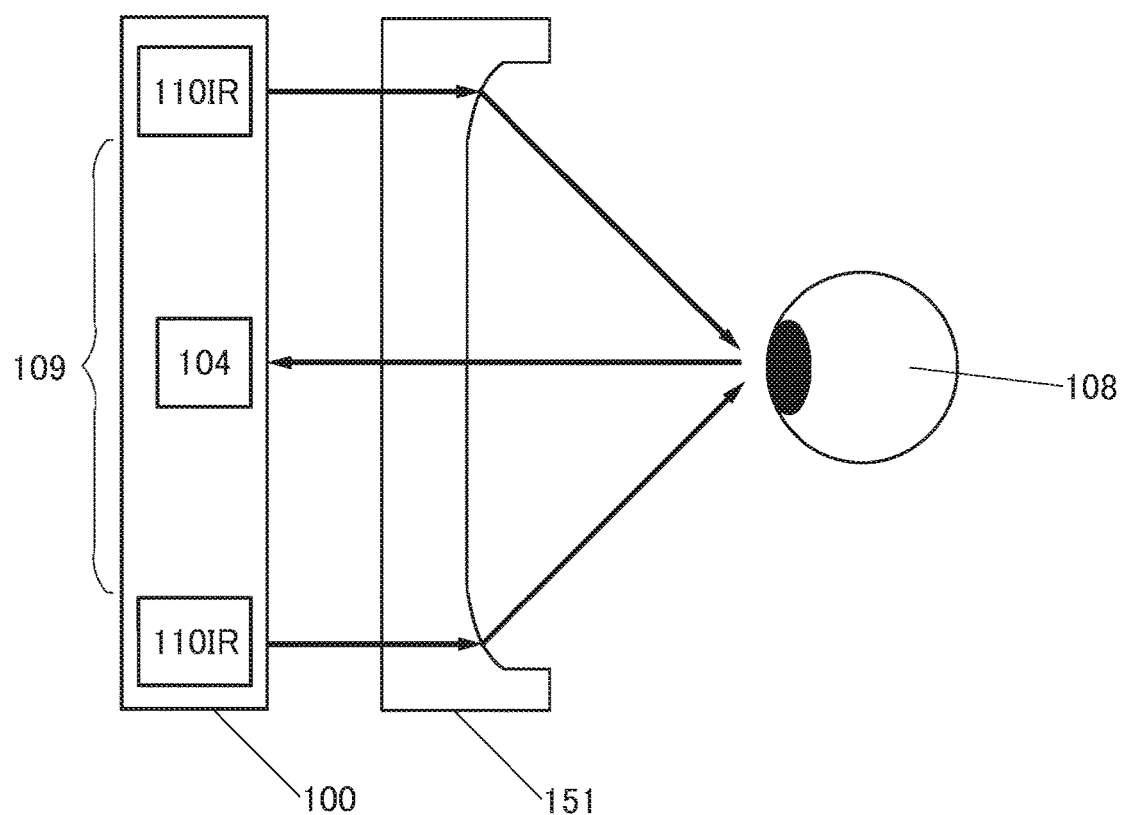
FIG. 4 is a diagram illustrating a structure example of an electronic device.

In the display device 100 illustrated in FIG. 2A and the display device 100 illustrated in FIG. 3A, the light-emitting element 110IR serving as a light source is provided outside the display region 109. In this case, as illustrated in FIG. 4, the optical system 151 is preferably designed such that the optical system 151 provided between the display device 100 and the eyeball 108 is used to irradiate the eyeball of the user with the infrared light emitted from the light-emitting element 110IR. In the above structure, the infrared light emitted from the light-emitting element 110IR is reflected by the eyeball 108 of the user and the reflected light is detected by the light-receiving element in the sensor portion 104, which enables eye tracking.

Figure 5A:
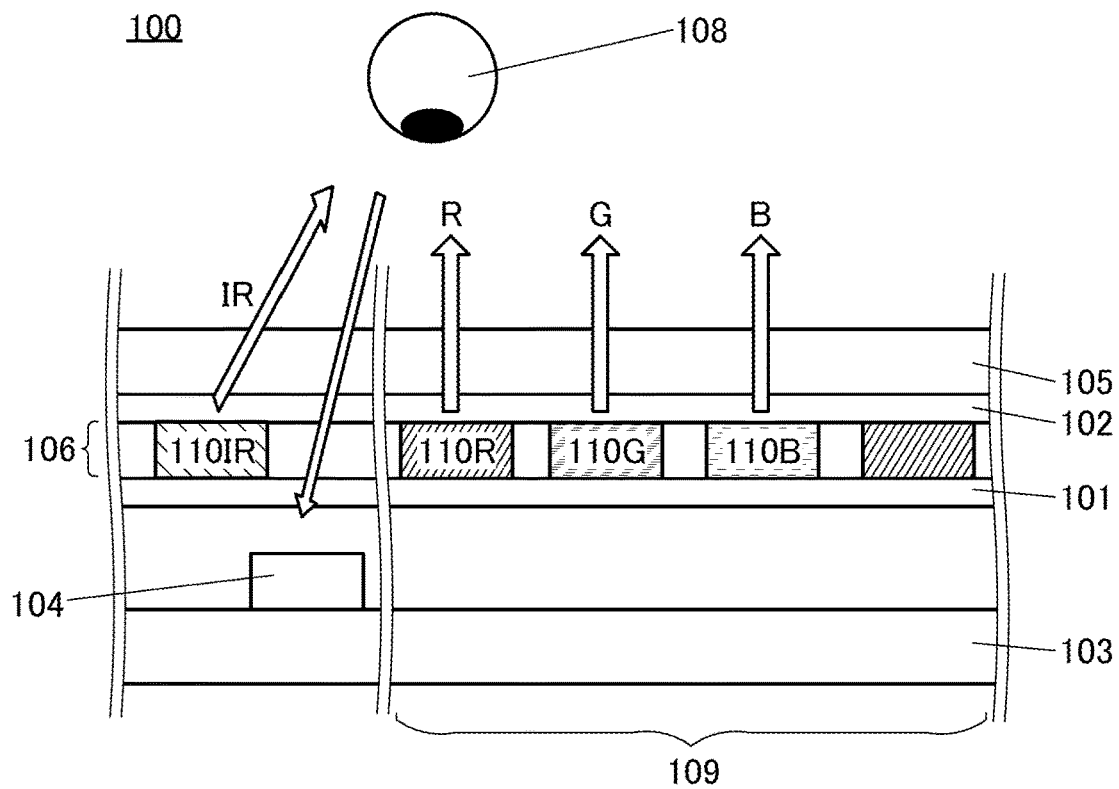
FIG. 5A and FIG. 5B are diagrams illustrating structure examples of a display device.

Although the structure in which the sensor portion 104 is provided in the display region 109 is described above, the present invention is not limited thereto, and the sensor portion 104 may be provided outside the display region 109. Specifically, the display device 100 illustrated in FIG. 5A is different from the display device 100 illustrated in FIG. 2A in that the sensor portion 104 is provided outside the display region 109 together with the light-emitting element 110IR.

Figure 5B:
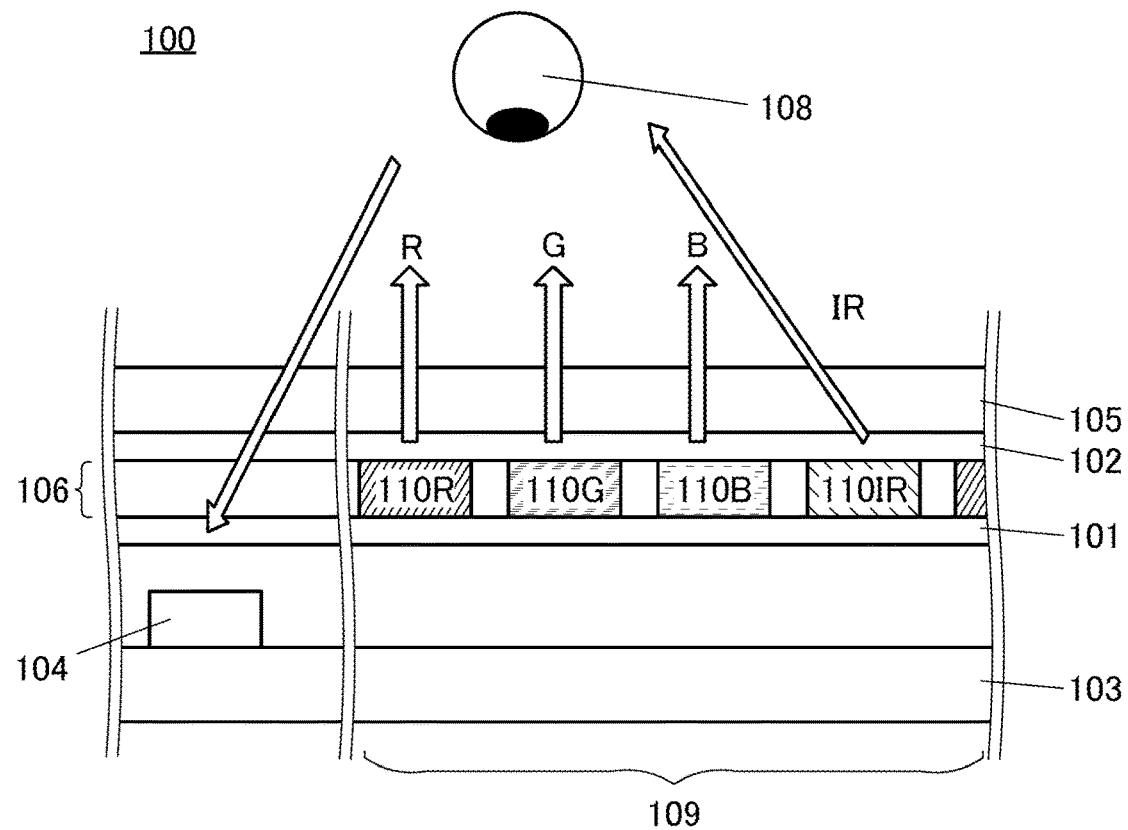
Figure 6A:
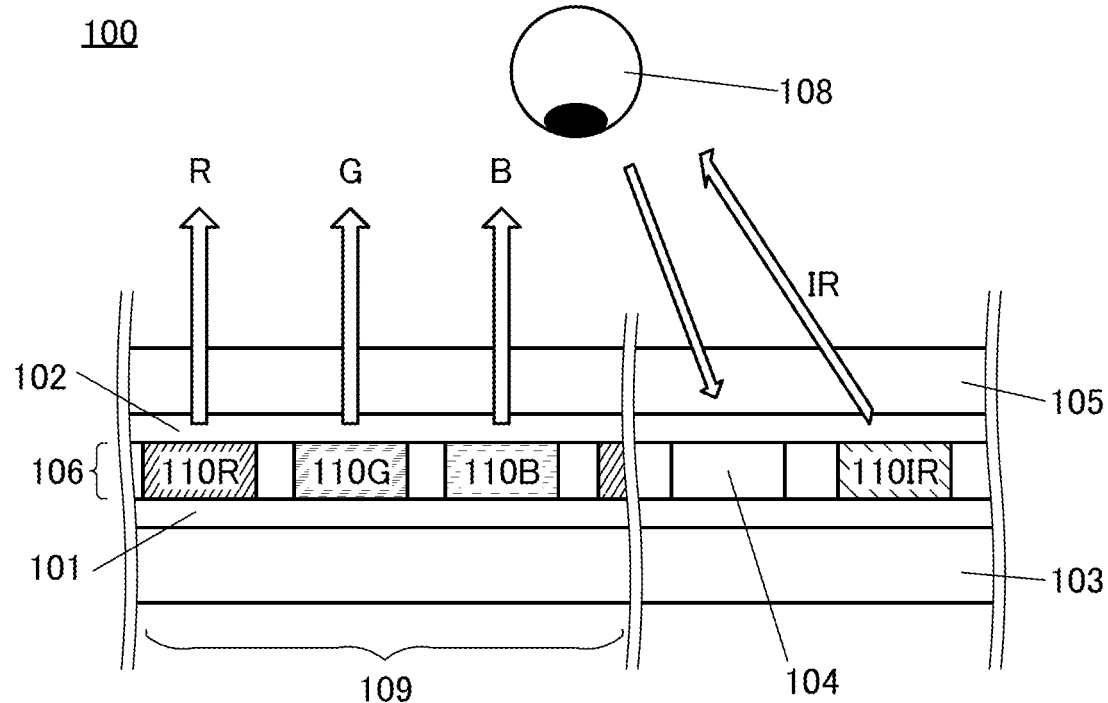
FIG. 6A and FIG. 6B are diagrams illustrating structure examples of a display device.
Figure 6B:
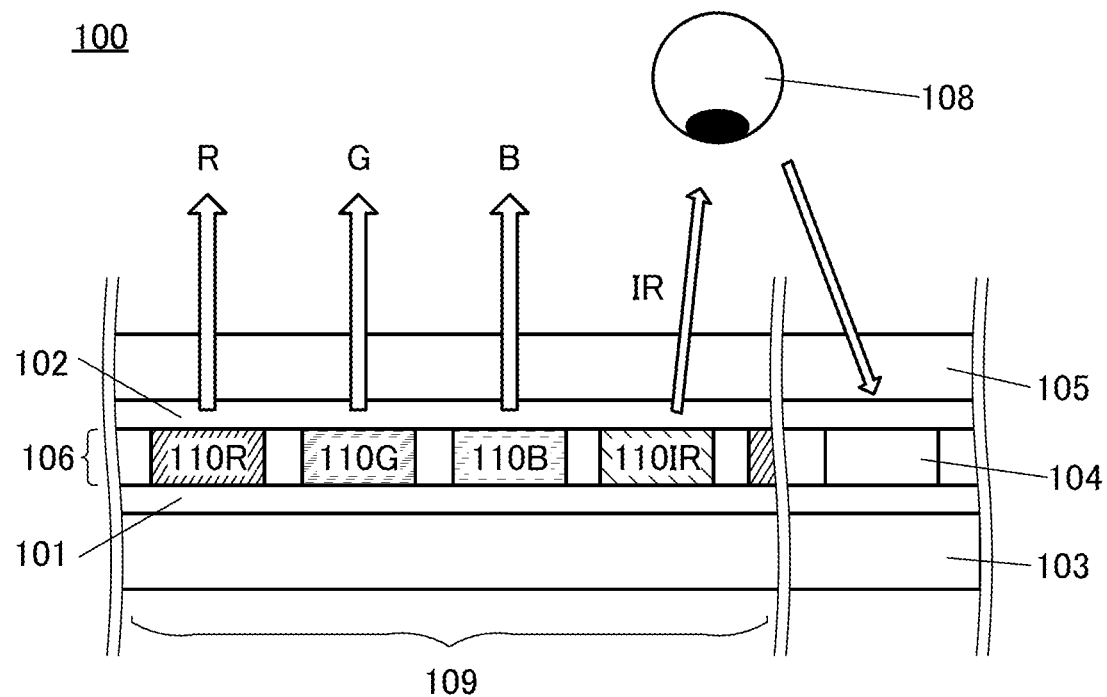

The display device 100 illustrated in FIG. 5B is different from the display device 100 illustrated in FIG. 2B in that the sensor portion 104 is provided outside the display region 109. The display device 100 illustrated in FIG. 6A is different from the display device 100 illustrated in FIG. 3A in that the sensor portion 104 is provided outside the display region 109 together with the light-emitting element 110IR. The display device 100 illustrated in FIG. 6B is different from the display device 100 illustrated in FIG. 3B in that the sensor portion 104 is provided outside the display region 109.

Furthermore, in each structure illustrated in FIG. 2B, FIG. 3B, FIG. 5B, and FIG. 6B, a pixel may be formed using four kinds of light-emitting elements of the light-emitting element 110R exhibiting red, the light-emitting element 110G exhibiting green, the light-emitting element 110B exhibiting blue, and the light-emitting element 110IR emitting infrared light. Note that the present invention is not limited thereto. For example, the light-emitting element 110R may emit light having a peak in both the red wavelength range and the infrared wavelength range and a pixel may be formed using three kinds of light-emitting elements of the light-emitting element 110R, the light-emitting element 110G, and the light-emitting element 110B.

Although a pixel is formed using three kinds of light-emitting elements of the light-emitting element 110R exhibiting red (R), the light-emitting element 110G exhibiting green (G), and the light-emitting element 110B exhibiting blue (B) in the structure described above, the present invention is not limited to this structure. For example, a pixel may be formed using a light-emitting element exhibiting yellow (Y), a light-emitting element exhibiting orange (O), and the like, or a pixel may be formed using a light-emitting element including a light-emitting substance that emits light containing two or more spectral components selected from R, G, and B.

Note that in the display device 100 illustrated in each of FIG. 3A, FIG. 3B, FIG. 6A, and FIG. 6B, the support plate 103 is not necessarily provided in some cases.

In the display device 100 illustrated in each of FIG. 2A, FIG. 2B, FIG. 5A, and FIG. 5B, the support plate 103 may be replaced with a substrate and the substrate 101 may be replaced with an insulating layer. In this case, the sensor portion 104 may be provided over the substrate, or the sensor portion 104 may be formed using the substrate. Furthermore, an insulating layer may be provided over the sensor portion 104, and the light-emitting element 110 may be provided over the insulating layer. The insulating layer preferably has a light-transmitting property with respect to at least infrared light.

Furthermore, in the display device 100 illustrated in each of FIG. 2A, FIG. 2B, FIG. 3A, FIG. 3B, FIG. 5A, FIG. 5B, FIG. 6A, and FIG. 6B, the protective member 105 is not necessarily provided in some cases.

Operation Example 1 of Electronic Device

Figure 7:
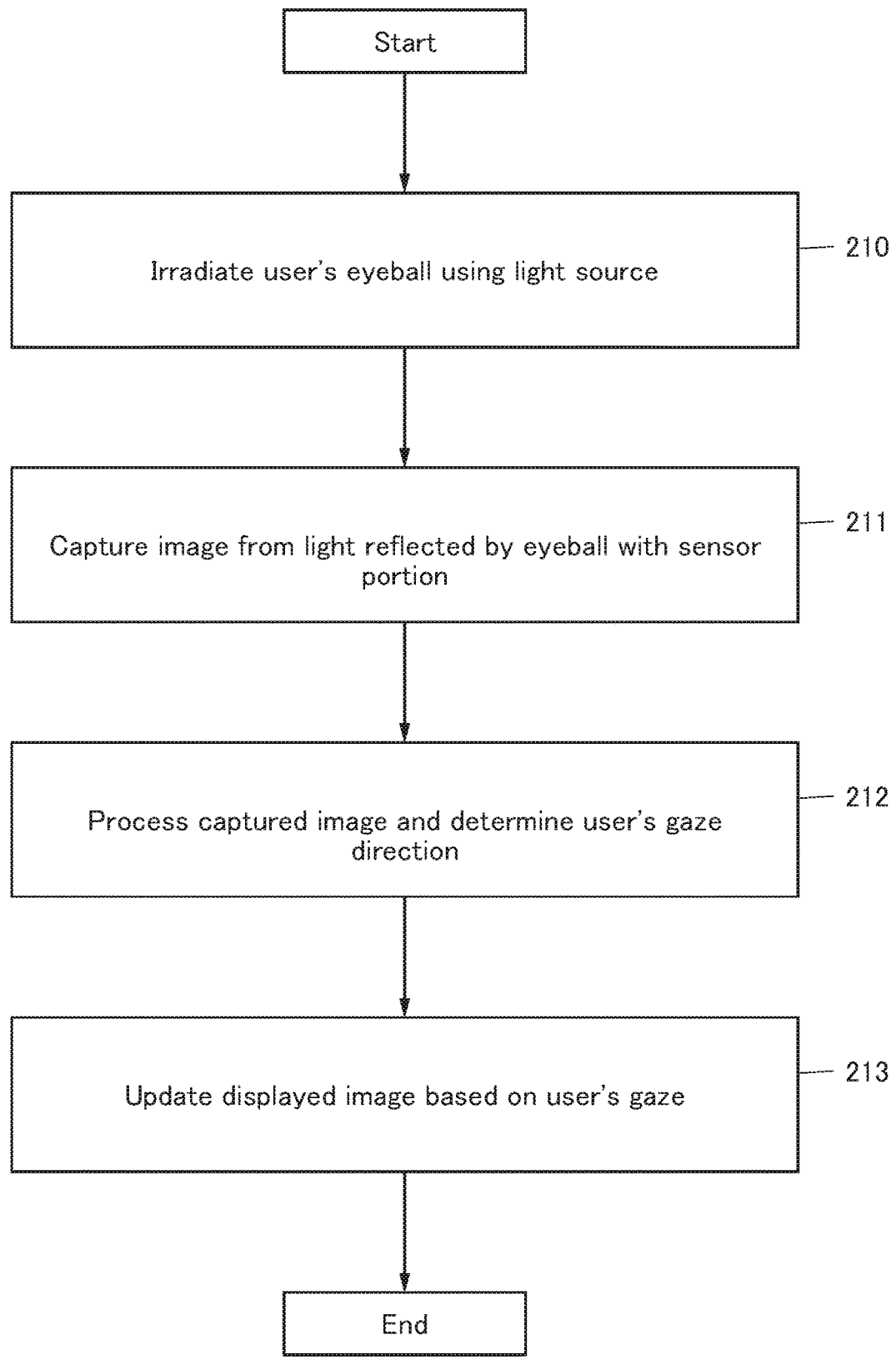
FIG. 7 is a flow chart showing an operation example of an electronic device.

An operation example of the electronic device of one embodiment of the present invention is described below with reference to a flowchart shown in FIG. 7. The flow chart shown in FIG. 7 includes Step 210 to Step 213. First, in Step 210, the eyeball 108 of the user is irradiated with infrared light emitted from the light-emitting element 110IR that serves as a light source. Then, in Step 211, the light-receiving element in the sensor portion 104 captures an image from the light reflected by the eyeball 108. In Step 212, the image captured by the light-receiving element is processed, and the use's gaze direction is determined. Then, in Step 213, the displayed image is updated in accordance with the user's gaze based on the user's gaze direction. The definition only in a portion where the user gazes is increased, whereby a load on the GPU can be reduced.

According to the present invention, the user's gaze can be tracked. Tracking the user's gaze allows determination of the user's attention, for example, in which case the user's action can be analyzed. Furthermore, an avatar can reproduce the motion of the eyes of the user. In addition, an operation or menu selection using gaze can be performed.

The above is the descriptions of the structure example and the operation example of the electronic device with an eye tracking function utilizing infrared light.

Next, a structure example and an operation example of an electronic device with an eye tracking function utilizing visible light are described. Hereinafter, differences from the electronic device with an eye tracking function utilizing infrared light are mainly described, and portions similar to those in the electronic device with an eye tracking function utilizing infrared light are not described in some cases.

Structure Example 2 of Electronic Device

A structure of the electronic device of another embodiment of the present invention is described with reference to a block diagram illustrated in FIG. 8. The electronic device with an eye tracking function utilizing visible light has the same structure as the electronic device (the electronic device 150 illustrated in FIG. 1A) with an eye tracking function utilizing infrared light. That is, the electronic device includes the display device 100 (100_R and 100_L), the optical system 151 (151_R and 151_L), the motion detection portion 153, the audio 154, the camera 155, the control portion 156, the communication portion 157, and the battery 158.

Note that the display device 100 included in the electronic device with an eye tracking function utilizing visible light is different from the display device 100 illustrated in FIG. 1B in including the light-emitting element 110LS instead of the light-emitting element 110IR. As illustrated in FIG. 8, the display device 100 included in the electronic device includes the light-emitting element 110R, the light-emitting element 110G, and the light-emitting element 110B that serve as display elements, the light-emitting element 110LS that serves as a light source, the sensor portion 104, the driver circuit portion 120, the image processing portion 121, and the frame memory 122.

Structures of a display device provided for the electronic device of another embodiment of the present invention will be described below with reference to FIG. 9A to FIG. 11B.

Structure Example 2 of Display Device

Figure 8:
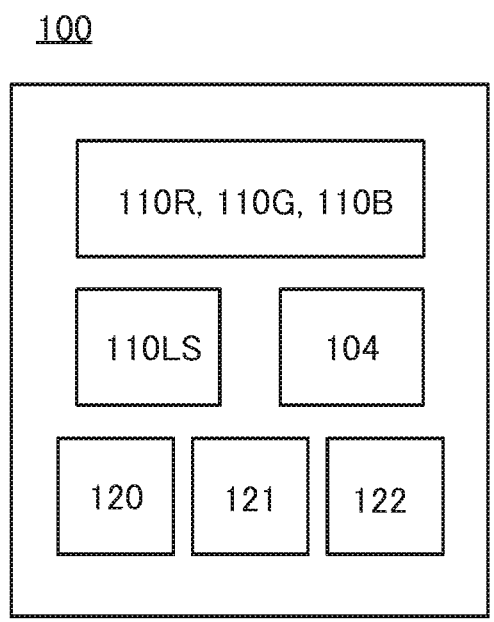
FIG. 8 is a diagram illustrating a structure example of an electronic device.
Figure 9A:
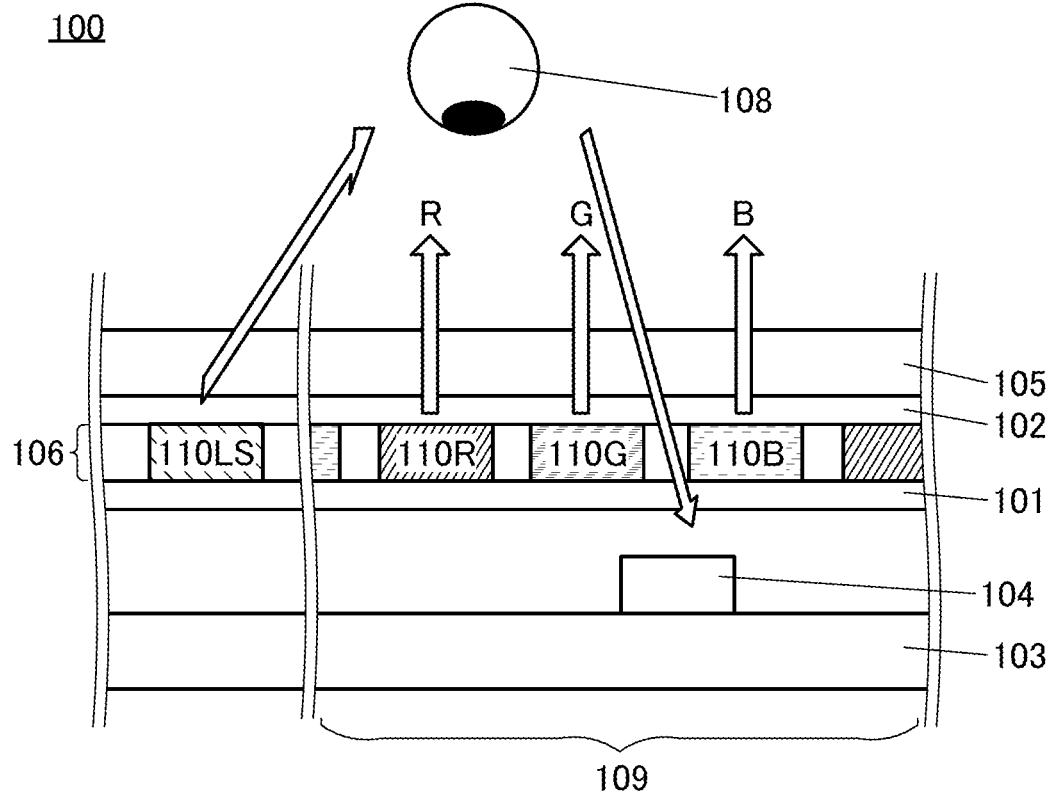
FIG. 9A and FIG. 9B are diagrams illustrating structure examples of a display device.

FIG. 9A, FIG. 9B, FIG. 11A, and FIG. 11B each illustrate a schematic view of the display device 100 illustrated in FIG. 8 that is included in the electronic device of another embodiment of the present invention. The display device 100 illustrated in FIG. 9A is different from the display device 100 illustrated in FIG. 2A in including the light-emitting element 110LS instead of the light-emitting element 110IR. Differences from the display device 100 illustrated in FIG. 2A will be mainly described below, and portions similar to those in the display device 100 illustrated in FIG. 2A are not described in some cases. The display device 100 illustrated in FIG. 9A has a structure in which the light-emitting element 110LS serving as a light source is provided outside the display region 109.

The light-emitting element 110LS functions as a light source. There is no particular limitation on the number of the light-emitting elements 110LS, and one or more light-emitting elements 110LS may be included. The light-emitting element 110LS is placed in a region interposed between the substrate 101 and the substrate 102.

Light emitted from the light-emitting element 110LS preferably includes visible light. For example, the light-emitting element 110LS is preferably an element emitting monochromatic light that has one peak in the visible light region of the emission spectrum, and the light-emitting element 110LS is further preferably an element emitting monochromatic light that has a peak in the red wavelength range of the emission spectrum. The light-emitting element 110LS is preferably a light-emitting element having the same structure as the light-emitting element 110R, the light-emitting element 110G, or the light-emitting element 110B. Accordingly, the light-emitting element 110LS can be formed without an increase in the number of manufacturing steps. Note that the light-emitting element 110LS may be an element emitting light that has two or more peaks in the visible light region of the emission spectrum, and the light-emitting element 110LS may be an element emitting light that has a peak in a region (e.g., the infrared light region or the ultraviolet light region) other than the visible light region.

The sensor portion 104 illustrated in FIG. 9A includes a light-receiving element having a function of detecting visible light. The light-receiving element preferably has light sensitivity with respect to visible light emitted from the light-emitting element 110LS.

As illustrated in FIG. 9A, an image is displayed using light emitted from the light-emitting element 110R, the light-emitting element 110G, and the light-emitting element 110B. In addition, the visible light emitted from the light-emitting element 110LS is reflected by the eyeball 108 of the user and the reflected light is detected by the light-receiving element in the sensor portion 104, so that eye tracking is performed. Therefore, the substrate 102 and the protective member 105 need to transmit the visible light emitted from the light-emitting element 110R, the light-emitting element 110G, the light-emitting element 110B, and the light-emitting element 110LS. Furthermore, the substrate 101, the substrate 102, and the protective member 105 need to transmit the visible light reflected by the eyeball 108. It is thus preferable that the substrate 101, the substrate 102, and the protective member 105 each have a light-transmitting property with respect to visible light.

As described above, in the display device 100 illustrated in FIG. 9A, the layer 106 where the light-emitting element 110 including the light-emitting element 110LS is positioned is over and overlaps with the sensor portion 104. In the layer 106 where the light-emitting element 110 is positioned, a common electrode is provided to be shared by the light-emitting elements 110 in some cases. Therefore, without a complicated optical system, the eyeball 108 can be irradiated with light and the light reflected by the eyeball 108 can be received. Furthermore, a distance between the light-emitting element 110LS and the light-receiving element in the sensor portion 104 is relatively small. This can increase the detection sensitivity with respect to the reflected light from the eyeball 108. Since the optical system structure can be simplified, the size of the display device can be reduced. Note that the light-emitting element 110LS may include a portion overlapping with the sensor portion 104 or may include no portion overlapping with the sensor portion 104.

Figure 9B:
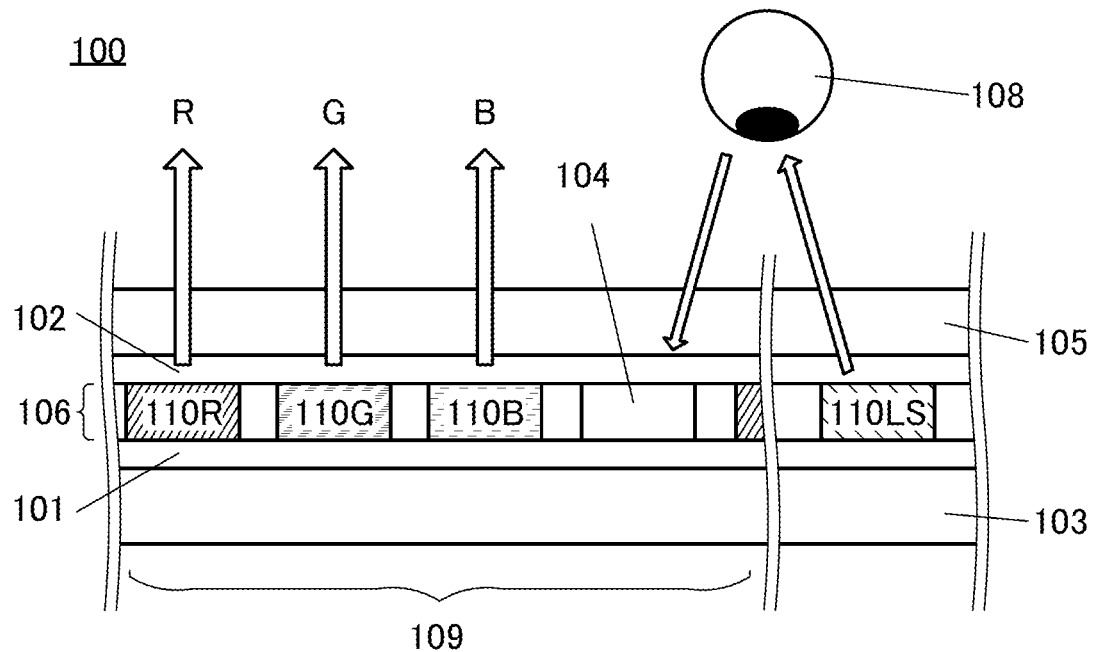

Note that another embodiment of the present invention is not limited thereto, and the sensor portion 104 may be provided between the substrate 101 and the substrate 102 together with the light-emitting element 110 as illustrated in FIG. 9B. In other words, the light-emitting element 110 and the sensor portion 104 may be placed parallel to the top surface of the substrate 101. The sensor portion 104 may be positioned in the layer 106 where the light-emitting element 110 is positioned. Specifically, the display device 100 illustrated in FIG. 9B is different from the display device 100 illustrated in FIG. 9A in that the sensor portion 104 and the light-emitting element 110 are provided between the substrate 101 and the substrate 102. In the display device 100 illustrated in FIG. 9B, since the sensor portion 104 is provided over the substrate 101, the substrate 101 may have a low light-transmitting property with respect to visible light or does not need to have a light-transmitting property with respect to visible light in some cases.

Figure 10:
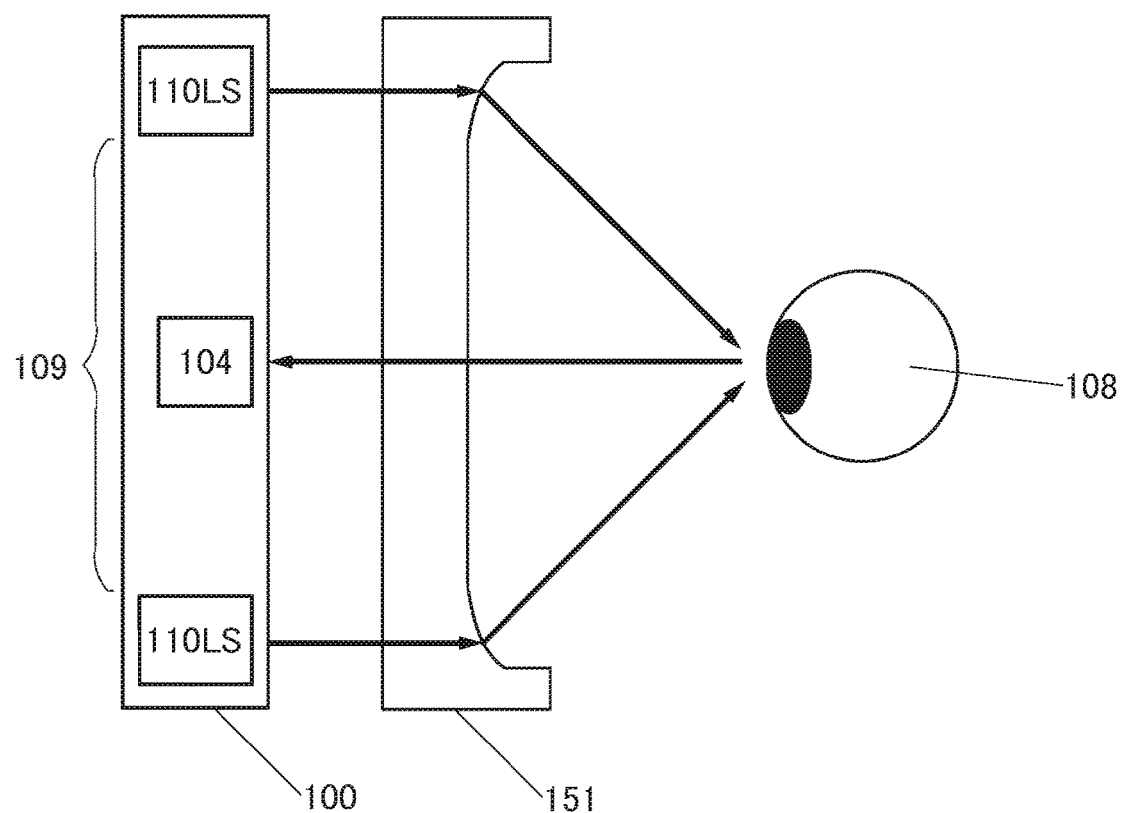
FIG. 10 is a diagram illustrating a structure example of an electronic device.

In the display device 100 illustrated in FIG. 9A and the display device 100 illustrated in FIG. 9B, the light-emitting element 110LS serving as a light source is provided outside the display region 109. In this case, as illustrated in FIG. 10, the optical system 151 is preferably designed such that the optical system 151 provided between the display device 100 and the eyeball 108 is used to irradiate the eyeball of the user with the visible light emitted from the light-emitting element 110LS. In the above structure, the visible light emitted from the light-emitting element 110LS is reflected by the eyeball 108 of the user and the reflected light is detected by the light-receiving element in the sensor portion 104, which enables eye tracking.

Figure 11A:
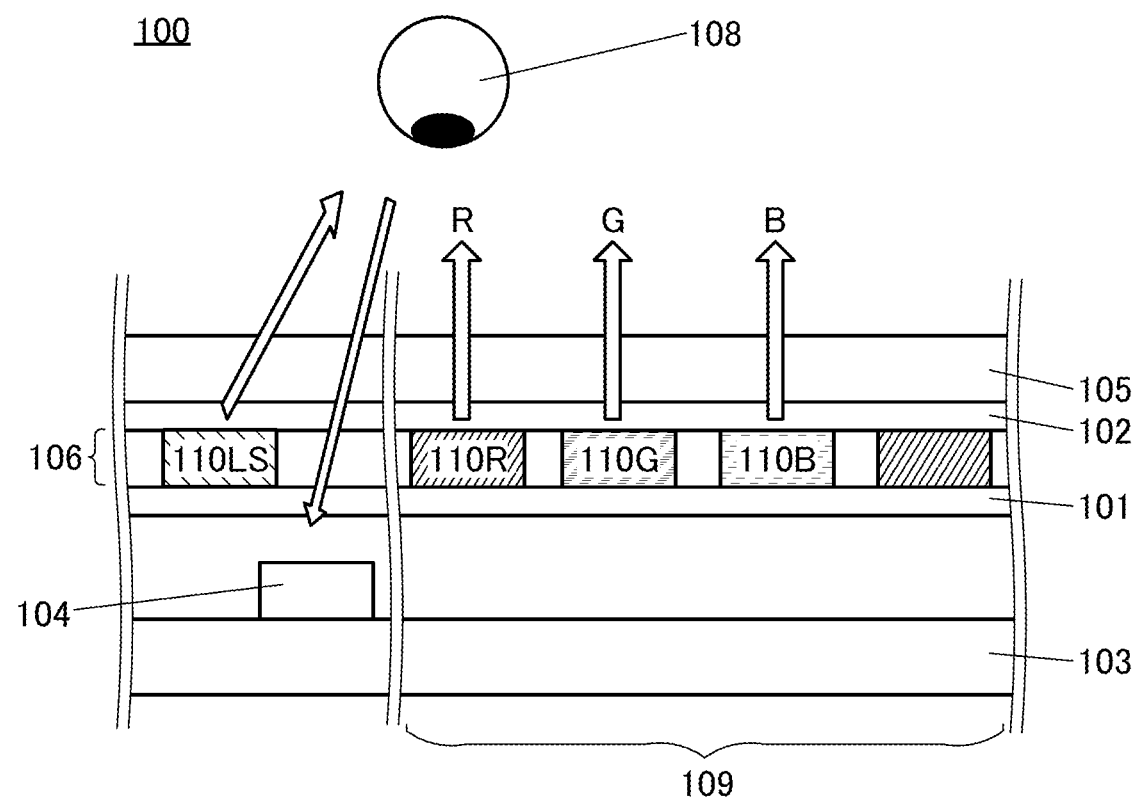
FIG. 11A and FIG. 11B are diagrams illustrating structure examples of a display device.

Although the structure in which the sensor portion 104 is provided in the display region 109 is described above, the present invention is not limited thereto, and the sensor portion 104 may be provided outside the display region 109. Specifically, the display device 100 illustrated in FIG. 11A is different from the display device 100 illustrated in FIG. 9A in that the sensor portion 104 is provided outside the display region 109 together with the light-emitting element 110LS. The display device 100 illustrated in FIG. 11B is different from the display device 100 illustrated in FIG. 9B in that the sensor portion 104 is provided outside the display region 109 together with the light-emitting element 110LS.

Although a pixel is formed using three kinds of light-emitting elements of the light-emitting element 110R exhibiting red (R), the light-emitting element 110G exhibiting green (G), and the light-emitting element 110B exhibiting blue (B) in the structure described above, the present invention is not limited to this structure. For example, a pixel may be formed using a light-emitting element exhibiting yellow (Y), a light-emitting element exhibiting orange (0), and the like, or a pixel may be formed using a light-emitting element including a light-emitting substance that emits light containing two or more spectral components selected from R, G, and B.

Figure 11B:
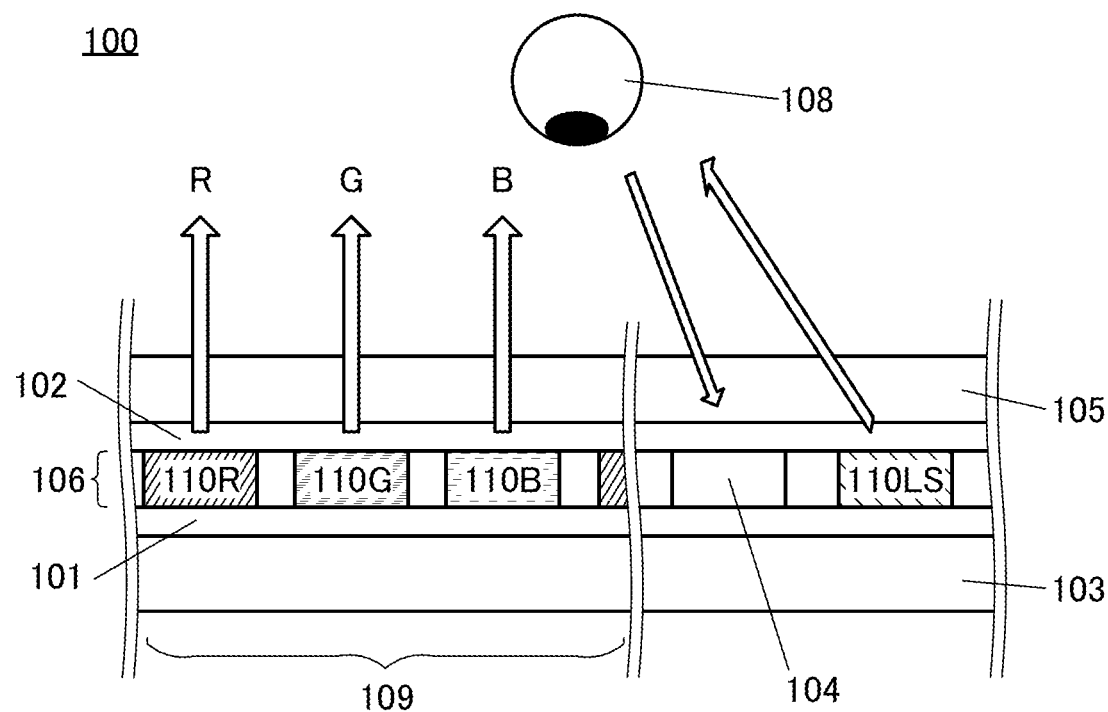

Note that in the display device 100 illustrated in each of FIG. 9B and FIG. 11B, the support plate 103 is not necessarily provided in some cases.

In the display device 100 illustrated in each of FIG. 9A and FIG. 11A, the support plate 103 may be replaced with a substrate and the substrate 101 may be replaced with an insulating layer. In this case, the sensor portion 104 may be provided over the substrate, or the sensor portion 104 may be formed using the substrate. Furthermore, an insulating layer may be provided over the sensor portion 104, and the light-emitting element 110 may be provided over the insulating layer. The insulating layer preferably has a light-transmitting property with respect to visible light.

Furthermore, in the display device 100 illustrated in each of FIG. 9A, FIG. 9B, FIG. 11A, and FIG. 11B, the protective member 105 is not necessarily provided in some cases.

Operation Example 2 of Electronic Device

An operation example of an electronic device of another embodiment of the present invention will be described. The operation of the electronic device with an eye tracking function utilizing visible light is similar to that of the electronic device with an eye tracking function utilizing infrared light except that the eyeball 108 of the user is irradiated with visible light emitted from the light-emitting element 110LS that serves as a light source in Step 210 shown in FIG. 7. Therefore, the description in [Operation example 1 of electronic device] can be referred to for the operation example of the electronic device with an eye tracking function utilizing visible light.

According to the present invention, the user's gaze can be tracked. Tracking the user's gaze allows determination of the user's attention, for example, in which case the user's action can be analyzed. Furthermore, an avatar can reproduce the motion of the eyes of the user. In addition, an operation or menu selection using gaze can be performed.

At least part of any of the structure examples, the drawings corresponding thereto, and the like described in this embodiment can be combined with the other structure examples, the other drawings, and the like as appropriate.

At least part of this embodiment can be implemented in combination with any of the other embodiments described in this specification, as appropriate.

Embodiment 2

In this embodiment, structure examples of the electronic device of one embodiment of the present invention and an electronic device using the display device of one embodiment of the present invention will be described.

Since the display device of one embodiment of the present invention has an eye tracking function and can have high resolution, the display device can be suitably used in an electronic device for VR or AR. Alternatively, the display device can be suitably used in an electronic device for substitutional reality (SR) or mixed reality (MR). Examples of the electronic device of one embodiment of the present invention and the electronic device using the display device of one embodiment of the present invention include information terminals (wearable devices) that can be worn on the head such as a head-mounted display, a glasses-type terminal, and a goggle-type terminal. In this specification and the like, an electronic device may be rephrased as a head-mounted display, a glasses-type terminal, a goggle-type terminal, or the like.

Figure 12A:
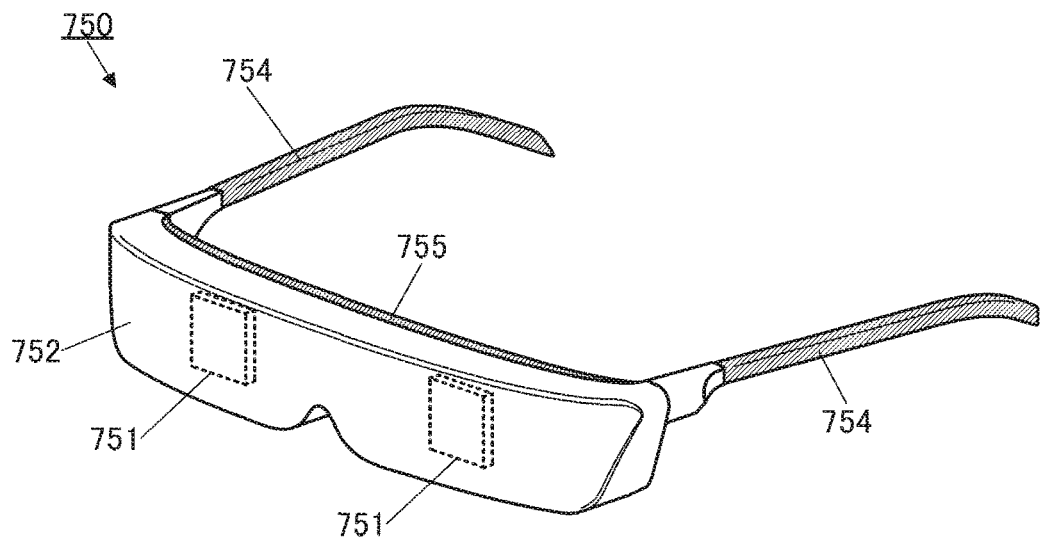
FIG. 12A to FIG. 12C are diagrams illustrating structure examples of an electronic device.
Figure 12B:
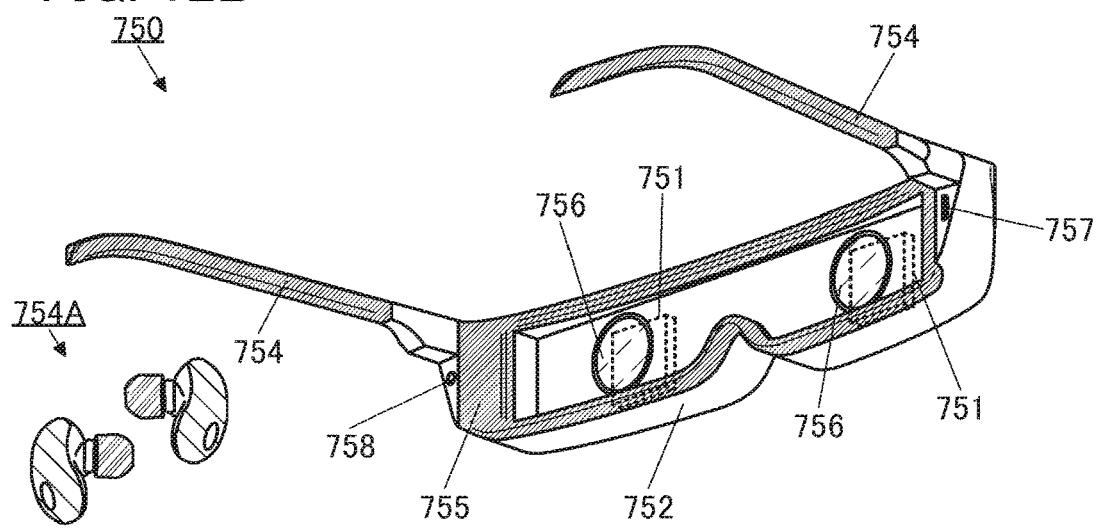
Figure 12C:
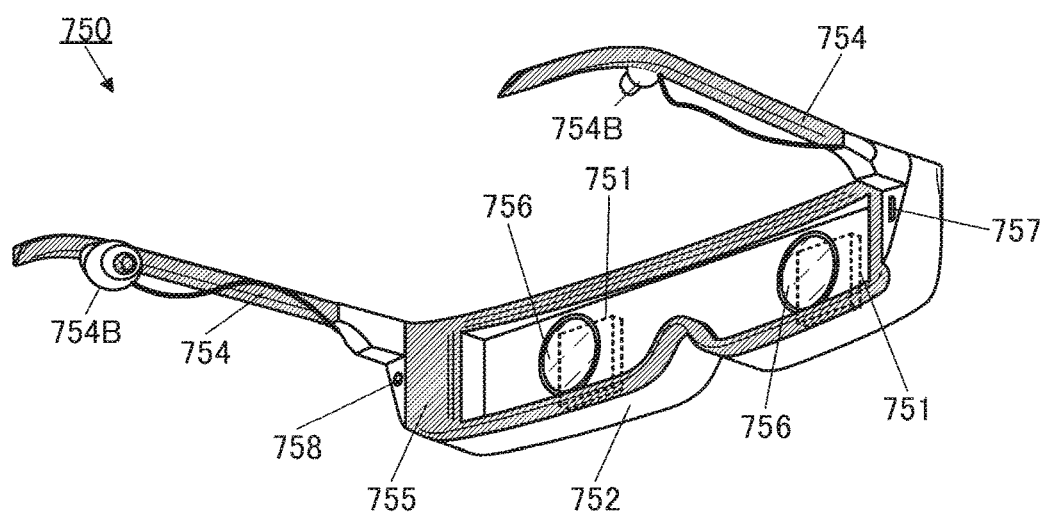

FIG. 12A to FIG. 12C are perspective views of an electronic device 750. FIG. 12A is a perspective view illustrating the front surface, the top surface, and the left side surface of the electronic device 750, and FIG. 12B and FIG. 12C are perspective views each illustrating the back surface, the bottom surface, and the right side surface of the electronic device 750.

The electronic device 750 includes a pair of display devices 751, a housing 752, a pair of temples 754, a cushion 755, a pair of lenses 756, and the like. The pair of display devices 751 is positioned to be seen through the lenses 756 inside the housing 752.

Here, the pair of display devices 751 correspond to the display device 100 illustrated in FIG. 1A. Furthermore, the pair of lenses 756 correspond to the optical system 151 illustrated in FIG. 1A. Although not illustrated, in the housing 752 of the electronic device 750 illustrated in FIG. 12A to FIG. 12C, the motion detection portion 153, the audio 154, the camera 155, the control portion 156, the communication portion 157, and the battery 158 that are described in Embodiment 1 are included.

The electronic device 750 is an electronic device for VR. A user wearing the electronic device 750 can see an image displayed on the display device 751 through the lens 756.

Furthermore, when the pair of display devices 751 display different images, three-dimensional display using parallax can be performed.

An input terminal 757 and an output terminal 758 are provided on the back side of the housing 752. To the input terminal 757, a cable for supplying a video signal from a video output device or the like, power for charging a battery provided in the housing 752, or the like can be connected. The output terminal 758 can function as, for example, an audio output terminal to which earphones, headphones, or the like can be connected.

The housing 752 preferably includes a mechanism by which the left and right positions of the lens 756 and the display device 751 can be adjusted to the optimal positions in accordance with the position of the user's eye. In addition, the housing 752 preferably includes a mechanism for adjusting focus by changing the distance between the lens 756 and the display device 751.

The display device of one embodiment of the present invention can be used for the display device 751. Thus, the electronic device 750 can perform display with extremely high resolution. This enables a user to feel high sense of immersion.

The cushion 755 is a portion in contact with the user's face (forehead, cheek, or the like). The cushion 755 is in close contact with the user's face, so that light leakage can be prevented, which increases the sense of immersion. A soft material is preferably used for the cushion 755 so that the cushion 755 is in close contact with the face of the user wearing the electronic device 750. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 755, whereby light leakage can be suitably prevented. Furthermore, using such a material is preferable because it has a soft texture and the user does not feel cold when wearing the device in a cold season, for example. The member in contact with user's skin, such as the cushion 755 or the temple 754, is preferably detachable because cleaning or replacement can be easily performed.

The electronic device in this embodiment may further include earphones 754A. The earphones 754A include a communication portion (not illustrated) and have a wireless communication function. The earphones 754A can output audio data with the wireless communication function. The earphones 754A may include a vibration mechanism to function as bone-conduction earphones.

The earphones 754A can be connected to the temple 754 directly or by wire like earphones 754B illustrated in FIG. 12C. The earphones 754B and the temple 754 may each have a magnet. This is preferable because the earphone 754B can be fixed to the temple 754 with magnetic force and thus can be easily housed.

Figure 13A:
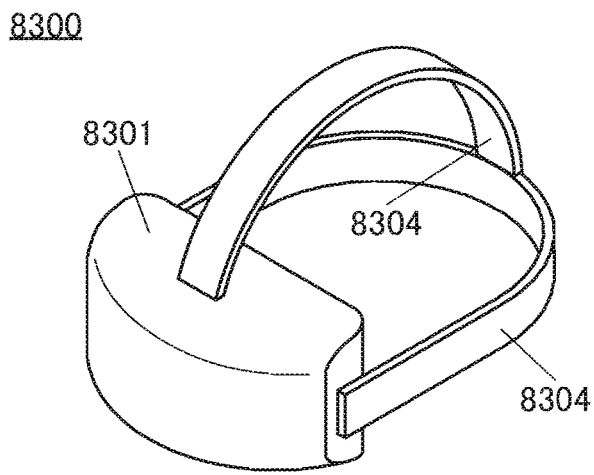
FIG. 13A to FIG. 13E are diagrams illustrating examples of electronic devices.
Figure 13B:
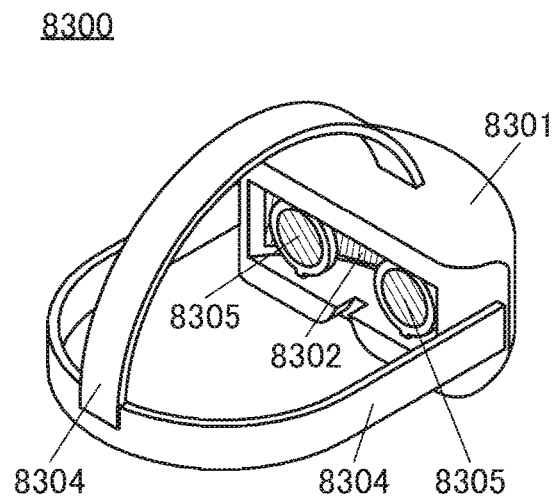
Figure 13C:
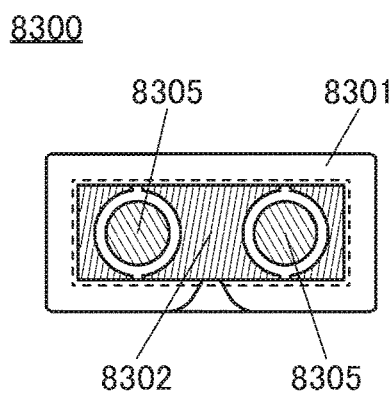

FIG. 13A to FIG. 13C are diagrams illustrating the appearance of the electronic device 8300. The electronic device 8300 includes a housing 8301, a display portion 8302, a band-shaped fixing unit 8304, and a pair of lenses 8305.

A user can see display on the display portion 8302 through the lenses 8305. The display portion 8302 is preferably curved so that the user can feel high realistic sensation. Another image displayed on another region of the display portion 8302 is viewed through the lenses 8305, so that three-dimensional display using parallax or the like can be performed. Note that the structure is not limited to the structure in which one display portion 8302 is provided; two display portions 8302 may be provided and one display portion may be provided per eye of the user.

The display device of one embodiment of the present invention can be used for the display portion 8302. The display device of one embodiment of the present invention achieves an extremely high resolution. For example, a pixel is not easily perceived by the user even when the user perceives display that is magnified by the use of the lenses 8305 as illustrated in FIG. 13C. In other words, a video with a strong sense of reality can be seen by the user with use of the display portion 8302.

Figure 13D:
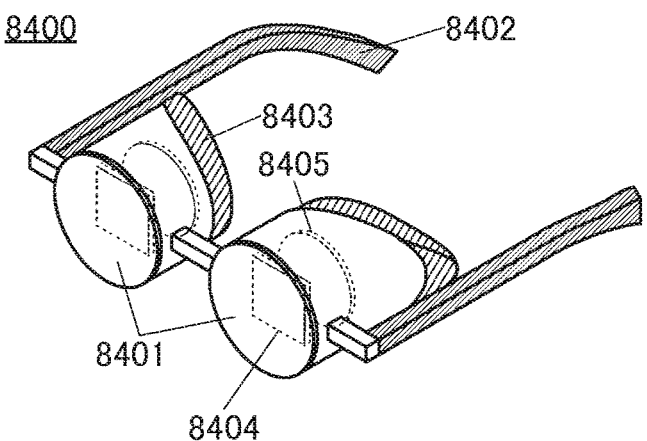

FIG. 13D is a diagram illustrating the appearance of an electronic device 8400. The electronic device 8400 includes a pair of housings 8401, a temple 8402, and a cushion 8403. A display portion 8404 and a lens 8405 are provided in each of the pair of housings 8401. Furthermore, when the pair of display portions 8404 display different images, three-dimensional display using parallax can be performed.

A user can see display on the display portion 8404 through the lens 8405. The lens 8405 has a focus adjustment mechanism, and the focus adjustment mechanism can adjust the position of the lens 8405 according to the user's eyesight. The display portion 8404 is preferably a square or a horizontal rectangle. This can improve a realistic sensation.

The display device of one embodiment of the present invention can be used in the display portion 8404.

The temple 8402 preferably has flexibility and elasticity so as to be adjusted to fit the size of the user's face and not to slide down. In addition, part of the temple 8402 preferably has a vibration mechanism functioning as a bone conduction earphone. Thus, audio devices such as an earphone and a speaker are not necessarily provided separately, and the user can enjoy videos and sounds only by wearing the electronic device. Note that the housing 8401 may have a function of outputting sound data by wireless communication.

The description of the cushion 755 can be referred to for the temple 8402 and the cushion 8403.

Figure 13E:
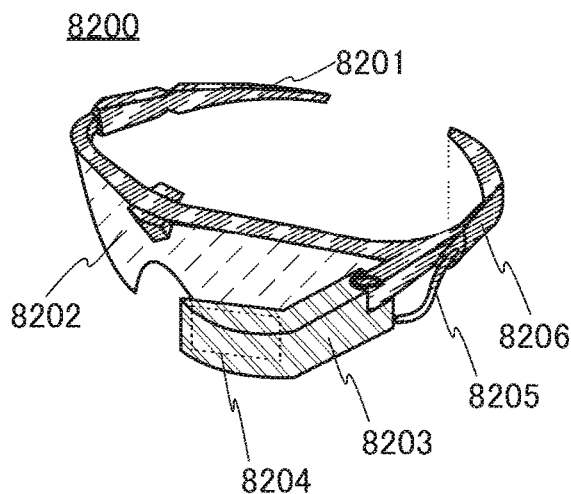

FIG. 13E is a diagram illustrating the appearance of an electronic device 8200.

The electronic device 8200 includes a temple 8201, a lens 8202, a main body 8203, a display portion 8204, a cable 8205, and the like. A battery 8206 is incorporated in the temple 8201.

The cable 8205 supplies electric power from the battery 8206 to the main body 8203. The main body 8203 includes a wireless receiver or the like to receive video information and display it on the display portion 8204. The main body 8203 includes a camera, and information on the movement of the eyeballs or the eyelids of the user can be used as an input means.

The temple 8201 may include a plurality of electrodes capable of sensing a current flowing accompanying with the movement of the user's eyeball at a position in contact with the user to recognize the user's gaze. The temple 8201 may also have a function of monitoring the user's pulse with use of a current flowing through the electrodes. The temple 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, and the like.

The display device of one embodiment of the present invention can be used in the display portion 8204.

Figure 14A:
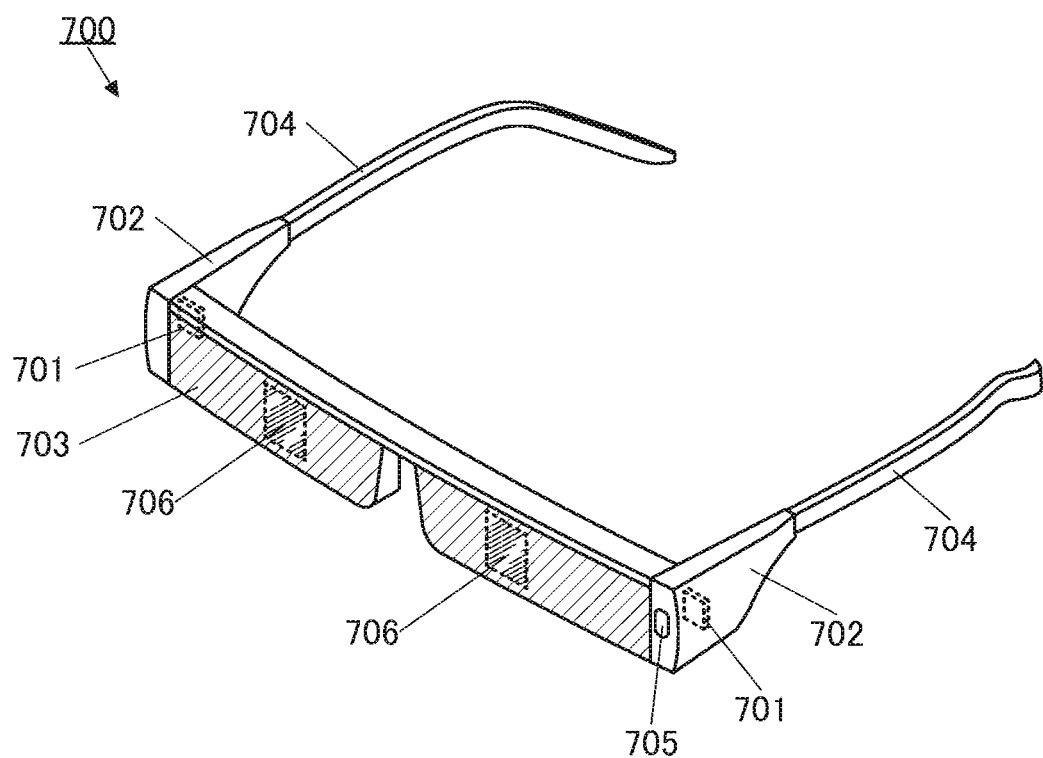
FIG. 14A and FIG. 14B are diagrams illustrating a structure example of an electronic device.

FIG. 14A is a perspective view of an electronic device 700. The electronic device 700 includes a pair of display devices 701, a pair of housings 702, a pair of optical members 703, a pair of temples 704, and the like.

The electronic device 700 can project an image displayed on the display device 701 onto a display region 706 of the optical member 703. Since the optical members 703 have a light-transmitting property, a user can see images displayed on the display regions 706, which are superimposed on transmission images seen through the optical members 703. Thus, the electronic device 700 is an electronic device capable of AR display.

One housing 702 is provided with a camera 705 capable of taking an image of what lies in front thereof. Although not illustrated, one of the housings 702 is provided with a wireless receiver or a connector to which a cable can be connected, whereby a video signal or the like can be supplied to the housing 702. Furthermore, when the housing 702 is provided with an acceleration sensor such as a gyroscope sensor, the orientation of the user's head can be detected and an image corresponding to the orientation can be displayed on the display region 706. Moreover, the housing 702 is preferably provided with a battery, and charging can be performed with or without a wire.

Figure 14B:
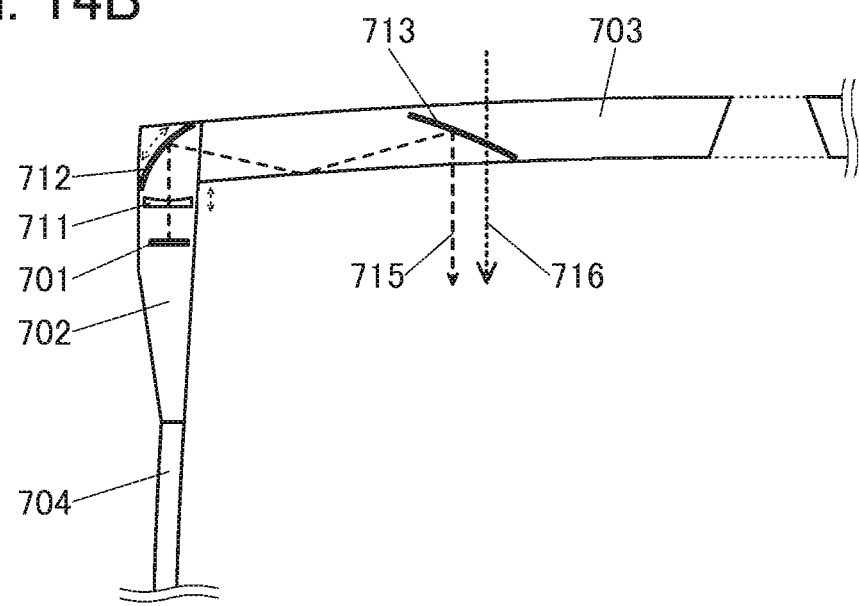

Next, a method for projecting an image on the display region 706 of the electronic device 700 is described using FIG. 14B. The display device 701, a lens 711, and a reflective plate 712 are provided in the housing 702. In addition, a reflective surface 713 functioning as a half mirror is provided in a portion corresponding to the display region 706 of the optical member 703.

Light 715 emitted from the display device 701 passes through the lens 711 and is reflected by the reflective plate 712 toward the optical member 703. In the optical member 703, the light 715 is fully reflected repeatedly by end surfaces of the optical member 703 and reaches the reflective surface 713, whereby an image is projected on the reflective surface 713. Accordingly, the user can see both the light 715 reflected by the reflective surface 713 and transmitted light 716 that passes through the optical member 703 (including the reflective surface 713).

FIG. 14B illustrates an example in which the reflective plate 712 and the reflective surface 713 each have a curved surface. This structure can increase optical design flexibility and reduce the thickness of the optical member 703, compared to the case where the reflective plate 712 and the reflective surface 713 are flat. Note that the reflective plate 712 and the reflective surface 713 may be flat.

The reflective plate 712 can use a component having a mirror surface and preferably has high reflectance. As the reflective surface 713, a half mirror utilizing reflection of a metal film may be used, but the use of a total-reflection prism or the like can increase the transmittance of the transmitted light 716.

Here, the housing 702 preferably includes a mechanism for adjusting the distance or angle between the lens 711 and the display device 701. This enables focus adjustment and zooming in/out of images, for example. One or both of the lens 711 and the display device 701 are configured to be movable in the optical-axis direction, for example.

The housing 702 preferably includes a mechanism capable of adjusting the angle of the reflective plate 712. The position of the display region 706 where images are displayed can be changed by changing the angle of the reflective plate 712. Thus, the display region 706 can be placed at the optimum position in accordance with the position of the user's eye.

The display device of one embodiment of the present invention can be used for the display device 701. Thus, the electronic device 700 can perform display with extremely high resolution.

Note that the display device of one embodiment of the present invention may be used for a display portion of an electronic device having a display function or the like, besides the above-described electronic devices. Examples of such an electronic device include a digital camera, a digital video camera, a digital photo frame, a mobile phone, a portable game machine, a portable information terminal such as a smartphone or a tablet, and an audio reproducing device, in addition to electronic devices with a relatively large screen, such as a television device, a laptop personal computer, a monitor device, digital signage, a pachinko machine, and a game machine.

Specifically, an electronic device such as a portable game machine or a smartphone can be sometimes used as, for example, a device for VR when a housing to which the electronic device is attached is worn on the head with the use of a band-like fixing portion, a temple, or the like. Therefore, a display portion of the electronic device may include the display device of one embodiment of the present invention.

Furthermore, the display device of one embodiment of the present invention can have a high resolution, and thus may be used for an electronic device having a relatively small display portion. Examples of such electronic devices include watch-type and bracelet-type information terminals (wearable devices).

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680×4320). In particular, definition of 4K2K, 8K4K, or higher is preferable. Furthermore, the pixel density (resolution) of the display device of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With such a display device with high definition and high resolution, the electronic device can have higher realistic sensation, sense of depth, and the like in personal use such as portable use and home use.

The electronic device in this embodiment may include an antenna. With the antenna receiving a signal, a video, information, and the like can be displayed on a display portion. When the electronic device includes an antenna and a secondary battery, the antenna may be used for contactless power transmission.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, an electric field, a current, a voltage, electric power, radiation, flow rate, humidity, gradient, oscillation, a smell, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

At least part of any of the structure examples, the drawings corresponding thereto, and the like described in this embodiment can be combined with the other structure examples, the other drawings, and the like as appropriate.

At least part of this embodiment can be implemented in combination with any of the other embodiments described in this specification, as appropriate.

Embodiment 3

An arithmetic circuit of one embodiment of the present invention is described. The arithmetic circuit can be used as an arithmetic circuit having a function of performing a product-sum operation, for example. Note that an arithmetic circuit having a function of performing a product-sum operation can be rephrased as an arithmetic circuit of a neural network.

Structure Example 1 of Arithmetic Circuit

First, structure examples of an arithmetic circuit of one embodiment of the present invention are described. The arithmetic circuit can be used for the image processing portion 121 described in the above embodiment.

Figure 15:
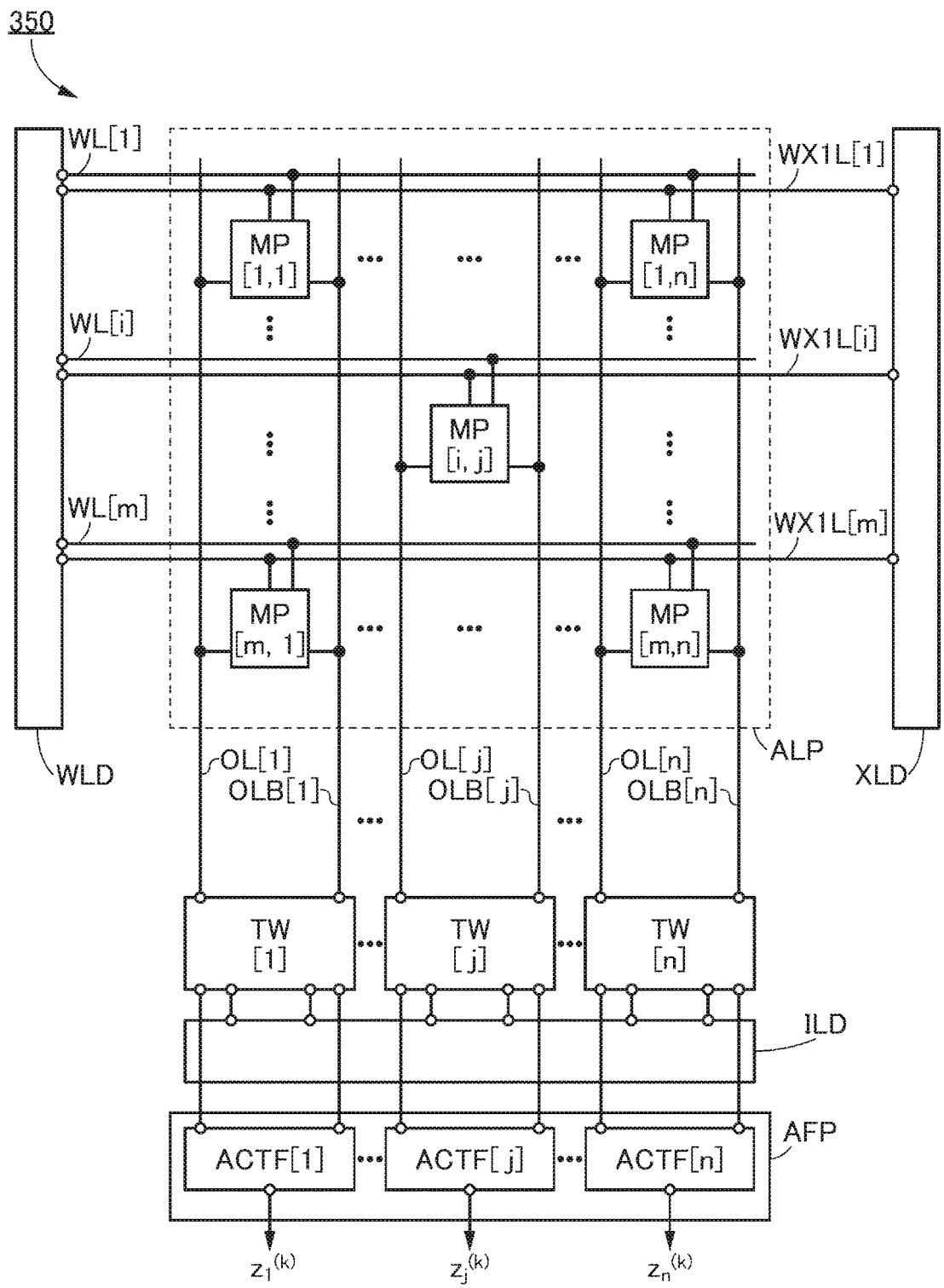
FIG. 15 is a diagram showing a structure example of an arithmetic circuit of a neural network.

An arithmetic circuit 350 in FIG. 15 includes an array portion ALP, a circuit ILD, a circuit WLD, a circuit XLD, a circuit AFP, and a circuit TW[1] to a circuit TW[n] (n is an integer greater than or equal to 1), for example.

The circuit ILD and the circuit AFP are electrically connected to a wiring OL[1] to a wiring OL[n] and a wiring OLB[1] to a wiring OLB[n] through the circuit TW[1] to the circuit TW [n].

The circuit TW[1] to the circuit TW[n] function as switching circuits. In the circuit TW[1] to the circuit TW[n], switching between inputting output signals of the wiring OL[1] to the wiring OL[n] and the wiring OLB [1] to the wiring OLB[n] to the circuit AFP and inputting output signals of the circuit ILD to the wiring OL[1] to the wiring OL[n] and the wiring OLB [1] to the wiring OLB[n] can be performed.

The circuit WLD is electrically connected to a wiring WL[1] to a wiring WL[m] (m is an integer greater than or equal to 1) and a wiring WX1L[1] to a wiring WX1L[m]. The circuit XLD is electrically connected to the wiring WX1L[1] to the wiring WX1L[m].

The arithmetic circuit 350 in FIG. 15 includes the array portion ALP in which circuits MP are arranged in a matrix of m×n. In FIG. 15, a circuit MP[i, j] represents the circuit MP in the i-th row and the j-th column (here, i is an integer greater than or equal to 1 and less than or equal to m, and j is an integer greater than or equal to 1 and less than or equal to n). Note that FIG. 15 illustrates only a circuit MP[1, 1], a circuit MP[1, n], the circuit MP[1, j], a circuit MP[m, 1], and a circuit MP[m, n] and does not illustrate the other circuits MP.

The circuit MP[i, j] is electrically connected to the wiring WL[i], the wiring WX1L[i], the wiring OL[j], and the wiring OLB[j].

The circuit MP[i, j] has a function of retaining a weight coefficient (also referred to as first data), for example. The weight coefficient is also referred to as a weighted value. Specifically, the circuit MP[i, j] retains information corresponding to a weight coefficient input from the wiring OL[j] and the wiring OLB[j].

The circuit ILD has a function of outputting information corresponding to the first data, which is a weight coefficient, to the wiring OL[1] to the wiring OL[n] and the wiring OLB[1] to the wiring OLB[n].

As the information corresponding to a weight coefficient, for example, a potential, a resistance value, or a current value can be used. In the case where a current value is used as information corresponding to a weight coefficient, a current to be input can be generated using a current output digital-to-analog converter (IDAC).

The circuit MP[i, j] has a function of outputting the product of an input value input from the wiring WX1L[i] (also referred to as second data) and a weight coefficient (first data). For a specific example, the circuit MP[i, j] outputs a current corresponding to the product of the first data and the second data to the wiring OL[j] and the wiring OLB[j] when the second data is input to the circuit MP[i, j] from the wiring WX1L[i]. Note that although FIG. 15 shows the example in which the wiring OL[j] and the wiring OLB[j] are provided, one embodiment of the present invention is not limited thereto. Only one of the wiring OL[j] and the wiring OLB[j] may be provided.

The circuit XLD has a function of supplying the second data, which is an input value, to the wiring WX1L[1] to the wiring WX1L[m].

Information corresponding to the input value can be, for example, a potential, a current value, or the like. In the case where a current value is used as information corresponding to an input value, a current to be input can be generated using a current output digital-to-analog converter.

Currents corresponding to the products of the first data and the second data output from the circuit MP[1, j] to a circuit MP[m, j] are added and the sum of the currents is output to the wiring OL[j] and the wiring OLB[j]. In this manner, the arithmetic circuit can perform a product-sum operation with the weight coefficients and the input values.

The circuit XLD and the circuit WLD each have a function of selecting the circuit MP to which information corresponding to the first data input from the circuit ILD is to be written. In the case where information is written to a circuit MP[i, 1] to a circuit MP[i, n] positioned in the i-th row of the array portion ALP, the circuit XLD supplies, to the wiring WX1L[i], a signal for turning on or off first writing switching elements included in the circuit MP[i, 1] to the circuit MP[i, n], and supplies, to the other wirings WX1L, a potential for turning off first writing switching elements included in the circuits MP in rows other than the i-th row, for example. In addition, the circuit WLD supplies, to the wiring WL[i], a signal for turning on or off second writing switching elements included in the circuit MP[i, 1]

to the circuit MP [, n], and supplies, to the other wirings WL, a potential for turning off second writing switching elements included in the circuits MP in rows other than the i-th row, for example.

The circuit AFP includes a circuit ACTF[1] to a circuit ACTF[n]. The circuit ACTF[j] is electrically connected to the wiring OL[j] and the wiring OLB[j] through the circuit TW[j] having a switching function. The circuit ACTF[j] can generate a signal that corresponds to information (e.g., a potential or a current value) corresponding to the results of product-sum operations input from the wiring OL[j] and the wiring OLB[j], and can output the signal as $z_j^{(k)}$. The circuit AFP can compare information (e.g., a potential or a current value) corresponding to the results of product-sum operations that are input from the wiring OL[1] to the wiring OL[n] and the wiring OLB[1] to the wiring OLB[n], generate signals corresponding to the comparison results, and output the signals as $z_1^{(k)}$ to $z_n^{(k)}$.

<Circuit MP>

Figure 16:
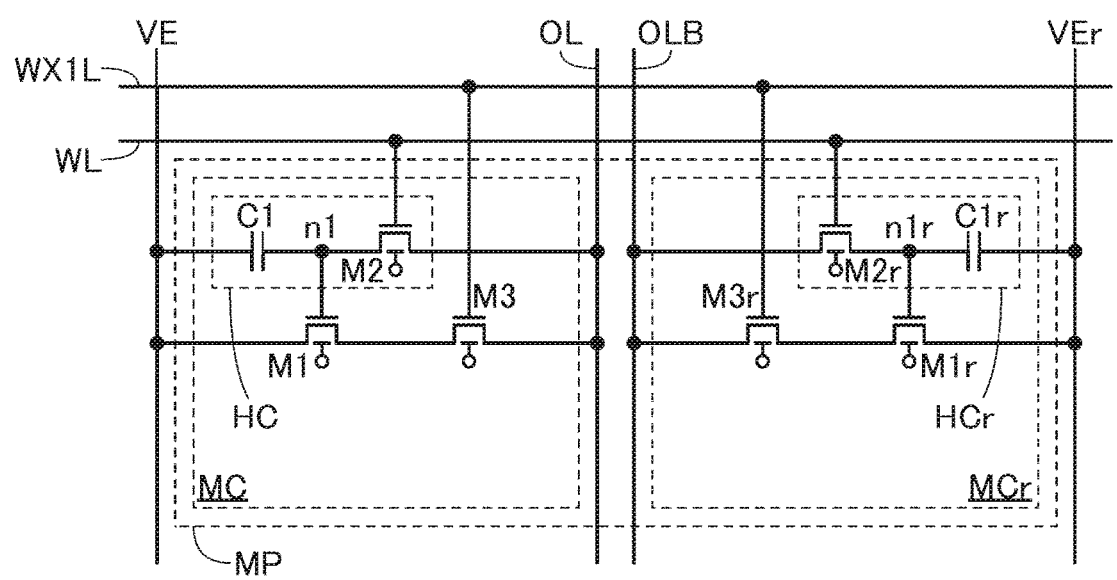
FIG. 16 is a diagram showing a structure example of an arithmetic circuit of a neural network.

Next, the circuit MP is described. FIG. 16 illustrates a circuit structure example that can be used for the circuit MP[i, j]. The circuit MP includes a circuit MC and a circuit MCr. The circuit MC includes a transistor M1 to a transistor M3, and a capacitor C1. For example, a retaining portion HC includes the transistor M2 and the capacitor C1.

In the circuit MP in FIG. 16, the circuit MCr has substantially the same circuit structure as the circuit MC. Thus, "r" is added to the reference numerals of the circuit elements and the like included in the circuit MCr to differentiate them from the circuit elements and the like included in the circuit MC.

The transistor M1 to the transistor M3 illustrated in FIG. 16 are each an n-channel transistor having a multi-gate structure including gates over and under a channel, and the transistor M1 to the transistor M3 each include a first gate and a second gate.

The arithmetic circuit 350 described in this embodiment does not depend on the connection structure of the back gate of a transistor. In FIG. 16, the back gates of the transistor M1 to the transistor M3 are illustrated. The connection structures of the back gates are not illustrated, and the destinations to which the back gates are electrically connected can be determined at the design stage. For example, in a transistor including a back gate, a gate and the back gate may be electrically connected to each other to increase the on-state current of the transistor. In other words, the gate and the back gate of the transistor M2 may be electrically connected to each other, for example. Alternatively, for example, in a transistor including a back gate, a wiring electrically connected to an external circuit or the like may be provided and a potential may be supplied to the back gate of the transistor with the external circuit or the like to change the threshold voltage of the transistor or to reduce the off-state current of the transistor. Note that the same applies to a transistor described in other parts of the specification and a transistor illustrated in other drawings, not only to that in FIG. 16.

The semiconductor device of one embodiment of the present invention does not depend on the structure of a transistor included in the semiconductor device. A transistor may have a single gate structure. It is also possible that some transistors include back gates and the other transistors do not include back gates. Note that the same applies to a transistor described in other parts of the specification and a transistor illustrated in other drawings, not only to that in the circuit diagram shown in FIG. 16.

In this specification and the like, transistors with a variety of structures can be used as a transistor. There is no limitation on the type of transistors. For example, a transistor including single crystal silicon or a non-single-crystal semiconductor film typified by amorphous silicon, polycrystalline silicon, microcrystalline (also referred to as microcrystal, nanocrystal, or semi-amorphous) silicon, or the like can be used as a transistor. Alternatively, a thin film transistor (TFT) whose semiconductor film is thinned or the like can be used. There are various advantages of using TFTs. For example, since the TFT can be formed at a temperature lower than that of the case of using single crystal silicon, manufacturing cost can be reduced or a manufacturing apparatus can be made larger.

As a transistor, for example, a transistor including a compound semiconductor (e.g., SiGe or GaAs) or an oxide semiconductor can be used. Note that a transistor including an oxide semiconductor in a channel formation region is sometimes referred to as an OS transistor. Alternatively, a thin film transistor obtained by thinning any of the compound semiconductors or the oxide semiconductors can be used. Such a compound semiconductor or an oxide semiconductor can be used for not only a channel portion of the transistor but also other applications. For example, such a compound semiconductor or an oxide semiconductor can be used for a wiring, a resistor, a pixel electrode, a light-transmitting electrode, or the like. Since such components can be deposited or formed at the same time as the transistor, the cost can be reduced.

Examples of the oxide semiconductor include an oxide containing at least one of indium, an element M (as the element M, for example, one kind or a plurality of kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like can be given), and zinc.

Note that for example, a transistor or the like formed by an inkjet method or a printing method can be used as a transistor. Accordingly, such a transistor can be formed at room temperature or at a low vacuum, or can be formed using a large substrate. Therefore, the transistor can be formed without use of a mask (reticle), so that the layout of the transistor can be easily changed. Alternatively, since the transistor can be formed without using a resist, the material cost is reduced, and the number of steps can be reduced. Furthermore, since a film can be formed where needed, a material is not wasted compared to a manufacturing method by which etching is performed after the film is formed over the entire surface; thus, the cost can be reduced.

Note that a transistor including an organic semiconductor or a carbon nanotube can be used as the transistor, for example. Thus, a transistor can be formed over a bendable substrate. A device including a transistor which includes an organic semiconductor or a carbon nanotube can be shock-resistant.

In the circuit MP in FIG. 16, a first terminal of the transistor M1 is electrically connected to a wiring VE. A second terminal of the transistor M1 is electrically connected to a first terminal of the transistor M3. A gate of the transistor M1 is electrically connected to a first terminal of the capacitor C1 and a first terminal of the transistor M2. A second terminal of the capacitor C1 is electrically connected to the wiring VE. A second terminal of the transistor M2 is electrically connected to the wiring OL. A gate of the transistor M2 is electrically connected to the wiring WL. A second terminal of the transistor M3 is electrically connected to the wiring OL and a gate of the transistor M3 is electrically connected to the wiring WX1L.

The connection structure of the circuit MCr different from that of the circuit MC will be described. A second terminal of a transistor M3r is electrically connected to not the wiring OL but the wiring OLB. A first terminal of a transistor M1r and a second terminal of a capacitor C1r are electrically connected to a wiring VEr.

Note that in the retaining portion HC illustrated in FIG. 16, an electrical connection point of the gate of the transistor M1, the first terminal of the capacitor C1, and the first terminal of the transistor M2 is a node n1.

The retaining portion HC has a function of retaining a potential corresponding to a weight coefficient (first data). The potential can be retained in the retention portion HC included in the circuit MC in FIG. 16 in the following manner: when the transistor M2 and the transistor M3 are turned on, a current with a predetermined value is input from the wiring OL to the capacitor C1 so that a potential corresponding to the current value is written thereto, and then the transistor M2 is turned off. Thus, the potential of the node n1 can be retained as the potential corresponding to the weight coefficient (first data). At this time, a current is input from the wiring OL and a potential having a level corresponding to the amount of the current can be retained in the capacitor C1. Therefore, the input of the first data is less likely to be affected by variations in current characteristics (e.g., threshold voltage) of the transistor M1.

The current input to the wiring OL can be input and generated using a current output digital-to-analog converter.

As the transistor M2, a transistor with a low off-state current is preferably used for long-term retention of the potential of the node n1. As the transistor with a low off-state current, an OS transistor can be used, for example. Since an OS transistor includes an oxide semiconductor with a wide band gap in a channel formation region, the OS transistor can have a reduced off-state current.

Alternatively, a transistor including a back gate may be used as the transistor M2, and an off-state current may be reduced by applying a low-level potential to the back gate to shift the threshold voltage to the positive side.

Thus, an arithmetic circuit with high arithmetic operation accuracy is provided. Furthermore, an arithmetic circuit with high reliability is provided.

Structure Example 2 of Arithmetic Circuit

An arithmetic circuit MAC1 that performs a product-sum operation is described as another example. The arithmetic circuit MAC1 can be used for the image processing portion 121 described in the above embodiment.

Figure 17:
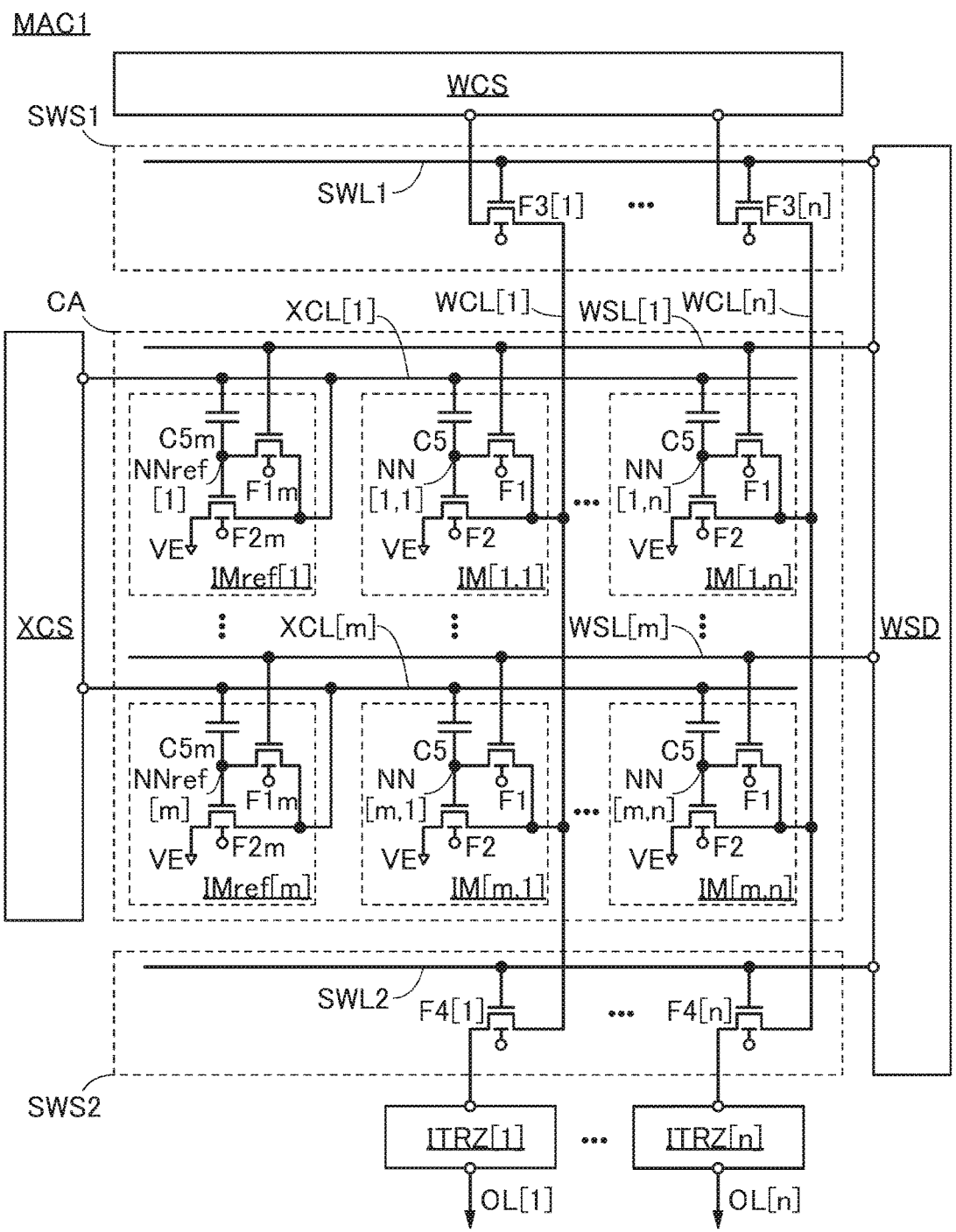
FIG. 17 is a diagram showing a structure example of an arithmetic circuit of a neural network.

FIG. 17 shows a structure example of an arithmetic circuit which performs a product-sum operation of positive or "0" first data and positive or "0" second data. The arithmetic circuit MAC1 shown in FIG. 17 is a circuit that performs a product-sum operation of the first data corresponding to a potential retained in each cell and the input second data, and performs an arithmetic operation of an activation function using the result of the product-sum operation. Note that the first data and the second data can be analog data or multilevel data (discrete data), for example.

This arithmetic circuit, which also functions as a memory for retaining the first data, can be referred to as a memory. In particular, in the case where analog data is used as the first data, the arithmetic circuit can be referred to as an analog memory.

The arithmetic circuit MAC1 includes a circuit WCS, a circuit XCS, a circuit WSD, a circuit SWS1, a circuit SWS2, a cell array CA, and a converter circuit ITRZ[1] to a converter circuit ITRZ[n].

The cell array CA includes a cell IM[1, 1] to a cell IM[m, n] (here, m is an integer greater than or equal to 1 and n is an integer greater than or equal to 1) and a cell IMref[1] to a cell IMref[m]. The cell IM[1, 1] to the cell IM[m, n] have a function of retaining a potential corresponding to the current amount corresponding to the first data, and the cell IMref[1] to the cell IMref[m] have a function of supplying the retained potential and a potential corresponding to the second data required for performing a product-sum operation to a wiring XCL[j] to a wiring XCL[m], respectively.

Although cells are arranged in a matrix of n+1 rows and m columns in the cell array CA in FIG. 17, cells may be arranged in a matrix of two or more rows and one or more columns in the cell array CA.

The cell IM[1, 1] to the cell IM[m, n] each include a transistor F1, a transistor F2, and a capacitor C5, and the cell IMref[1] to the cell IMref[m] each include a transistor F1m, a transistor F2m, and a capacitor C5m, for example.

In particular, the sizes of the transistors F1 (e.g., channel length, channel width, and transistor structure) included in the cell IM[1, 1] to the cell IM[m, n] are preferably equal to each other, and the sizes of the transistors F2 included in the cell IM[1, 1] to the cell IM[m, n] are preferably equal to each other. The sizes of the transistors F1m included in the cell IMref[1] to the cell IMref[m] are preferably equal to each other, and the sizes of the transistors F2m included in the cell IMref[1] to the cell IMref[m] are preferably equal to each other. The size of the transistor F1 is preferably equal to that of the transistor F1m, and the size of the transistor F2 is preferably equal to that of the transistor F2m.

Unless otherwise specified, the transistor F1 and the transistor F1m in an on state may operate in a linear region in the end. In other words, the gate voltage, the source voltage, and the drain voltage of each of the transistors may be biased appropriately so that the transistors operate in the linear region. Note that one embodiment of the present invention is not limited thereto. For example, the transistor F1 and the transistor F1m in an on state may operate in a saturation region or may operate both in a linear region and a saturation region.

Unless otherwise specified, the transistor F2 and the transistor F2m may operate in a subthreshold region (i.e., a voltage between a gate and a source of the transistor F2 or the transistor F2m may be lower than the threshold voltage, preferably a drain voltage exponentially increases with respect to the voltage between the gate and the source). In other words, the gate voltage, the source voltage, and the drain voltage of each of the transistors may be biased appropriately so that the transistors operate in the subthreshold region. Thus, the transistor F2 and the transistor F2m may operate such that an off-state current flows between the source and a drain.

The transistor F1 and/or the transistor F1m are/is preferably an OS transistor described above, for example. In addition, it is further preferable that channel formation regions of the transistor F1 and/or the transistor F1m be an oxide containing at least one of indium, the element M (as the element M, one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like can be given for example), and zinc.

With the use of an OS transistor as the transistor F1 and/or the transistor F1*m*, the leakage current of the transistor F1 and/or the transistor F1*m* can be suppressed, so that the power consumption of the arithmetic circuit can be reduced. Specifically, the amount of leakage current from a retention node to a write word line can be extremely small when the transistor F1 and/or the transistor F1*m* are/is in the non-conduction state; thus, the frequency of refresh operation for the potential of the retention node can be reduced, and the power consumption of the arithmetic circuit can be reduced. An extremely low leakage current from the retention node to the write word line allows cells to retain the potential of the retention node for a long time, increasing the arithmetic operation accuracy of the arithmetic circuit.

The use of an OS transistor also as the transistor F2 and/or the transistor F2*m* enables an operation with a wide range of a current in the subthreshold region, leading to a reduction in the current consumption. The use of an OS transistor also as the transistor F2 and/or the transistor F2*m* allows the transistor F2 and/or the transistor F2*m* to be formed concurrently with the transistor F1 and the transistor F1*m*, leading to a reduction in the number of manufacturing steps for the arithmetic circuit, in some cases. The transistor F2 and/or the transistor F2*m* can be, other than an OS transistor (s), a transistor(s) including silicon in its channel formation region (hereinafter referred to as Si transistor). As the silicon, amorphous silicon (referred to as hydrogenated amorphous silicon in some cases), microcrystalline silicon, polycrystalline silicon, single crystal silicon, or the like can be used, for example.

When an arithmetic circuit or the like is highly integrated into a chip or the like, the chip may have heat when the circuit operates. This heat makes the temperature of a transistor rise to change the characteristics of the transistor and the field-effect mobility thereof might change or the operation frequency thereof might decrease. Since an OS transistor has a higher heat resistance than a Si transistor, a change in the field-effect mobility and a decrease in the operation frequency due to a change in temperature are less likely to be caused. Even when an OS transistor has a high temperature, it is likely to keep a property of the drain current increasing exponentially with respect to a gate-source voltage. Thus, with the use of an OS transistor, even in a high temperature environment, a product-sum operation described later can be easily performed. To fabricate an arithmetic circuit highly resistant to heat generated by its operation, an OS transistor is preferably used as its transistor.

In each of the cell IM[1, 1] to the cell IM[m, n], a first terminal of the transistor F1 is electrically connected to the gate of the transistor F2. A first terminal of the transistor F2 is electrically connected to the wiring VE. A first terminal of the capacitor C5 is electrically connected to the gate of the transistor F2.

In each of the cell IMref[1] to the cell IMref[m], a first terminal of the transistor F1*m* is electrically connected to a gate of the transistor F2*m*. A first terminal of the transistor F2*m* is electrically connected to the wiring VE. A first terminal of the capacitor C5*m* is electrically connected to the gate of the transistor F2*m*.

The arithmetic circuit described in this embodiment does not depend on the polarity of transistors included in the arithmetic circuit. For example, the transistor F1 and the transistor F2 shown in FIG. 17 are n-channel transistors; however, some transistors or all transistors may be p-channel transistors.

The above-described examples of changes in the structure and the polarity of the transistor are not limited to the transistor F1 and the transistor F2. For example, the same applies to the transistor F1*m*, the transistor F2*m*, a transistor F3[1] to a transistor F3[n] and a transistor F4[1] to a transistor F4[n], which are described later, a transistor described in other parts of the specification, and a transistor illustrated in other drawings.

The wiring VE functions as a wiring for supplying a current between the first terminal and a second terminal of the transistor F2 of each of the cell IM[1, 1], the cell IM[m, 1], the cell IM[1, n], and the cell IM[m, n] and a wiring for supplying a current between the first terminal and the second terminal of the transistor F2 of each of the cell IMref[1] and the cell IMref[m]. The wiring VE functions as a wiring for supplying a constant voltage, for example. The constant voltage can be, for example, a low-level potential, a ground potential, or the like.

In the cell IM[1, 1], a second terminal of the transistor F1 is electrically connected to a wiring WCL[1], and a gate of the transistor F1 is electrically connected to a wiring WSL [1]. The second terminal of the transistor F2 is electrically connected to the wiring WCL[1], and a second terminal of the capacitor C5 is electrically connected to the wiring XCL[1]. In FIG. 17, in the cell IM[1, 1], a connection portion of the first terminal of the transistor F1, the gate of the transistor F2, and the first terminal of the capacitor C5 is a node NN[1, 1].

In the cell IM[m, 1], the second terminal of the transistor F1 is electrically connected to the wiring WCL[1], and the gate of the transistor F1 is electrically connected to a wiring WSL[m]. The second terminal of the transistor F2 is electrically connected to the wiring WCL[1], and the second terminal of the capacitor C5 is electrically connected to the wiring XCL[m]. In FIG. 17, in the cell IM[m, 1], a connection portion of the first terminal of the transistor F1, the gate of the transistor F2, and the first terminal of the capacitor C5 is a node NN[m, 1].

In the cell IM[1, n], the second terminal of the transistor F1 is electrically connected to a wiring WCL[n], and the gate of the transistor F1 is electrically connected to the wiring WSL[j]. The second terminal of the transistor F2 is electrically connected to the wiring WCL[n], and the second terminal of the capacitor C5 is electrically connected to the wiring XCL[j]. In FIG. 17, in the cell IM[1, n], a connection portion of the first terminal of the transistor F1, the gate of the transistor F2, and the first terminal of the capacitor C5 is a node NN[1, n].

In the cell IM[m, n], the second terminal of the transistor F1 is electrically connected to the wiring WCL[n], and the gate of the transistor F1 is electrically connected to the wiring WSL[m]. The second terminal of the transistor F2 is electrically connected to the wiring WCL[n], and the second terminal of the capacitor C5 is electrically connected to the wiring XCL[m]. In FIG. 17, in the cell IM[m, n], a connection portion of the first terminal of the transistor F1, the gate of the transistor F2, and the first terminal of the capacitor C5 is a node NN[m, n].

In the cell IMref[1], a second terminal of the transistor F1*m* is electrically connected to the wiring XCL[1], and a gate of the transistor F1*m* is electrically connected to the wiring WSL [1]. A second terminal of the transistor F2*m* is electrically connected to the wiring XCL[j], and the second terminal of the capacitor C5 is electrically connected to the wiring XCL[j]. In FIG. 17, in the cell IMref[1], a connection portion of the first terminal of the transistor F1*m*, the gate of the transistor F2*m*, and the first terminal of the capacitor C5 is a node NNref[1].

In the cell IMref[m], the second terminal of the transistor F1*m* is electrically connected to the wiring XCL[m], and the gate of the transistor F1*m* is electrically connected to the wiring WSL[m]. The second terminal of the transistor F2*m* is electrically connected to the wiring XCL[m], and the second terminal of the capacitor C5 is electrically connected to the wiring XCL[m]. In FIG. 17, in the cell IMref[m], a connection portion of the first terminal of the transistor F1*m*, the gate of the transistor F2*m*, and the first terminal of the capacitor C5 is a node NNref[m].

The node NN[1, 1], the node NN[m, 1], the node NN[1, n], the node NN[m, n], the node NNref[j], and the node NNref[m] described above function as retention nodes of the respective cells.

In the case where the transistor F1 is in an on state in the cell IM[1, 1] to the cell IM[m, n], for example, the transistor F2 is a diode-connected transistor. When a constant voltage supplied by the wiring VE is a ground potential (GND), the transistor F1 is turned on, and a current with a current amount I flows from the wiring WCL to the second terminal of the transistor F2, the potential of the gate of the transistor F2 (node NN) depends on the current amount I. Since the transistor F1 is in an on state, the potential of the second terminal of the transistor F2 is ideally equal to that of the gate of the transistor F2 (node NN). By turning off the transistor F1, the potential of the gate of the transistor F2 (node NN) is retained. Accordingly, the transistor F2 can make a current with the current amount I, which is a current corresponding to the ground potential of the first terminal of the transistor F2 and the potential of the gate of the transistor F2 (node NN), flow between the source and the drain of the transistor F2. In this specification and the like, such an operation is expressed as "the transistor F2 is programmed such that the amount of current flowing between the source and the drain of the transistor F2 is I".

For example, the circuit SWS1 includes the transistor F3[1] to the transistor F3[*n*]. A first terminal of the transistor F3[1] is electrically connected to the wiring WCL[1], a second terminal of the transistor F3[1] is electrically connected to the circuit WCS, and a gate of the transistor F3[1] is electrically connected to a wiring SWL1. A first terminal of the transistor F3[*n*] is electrically connected to the wiring WCL[n], a second terminal of the transistor F3[*n*] is electrically connected to the circuit WCS, and a gate of the transistor F3[*n*] is electrically connected to the wiring SWL1.

Each of the transistor F3[1] to the transistor F3[*n*] is preferably, for example, an OS transistor which can be used as the transistor F1 and/or the transistor F2.

The circuit SWS1 functions as a circuit that establishes or breaks electrical continuity between the circuit WCS and each of the wiring WCL[1] to the wiring WCL[n].

For example, the circuit SWS2 includes the transistor F4[1] to the transistor F4[*n*]. A first terminal of the transistor F4[1] is electrically connected to the wiring WCL[1], a second terminal of the transistor F4[1] is electrically connected to an input terminal of the converter circuit ITRZ[1], and a gate of the transistor F4[1] is electrically connected to a wiring SWL2. A first terminal of the transistor F4[*n*] is electrically connected to the wiring WCL[n], a second terminal of the transistor F4 [n] is electrically connected to an input terminal of the converter circuit ITRZ[n], and a gate of the transistor F4[*n*] is electrically connected to the wiring SWL2.

Each of the transistor F4[1] to the transistor F4[*n*] is preferably, for example, an OS transistor which can be used as the transistor F1 and/or the transistor F2.

The circuit SWS2 functions as a circuit that establishes or breaks electrical continuity between the wiring WCL[1] and the converter circuit ITRZ[1] and between the wiring WCL [n] and the converter circuit ITRZ[n].

The circuit WCS has a function of supplying data that is to be stored in each cell of the cell array CA.

The circuit XCS is electrically connected to the wiring XCL[j] to the wiring XCL[m]. The circuit XCS has a function of supplying a current corresponding to reference data or a current corresponding to the second data to each of the cell IMref[1] to the cell IMref[m] included in the cell array CA.

The circuit WSD is electrically connected to the wiring WSL[j] to the wiring WSL[m]. The circuit WSD has a function of selecting a row of the cell array CA to which the first data is written by supplying a predetermined signal to each of the wiring WSL[j] to the wiring WSL[m], when the first data is written to the cell IM[1, 1] to the cell IM[m, n].

For example, the circuit WSD is electrically connected to the wiring SWL1 and the wiring SWL2. The circuit WSD has a function of establishing or breaking electrical continuity between the circuit WCS and the cell array CA by supplying a predetermined signal to the wiring SWL1 and a function of establishing or breaking electrical continuity between the cell array CA and each of the converter circuit ITRZ[1] to the converter circuit ITRZ[n] by supplying a predetermined signal to the wiring SWL2.

The converter circuit ITRZ[1] to the converter circuit ITRZ[n] each include the input terminal and an output terminal, for example. For example, the output terminal of the converter circuit ITRZ[1] is electrically connected to the wiring OL[1], and the output terminal of the converter circuit ITRZ[n] is electrically connected to the wiring OL[n].

The converter circuit ITRZ[1] to the converter circuit ITRZ[n] each have a function of converting a current input to the input terminal into a voltage and outputting the voltage from the output terminal. Examples of the voltage include an analog voltage and a digital voltage. The converter circuit ITRZ[1] to the converter circuit ITRZ[n] may each include an arithmetic circuit of a function system. In that case, for example, the arithmetic circuit may perform an arithmetic operation of a function using the voltage obtained by the conversion and output the results of the arithmetic operation to the wiring OL[1] to the wiring OL[n].

Particularly in the case where an arithmetic operation of the hierarchical neural network is performed, a sigmoid function, a tanh function, a softmax function, a ReLU function, a threshold function, or the like can be used as the above-described function.

As the circuit WCS shown in FIG. 17, a current output digital-to-analog converter can be used. As the circuit XCS shown in FIG. 17, a current output digital-to-analog converter can be used.

At least part of any of the structure examples, the drawings corresponding thereto, and the like described in this embodiment can be combined with any of the other structure examples, the other drawings corresponding thereto, and the like as appropriate.

At least part of this embodiment can be implemented in combination with any of the other embodiments described in this specification, as appropriate.

Embodiment 4

In this embodiment, a schematic top view and a cross-sectional schematic view of a light-emitting element included in a display device and its surroundings, a structure example of a light-emitting element, a structure example of a light-emitting element and a light-receiving element, and a structure example of a display device are described.

<Schematic Top View and Cross-Sectional Schematic View of Light-Emitting Element and its Surroundings>

First, structure examples of a display device included in an electronic device with an eye tracking function utilizing infrared light are described with reference to FIG. 18A to FIG. 23B. Note that the following description includes a description of a structure example of a display device included in an electronic device with an eye tracking function utilizing visible light in some cases.

Figure 18A:
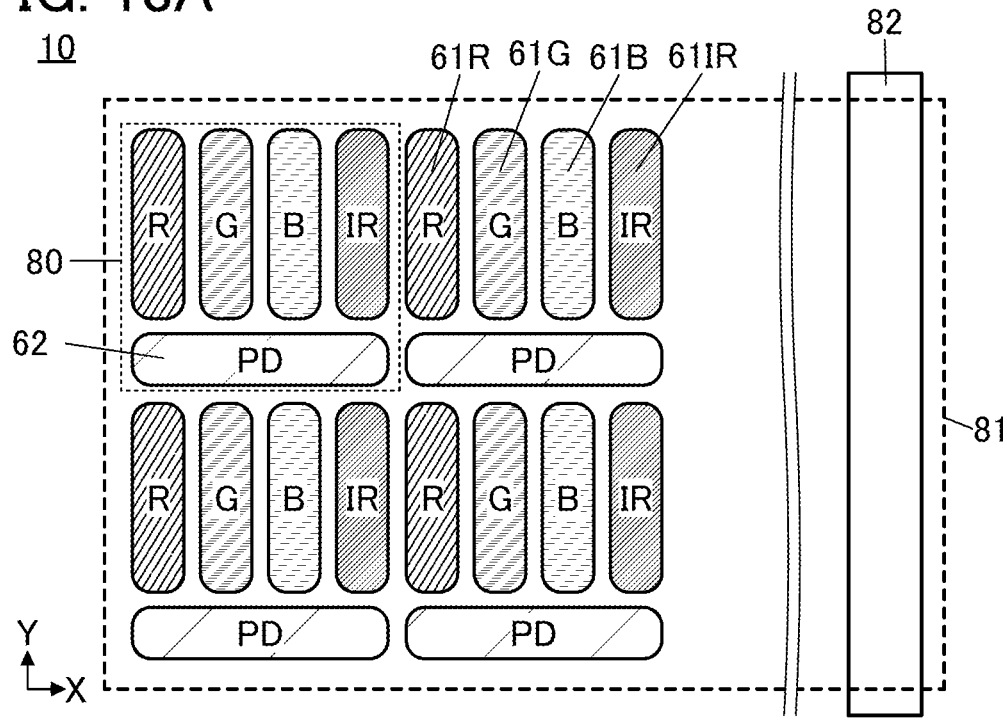
FIG. 18A and FIG. 18B are diagrams illustrating structure examples of a display device.

FIG. 18A is a schematic top view illustrating a structure example of the case where light-emitting elements and a light-receiving element are arranged in one pixel in a display device 10 of one embodiment of the present invention. The display device 10 includes light-emitting elements 61R that emit red light, light-emitting elements 61G that emit green light, light-emitting elements 61B that emit blue light, light-emitting elements 61IR that emit infrared light, and the light-receiving elements 62.

In the following description common to the light-emitting element 61R, the light-emitting element 61G, the light-emitting element 61B, the light-emitting element 61IR, and the light-emitting element 61LS described later, the alphabets are omitted from the reference numerals and the term "light-emitting element 61" is used in some cases. Alternatively, the light-emitting element 61 refers to one or more of the light-emitting element 61R, the light-emitting element 61G, the light-emitting element 61B, the light-emitting element 61IR, and the light-emitting element 61LS in some cases.

In FIG. 18A, light-emitting regions of the light-emitting elements 61 are denoted by R, G, B, and IR to easily differentiate the light-emitting elements 61. In addition, light-receiving regions of the light-emitting elements 62 are denoted by PD.

The display device 10 illustrated in FIG. 18A corresponds to the display device 100 in Embodiment 1. The light-emitting element 61R, the light-emitting element 61G, the light-emitting element 61B, and the light-emitting element 61IR respectively correspond to the light-emitting element 110R, the light-emitting element 110G, the light-emitting element 110B, and the light-emitting element 110IR in Embodiment 1. Furthermore, the light-receiving element 62 corresponds to the light-receiving element in the sensor portion 104 in Embodiment 1.

The light-emitting elements 61R, the light-emitting elements 61G, the light-emitting elements 61B, the light-emitting elements 61IR, and the light-receiving elements 62 are arranged in a matrix. FIG. 18A illustrates an example where the light-emitting elements 61R, the light-emitting elements 61G, the light-emitting elements 61B, and the light-emitting elements 61IR are arranged in the X direction, and the light-receiving elements 62 are arranged in the Y direction (the direction intersecting with the X direction) with respect to the light-emitting elements. FIG. 18A illustrates a structure example where the light-emitting elements 61 that emit light of the same color are arranged in the Y direction intersecting with the X direction. In the display device 10 illustrated in FIG. 18A, a pixel 80 can be composed of a subpixel including the light-emitting element 61R, a subpixel including the light-emitting element 61G, a subpixel including the light-emitting element 61B, and a subpixel including the light-emitting element 61IR, which are arranged in the X direction, and a subpixel including the light-receiving element 62 provided in the Y direction with respect to the subpixels, for example. The light-receiving element 62 illustrated in FIG. 18A has a function of detecting infrared light.

FIG. 18A illustrates what is called a stripe arrangement, in which the light-emitting elements of the same color are arranged in one direction. Note that the arrangement method of the light-emitting elements is not limited thereto; another arrangement method such as delta arrangement or zigzag arrangement may be used, or PenTile arrangement can be used.

As each of the light-emitting elements 61R, the light-emitting elements 61G, the light-emitting elements 61B, the light-emitting elements 61IR, and the light-emitting elements 61LS that is described later, an EL element such as an organic light-emitting diode (OLED) or a quantum-dot light-emitting diode (QLED) is preferably used. Examples of a light-emitting substance included in the EL elements include a substance exhibiting fluorescence (a fluorescent material), a substance exhibiting phosphorescence (a phosphorescent material), an inorganic compound (e.g., a quantum dot material), and a substance exhibiting thermally activated delayed fluorescence (a thermally activated delayed fluorescent (TADF) material).

As the light-receiving element 62, a pn photodiode or a pin photodiode can be used, for example. The light-receiving element 62 functions as a photoelectric conversion element that detects light incident on the light-receiving element 62 and generates electric charge. The amount of generated electric charge depends on the amount of incident light.

It is particularly preferable to use an organic photodiode including a layer containing an organic compound as the light-receiving element 62. An organic photodiode, which is easily made thin, lightweight, and large in area and has a high degree of freedom for shape and design, can be used in a variety of display devices.

In one embodiment of the present invention, organic EL elements are used as the light-emitting elements 61, and organic photodiodes are used as the light-receiving elements 62. The organic EL elements and the organic photodiodes can be formed over one substrate. Thus, the organic photodiodes can be incorporated in a display device including the organic EL elements.

It is known that in the case where light-emitting layers are separately formed for light-emitting elements of different colors, the light-emitting layers are formed by an evaporation method using a shadow mask such as a metal mask or an FMM (a fine metal mask or a high-resolution metal mask). Note that in this specification and the like, the element formed in this manner is referred to as an element with an MM (metal mask) structure in some cases. However, the MM structure causes a deviation from the designed shape and position of an island-shaped organic film due to various influences such as the accuracy of the metal mask, the positional deviation between the metal mask and a substrate, a warp of the metal mask, and the vapor-scattering-induced expansion of the outline of the deposited film, which makes it difficult to achieve high resolution and a high aperture ratio. Thus, a measure has been taken for pseudo improvement in resolution (also referred to as a pixel density) by employing a unique pixel arrangement method such as PenTile arrangement, for example.

For example, a light-emitting layer is processed into a fine pattern without using a shadow mask such as a metal mask or an FMM. Specifically, the light-emitting layer is processed into a fine pattern by a photolithography method.

Note that in this specification and the like, an element formed in the above manner is referred to as an element with an MML (metal maskless) structure. The use of the MML structure offers a display device with high resolution and a high aperture ratio, which has been difficult to achieve. Moreover, light-emitting layers can be formed separately, enabling the display device to perform extremely clear display with high contrast and high display quality.

Here, description is made on the case where light-emitting layers in light-emitting elements of two colors are separately formed, for simplicity. First, a stack of a first light-emitting film and a first sacrificial film is formed to cover two pixel electrodes. Next, a resist mask is formed in a position overlapping with one pixel electrode (a first pixel electrode) over the first sacrificial film. Then, the resist mask, part of the first sacrificial film, and part of the first light-emitting film are etched. In this case, the etching is stopped when the other pixel electrode (a second pixel electrode) is exposed. Thus, part of the first light-emitting film processed into a belt-like or island shape (also referred to as a first light-emitting layer) can be formed over the first pixel electrode, and part of the sacrificial film (also referred to as a first sacrificial layer) can be formed thereover. Note that in this specification and the like, a sacrificial film may be referred to as a mask film. Furthermore, the sacrificial layer may be referred to as a mask layer.

Next, a stack of a second light-emitting film and a second sacrificial film is formed. Then, resist masks are formed in a position overlapping with the first pixel electrode and in a position overlapping with the second pixel electrode. Then, the resist mask, part of the second sacrificial film, and part of the second light-emitting film are etched in a manner similar to the above. As a result, a state in which the first light-emitting layer and the first sacrificial layer are provided over the first pixel electrode, and a second light-emitting layer and a second sacrificial layer are provided over the second pixel electrode is obtained. In this manner, the first light-emitting layer and the second light-emitting layer can be formed separately. Finally, the first sacrificial layer and the second sacrificial layer are removed to expose the first light-emitting layer and the second light-emitting layer and then a common electrode is formed, whereby light-emitting elements of two colors can be separately formed.

Furthermore, by repeating the above-described steps, light-emitting layers in light-emitting elements of three or more colors can be separately formed, so that a display device including light-emitting elements of three or four or more colors can be achieved.

Here, an electrode (also referred to as a first electrode, a connection electrode, or the like), which is to supply a potential to the common electrode, can be formed on the same plane as the pixel electrode to be electrically connected to the common electrode. The connection electrode is placed outside a display region in which pixels are provided. Here, in order to prevent the top surface of the connection electrode from being exposed in the etching of the above first light-emitting film, it is preferable that the first sacrificial layer be also provided over the connection electrode. Similarly, the second sacrificial layer is preferably provided over the connection electrode in the etching of the second light-emitting film. The first sacrificial layer and the second sacrificial layer provided over the connection electrode can be removed by etching concurrently with the first sacrificial layer over the first light-emitting layer and the second sacrificial layer over the second light-emitting layer.

A distance between light-emitting layers for different colors, which is hard to set to less than 10 μm in the MM structure, for example, can be decreased to less than or equal to 6 μm, less than or equal to 4 μm, less than or equal to 3 μm, less than or equal to 2 μm, or less than or equal to 1 μm in the MML structure. Furthermore, with use of an exposure apparatus for LSI, for example, the distance can be decreased to be less than or equal to 500 nm, less than or equal to 200 nm, less than or equal to 100 nm, or less than or equal to 50 nm. Accordingly, the area of a non-light-emitting region that may exist between two light-emitting elements can be significantly reduced, and the aperture ratio can be close to 100%. For example, the aperture ratio higher than or equal to 50%, higher than or equal to 60%, higher than or equal to 70%, higher than or equal to 80%, or higher than or equal to 90% and lower than 100% can be achieved.

Furthermore, a pattern of the light-emitting layer itself can be made extremely smaller than that in the case of using a metal mask. For example, in the case of using a metal mask for forming light-emitting layers separately, a variation in the thickness of the pattern occurs between the center and the edge of the pattern, causing a reduction in effective area that can be used for a light-emitting region with respect to the entire pattern area. By contrast, in the above fabrication method, a pattern is formed by processing a film formed to have a uniform thickness, which enables a uniform thickness in the pattern; thus, even with a fine pattern, almost the entire area can be used for a light-emitting region. Therefore, the above fabrication method makes it possible to achieve both a high resolution and a high aperture ratio.

As described above, with the above fabrication method, a display device in which minute light-emitting elements are integrated can be obtained, and it is not necessary to conduct a pseudo improvement in resolution by employing a unique pixel arrangement such as a PenTile arrangement; thus, the display device can achieve a resolution higher than or equal to 500 ppi, higher than or equal to 1000 ppi, higher than or equal to 2000 ppi, higher than or equal to 3000 ppi, or higher than or equal to 5000 ppi while having what is called a stripe pattern where R, G, and B are arranged in one direction.

FIG. 18A illustrates a common electrode 81 and a connection electrode 82. Here, the connection electrode 82 is electrically connected to the common electrode 81. The connection electrode 82 is provided outside a display region where the light-emitting elements 61 and the light-receiving elements 62 are arranged. In FIG. 18A, the common electrode 81 having a region overlapping with the light-emitting elements 61, the light-receiving elements 62, and the connection electrode 82 is shown by dashed lines.

The connection electrode 82 can be provided along the outer periphery of the display region. For example, the connection electrode 82 may be provided along one side of the outer periphery of the display region or two or more sides of the outer periphery of the display region. That is, the top surface shape of the connection electrode 82 can be a belt-like shape, an L-like shape, a U-like shape (a square bracket shape), a quadrangular shape, or the like in the case where the top surface shape of the display region is a rectangle.

Figure 18B:
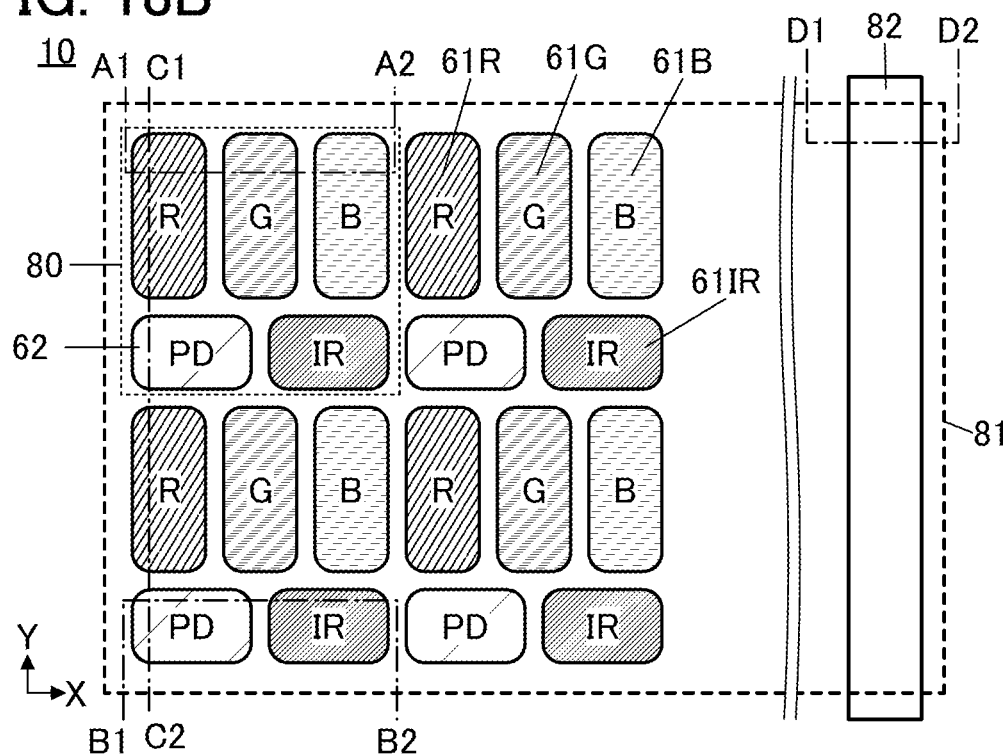

FIG. 18B is a schematic top view illustrating a structure example of the display device and is a modification example of the display device 10 illustrated in FIG. 18A. The display device 10 illustrated in FIG. 18B differs from the display device 10 illustrated in FIG. 18A in that the light-receiving elements 62 and the light-emitting elements 61IR are alternately arranged in the X direction.

In the display device 10 illustrated in FIG. 18B, the light-emitting element 61R, the light-emitting element 61G, and the light-emitting element 61B are arranged in a row different from the row of the light-emitting element 61IR. Thus, the light-emitting element 61R, the light-emitting element 61G, and the light-emitting element 61B can have larger widths (larger lengths in the X direction), so that the luminance of light emitted from the pixel 80 can be increased.

Figure 19A:
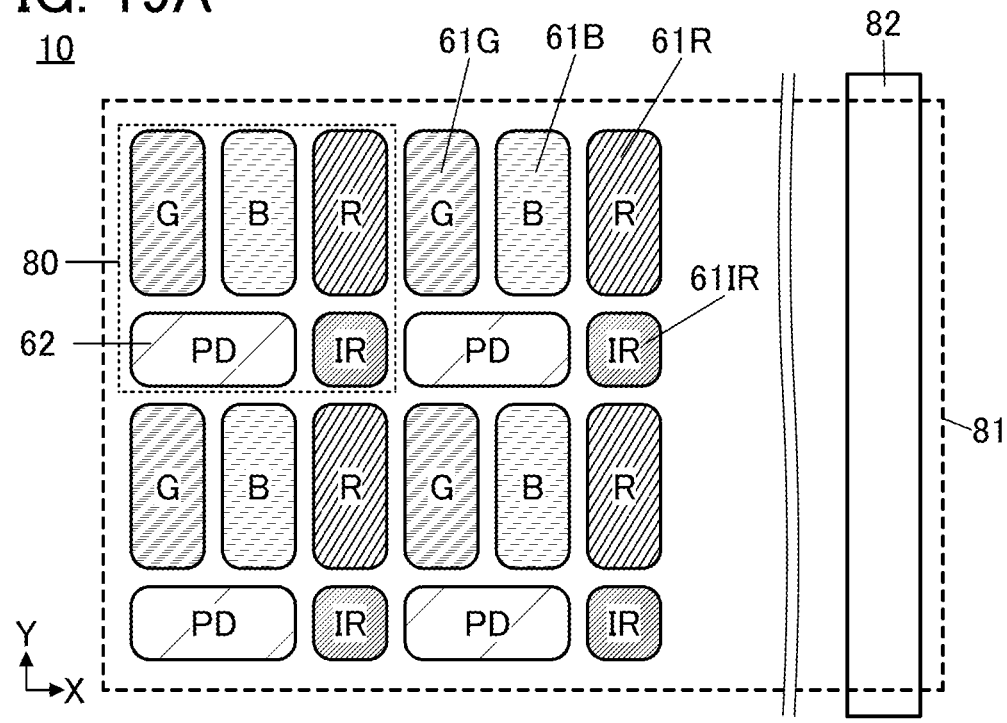
FIG. 19A and FIG. 19B are diagrams illustrating structure examples of a display device.

FIG. 19A is a schematic top view illustrating a structure example of the display device and is a modification example of the display device 10 illustrated in FIG. 18B. The display device 10 illustrated in FIG. 19A differs from the display device 10 illustrated in FIG. 18B in that the light-emitting elements 61 are arranged in the X direction in the order of G, B, and R instead of the order of R, G, and B. The display device 10 illustrated in FIG. 19A differs from the display device 10 illustrated in FIG. 18B also in that the light-receiving element 62 is provided below the light-emitting element 61G and the light-emitting element 61B and the light-emitting element 61IR is provided below the light-emitting element 61R.

The area occupied by the light-receiving element 62 in the display device 10 illustrated in FIG. 19A is larger than the area occupied by the light-receiving element 62 in the display device illustrated in FIG. 18B. Accordingly, the light detection sensitivity of the light-receiving element 62 can be increased. Therefore, in the case where the display device 10 has an eye tracking function, for example, highly accurate eye tracking can be performed. Note that the area occupied by the light-receiving element 62 can be rephrased as an area of the light-receiving element 62 in a top view.

Figure 19B:
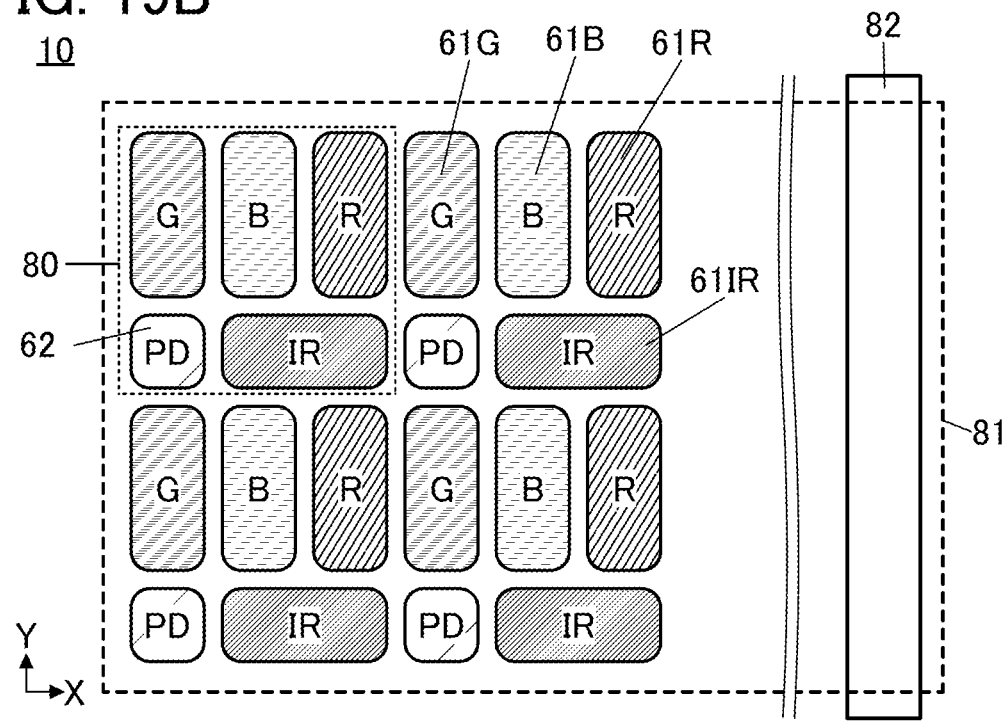

FIG. 19B is a schematic top view illustrating a structure example of the display device and is a modification example of the display device 10 illustrated in FIG. 19A. The display device 10 illustrated in FIG. 19B differs from the display device 10 illustrated in FIG. 19A in that the light-receiving element 62 is provided below the light-emitting element 61G and the light-emitting element 61IR is provided below the light-emitting element 61B and the light-emitting element 61R.

The area occupied by the light-receiving element 62 in the display device 10 illustrated in FIG. 19B is smaller than the area occupied by the light-receiving element 62 in the display device 10 illustrated in FIG. 19A. When the area occupied by the light-receiving element 62 is made small, the light-receiving range of each light-receiving element 62 can be narrowed. It is thus possible to reduce overlap between the light-receiving ranges of different light-receiving elements 62, e.g., adjacent light-receiving elements 62. This can inhibit blurring in an image captured using the light-receiving element 62 and failure in clear image capturing. Accordingly, for example, in the case where the display device 10 has an eye tracking function, the area occupied by the light-receiving element 62 is preferably reduced because a clear eyeball image can be captured, for example, which leads to higher authentication accuracy.

Here, the display device 10 illustrated in each of FIG. 18A, FIG. 18B, FIG. 19A, and FIG. 19B corresponds to the display device 100 illustrated in FIG. 3B.

Figure 20A:
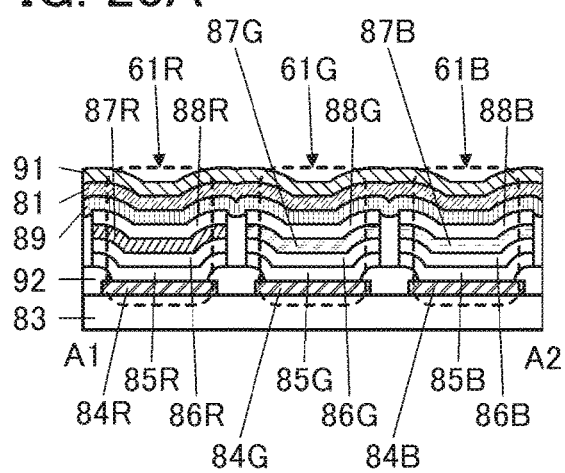
FIG. 20A to FIG. 20E are diagrams illustrating structure examples of a display device.
Figure 20B:
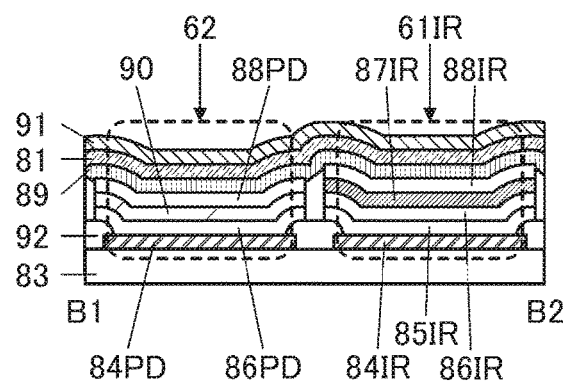
Figure 20C:
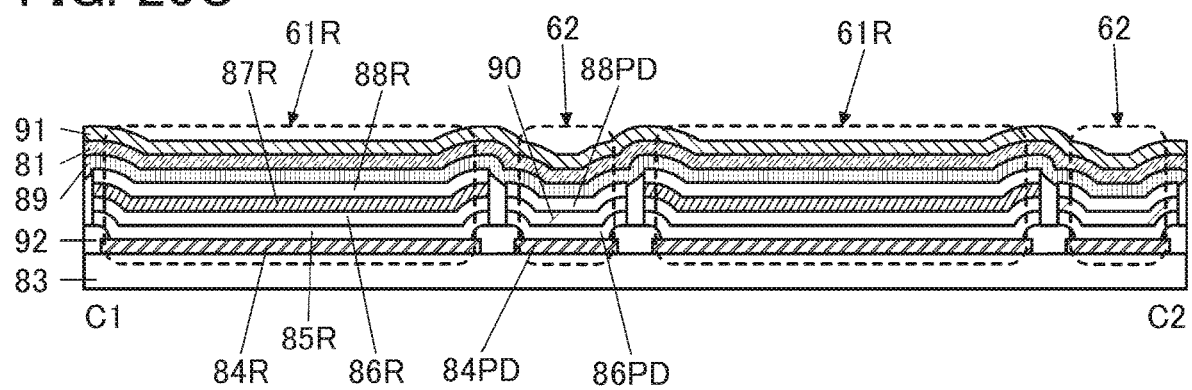
Figure 20D:
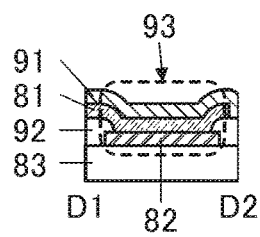

FIG. 20A is a schematic cross-sectional view taken along the dashed-dotted line A1-A2 in FIG. 18B, and FIG. 20B is a schematic cross-sectional view taken along the dashed-dotted line B1-B2 in FIG. 18B. FIG. 20C is a cross-sectional view taken along dashed-dotted line C1-C2 in FIG. 18B, and FIG. 20D is a cross-sectional view taken along dashed-dotted line D1-D2 in FIG. 18B. The light-emitting elements 61R, the light-emitting elements 61G, the light-emitting elements 61B, the light-emitting elements 61IR, and the light-receiving elements 62 are provided over a substrate 83.

In the case where the expression "B over A" or "B under A" is used in this specification and the like, for example, A and B do not always need to include a region where they are in contact with each other.

As the substrate 83, a substrate having at least heat resistance high enough to withstand the following heat treatment can be used. In the case where an insulating substrate is used as the substrate 83, a glass substrate, a quartz substrate, a sapphire substrate, a ceramic substrate, an organic resin substrate, or the like can be used. Alternatively, a single crystal semiconductor substrate using silicon or silicon carbide as a material, a polycrystalline semiconductor substrate, a compound semiconductor substrate of silicon germanium or the like, a semiconductor substrate such as an SOI substrate, or the like can be used. Note that for the display device illustrated in each of FIG. 2A, FIG. 2B, FIG. 5A, FIG. 5B, FIG. 9A, and FIG. 11A, a light-transmitting material such as a glass substrate is preferably used for the substrate 83.

As the substrate 83, it is particularly preferable to use the semiconductor substrate or the insulating substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

The substrate 83 corresponds to the substrate 101 in Embodiment 1.

FIG. 20A illustrates a cross-sectional structure example of the light-emitting element 61R, the light-emitting element 61G, and the light-emitting element 61B. The light-emitting element 61R includes a pixel electrode 84R, a hole-injection layer 85R, a hole-transport layer 86R, a light-emitting layer 87R, an electron-transport layer 88R, a common layer 89, and the common electrode 81. The light-emitting element 61G includes a pixel electrode 84G, a hole-injection layer 85G, a hole-transport layer 86G, a light-emitting layer 87G, an electron-transport layer 88G, the common layer 89, and the common electrode 81. The light-emitting element 61B includes a pixel electrode 84B, a hole-injection layer 85B, a hole-transport layer 86B, a light-emitting layer 87B, an electron-transport layer 88B, the common layer 89, and the common electrode 81.

FIG. 20B illustrates a cross-sectional structure example of the light-emitting element 61IR and the light-receiving element 62. The light-emitting element 61IR includes a pixel electrode 84IR, a hole-injection layer 85IR, a hole-transport layer 86IR, a light-emitting layer 87IR, an electron-transport layer 88IR, the common layer 89, and the common electrode 81. The light-receiving element 62 includes a pixel electrode 84PD, a hole-transport layer 86PD, a light-receiving layer 90, an electron-transport layer 88PD, the common layer 89, and the common electrode 81.

In the following description common to the pixel electrode 84R, the pixel electrode 84G, the pixel electrode 84B, the pixel electrode 84IR, and the pixel electrode 84PD, the alphabets are omitted from the reference numerals and the term "pixel electrode 84" is used in some cases. Likewise, in the description common to the hole-injection layer 85R, the hole-injection layer 85G, the hole-injection layer 85B, and the hole-injection layer 85IR, the alphabets are omitted from the reference numerals and the term "hole-injection layer 85" is used in some cases. Likewise, in the description common to the hole-transport layer 86R, the hole-transport layer 86G, the hole-transport layer 86B, the hole-transport layer 86IR, and the hole-transport layer 86PD, the alphabets are omitted from the reference numerals and the term "hole-transport layer 86" is used in some cases. Likewise, in the description common to the light-emitting layer 87R, the light-emitting layer 87G, the light-emitting layer 87B, and the light-emitting layer 87IR, the alphabets are omitted from the reference numerals and the term "light-emitting layer 87" is used in some cases. Likewise, in the description common to the electron-transport layer 88R, the electron-transport layer 88G, the electron-transport layer 88B, the electron-transport layer 88IR, and the electron-transport layer 88PD, the alphabets are omitted from the reference numerals and the term "electron-transport layer 88" is used in some cases.

The common layer 89 has a function of an electron-injection layer in the light-emitting element 61. Meanwhile, the common layer 89 has a function of an electron-transport layer in the light-receiving element 62. Therefore, the light-receiving element 62 does not necessarily have to include the electron-transport layer 88PD in some cases.

The hole-injection layer 85, the hole-transport layer 86, the electron-transport layer 88, and the common layer 89 can also be referred to as functional layers. Furthermore, the light-emitting element includes an EL layer between a pair of electrodes. Therefore, in the light-emitting element 61 illustrated in FIG. 20A and the like, the hole-injection layer 85, the hole-transport layer 86, the light-emitting layer 87, the electron-transport layer 88, and the common layer 89 can be collectively referred to as an EL layer.

The pixel electrode 84, the hole-injection layer 85, the hole-transport layer 86, the light-emitting layer 87, and the electron-transport layer 88 can each be separately provided for each element. The light-emitting elements 61R, the light-emitting elements 61G, the light-emitting elements 61B, the light-emitting elements 61IR, and the light-receiving elements 62 include the common layer 89 and the common electrode 81 in common.

The light-emitting elements 61 and the light-receiving elements 62 may each include a hole-blocking layer and an electron-blocking layer other than the layers illustrated in FIG. 20A and the like. The light-emitting elements 61 and the light-receiving elements 62 may each include a layer containing a bipolar substance (a substance with a high electron-transport property and a high hole-transport property).

A gap is provided between the common layer 89 and an insulating layer 92 described later. This can inhibit contact between the common layer 89 and each of a side surface of the light-emitting layer 87, a side surface of the light-receiving layer 90, a side surface of the hole-transport layer 86, and a side surface of the hole-injection layer 85. Thus, a short circuit in the light-emitting elements 61 and a short circuit in the light-receiving elements 62 can be inhibited.

The shorter the distance between the light-emitting layers 87 is, the more easily the gap is formed, for example. For example, when the distance is less than or equal to 1 µm, preferably less than or equal to 500 nm, further preferably less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm, the gap can be favorably formed.

In FIG. 20A and the like, the light-emitting element 61 includes the pixel electrode 84, the hole-injection layer 85, the hole-transport layer 86, the light-emitting layer 87, the electron-transport layer 88, the common layer 89 (electron-injection layer), and the common electrode 81 in this order from the bottom, and the light-receiving element 62 includes the pixel electrode 84PD, the hole-transport layer 86PD, the light-receiving layer 90, the electron-transport layer 88PD, the common layer 89, and the common electrode 81 in this order from the bottom; however, one embodiment of the present invention is not limited thereto. For example, the light-emitting element 61 may include a pixel electrode, an electron-injection layer, an electron-transport layer, a light-emitting layer, a hole-transport layer, a hole-injection layer, and a common electrode in this order from the bottom, and the light-receiving element 62 may include a pixel electrode, an electron-transport layer, a light-receiving layer, a hole-transport layer, and a common electrode in this order from the bottom. In that case, the hole-injection layer included in the light-emitting element 61 can be a common layer, and the common layer can be provided between the hole-transport layer included in the light-receiving element 62 and the common electrode. In addition, the electron-injection layers can be separated between the light-emitting elements 61.

Note that when the MML structure is used for the light-emitting element 61 and the light-receiving element 62, the light-emitting element 61 and the light-receiving element 62 can have different structures. For example, the light-emitting element 61 may include the pixel electrode 84, the hole-injection layer 85, the hole-transport layer 86, the light-emitting layer 87, the electron-transport layer 88, the common layer 89 (electron-injection layer), and the common electrode 81 in this order from the bottom, and the light-receiving element 62 may include the pixel electrode 84PD, the electron-transport layer 88PD, the light-receiving layer 90, the hole-transport layer 86PD, the common layer 89, and the common electrode 81 in this order from the bottom. When this structure is employed, drive voltage for the light-emitting element 61 and drive voltage for the light-receiving element 62 can be in the same direction. Note that in the light-receiving element 62 having the above structure, a hole-injection layer may be provided between the hole-transport layer 86PD and the common layer 89.

Although the electron-transport layer is considered as being provided over the hole-transport layer in the description below, the following description can also be applied to the case where the electron-transport layer is provided under the hole-transport layer, when "electron" is replaced with "hole" and "hole" is replaced with "electron", for example.

The hole-injection layer injects holes from an anode to the hole-transport layer and contains a material with a high hole-injection property. As the material with a high hole-injection property, an aromatic amine compound and a composite material containing a hole-transport material and an acceptor material (electron-accepting material) can be used, for example.

The hole-transport layer is a layer transporting holes, which are injected from the anode by the hole-injection layer, to the light-emitting layer. The hole-transport layer contains a hole-transport material. As the hole-transport material, a substance having a hole mobility greater than or equal to $1 \times 10^{-6}$ cm$^2$/Vs is preferable. Note that other substances can also be used as long as the substances have a hole-transport property higher than an electron-transport property. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferred.

The electron-transport layer is a layer transporting electrons, which are injected from a cathode by the electron-injection layer, to the light-emitting layer. The electron-transport layer contains an electron-transport material. As the electron-transport material, a substance having an electron mobility greater than or equal to $1 \times 10^{-6}$ cm$^2$/Vs is preferable. Note that other substances can also be used as long as the substances have an electron-transport property higher than a hole-transport property. As the electron-transport material, any of the following materials having a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound such as a nitrogen-containing heteroaromatic compound.

The electron-injection layer injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The electron-injection layer can be formed using an alkali metal, an alkaline earth metal, or a compound thereof, such as lithium, cesium, lithium fluoride (LiF), cesium fluoride (CsF), calcium fluoride (CaF$_2$), 8-(quinolinolato)lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolato lithium (abbreviation: LiPPP), lithium oxide (LiO$_x$), or cesium carbonate.

Alternatively, an electron-transport material may be used for the electron-injection layer. For example, a compound having an unshared electron pair and an electron deficient heteroaromatic ring can be used as the electron-transport material. Specifically, a compound with at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of the organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used for the organic compound having an unshared electron pair. Note that NBPhen has a higher glass transition temperature (Tg) than BPhen and thus has high heat resistance.

The light-emitting layer contains a light-emitting substance. The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton, an organometallic complex (particularly an iridium complex) having a phenylpyridine derivative including an electron-withdrawing group as a ligand, a platinum complex, and a rare earth metal complex.

The light-emitting layer may contain one or more kinds of organic compounds (e.g., a host material or an assist material) in addition to the light-emitting substance (guest material). As one or more kinds of organic compounds, one or both of the hole-transport material and the electron-transport material can be used. Alternatively, as one or more kinds of organic compounds, a bipolar material or a TADF material may be used.

The light-emitting layer preferably includes a combination of a hole-transport material and an electron-transport material that easily forms an exciplex and a phosphorescent material, for example. With such a structure, light emission can be efficiently obtained by exciplex-triplet energy transfer (ExTET), which is energy transfer from an exciplex to a light-emitting substance (phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting element can be achieved at the same time.

In a combination of materials for forming an exciplex, the highest occupied molecular orbital level (HOMO level) of the hole-transport material is preferably higher than or equal to that of the electron-transport material. The lowest unoccupied molecular orbital level (LUMO level) of the hole-transport material is preferably higher than or equal to that of the electron-transport material. The LUMO levels and the HOMO levels of the materials can be derived from the electrochemical characteristics (the reduction potentials and the oxidation potentials) of the materials that are measured by cyclic voltammetry (CV).

The formation of an exciplex can be confirmed, for example, by a phenomenon in which the emission spectrum of a mixed film in which the hole-transport material and the electron-transport material are mixed is shifted to the longer wavelength side than the emission spectra of each of the hole-transport material and the electron-transport material (or has another peak on the longer wavelength side) observed by comparison of the emission spectra of the hole-transport material, the electron-transport material, and the mixed film of these materials. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the hole-transport material and the electron-transport material, observed by comparison of transient PL of the hole-transport material, the electron-transport material, and the mixed film of these materials. The transient PL can be rephrased as transient electroluminescence (EL). That is, the formation of an exciplex can also be confirmed by a difference in transient response observed by comparison of the transient EL of the hole-transport material, the electron-transport material, and the mixed film of the materials.

The light-emitting layer 87R of the light-emitting element 61R includes at least a light-emitting organic compound that emits light with an intensity in a red wavelength range. The light-emitting layer 87G of the light-emitting element 61G includes at least a light-emitting organic compound that emits light with an intensity in a green wavelength range. The light-emitting layer 87B of the light-emitting element 61B includes at least a light-emitting organic compound that emits light with an intensity in a blue wavelength range. The light-emitting layer 87IR of the light-emitting element 61IR includes at least a light-emitting organic compound that emits light with an intensity in a wavelength range of infrared light. The light-receiving layer 90 of the light-receiving element 62 illustrated in FIG. 18A includes an organic compound having detection sensitivity in a wavelength range of infrared light, for example.

A conductive film that transmits visible light is used for either the pixel electrode 84 or the common electrode 81, and a reflective conductive film is used for the other. When the pixel electrode 84 has a light-transmitting property and the common electrode 81 has a light-reflecting property, the display device 10 can have a bottom emission structure. When the pixel electrode 84 has a light-reflecting property and the common electrode 81 has a light-transmitting property, the display device 10 can have a top emission structure. When both the pixel electrode 84 and the common electrode 81 transmit light, the display device 10 can have a dual-emission structure.

The light-emitting element 61 preferably has a micro-optical resonator (microcavity) structure. In that case, light emitted from the light-emitting layer 87 can be resonated between the pixel electrode 84 and the common electrode 81, so that light emitted from the light-emitting element 61 can be intensified.

In the case where the light-emitting element 61 has a microcavity structure, one of the common electrode 81 and the pixel electrode 84 is preferably an electrode having both a light-transmitting property and a light-reflecting property (transflective electrode), and the other of the common electrode 81 and the pixel electrode 84 is preferably a reflective electrode.

The light-emitting layer 87IR of the light-emitting element 61IR emitting light whose wavelength is the longest is made to have the largest thickness, the light-emitting layer 87R of the light-emitting element 61R emitting light whose wavelength is the second longest is made to have the second largest thickness, the light-emitting layer 87G of the light-emitting element 61G emitting light whose wavelength is the third longest is made to have the third largest thickness, and the light-emitting layer 87B of the light-emitting element 61B emitting light whose wavelength is the shortest is made to have the smallest thickness; whereby, the light-emitting element 61 can have a microcavity structure. With-out limitation to this, the thickness of each light-emitting layer can be adjusted in consideration of the wavelength of light emitted from the light-emitting element, the optical characteristics of the layer included in the light-emitting element, the electrical characteristics of the light-emitting element, and the like.

The transparent electrode has a light transmittance higher than or equal to 40%. For example, an electrode having a visible light (light with a wavelength greater than or equal to 400 nm and less than 750 nm) transmittance higher than or equal to 40% is preferably used in the light-emitting elements 61. The visible light reflectivity of the transflective electrode is higher than or equal to 10% and lower than or equal to 95%, preferably higher than or equal to 30% and lower than or equal to 80%. The visible light reflectivity of the reflective electrode is higher than or equal to 40% and lower than or equal to 100%, preferably higher than or equal to 70% and lower than or equal to 100%. These electrodes preferably have a resistivity of $1\times10^{-2}$ Ωcm or lower. Note that in the case where a light-emitting element that emits near-infrared light is used in the display device, the near-infrared light (light with a wavelength greater than or equal to 750 nm and less than or equal to 1300 nm) transmittance and reflectivity of these electrodes are preferably in the above numerical ranges.

The insulating layer 92 is provided so as to cover end portions of the pixel electrode 84R, end portions of the pixel electrode 84G, end portions of the pixel electrode 84B, end portions of the pixel electrode 84IR, and end portions of the pixel electrode 84PD. End portions of the insulating layer 92 are preferably tapered. The insulating layer 92 is not necessarily provided.

For example, the hole-injection layer 85R, the hole-injection layer 85G, the hole-injection layer 85B, the hole-injection layer 85IR, and the hole-transport layer 86PD each include a region in contact with the top surface of the pixel electrode 84 and a region in contact with a surface of the insulating layer 92. In addition, end portions of the hole-injection layer 85R, end portions of the hole-injection layer 85G, end portions of the hole-injection layer 85B, end portions of the hole-injection layer 85IR, and end portions of the hole-transport layer 86PD are positioned over the insulating layer 92.

As illustrated in FIG. 20A, a gap is provided between the light-emitting elements 61 that emit light of different colors, for example, between two light-emitting layers 87. In this manner, it is preferable that the light-emitting layer 87R, the light-emitting layer 87G, and the light-emitting layer 87B be provided such that they are not in contact with each other, for example. This favorably prevents unintentional light emission from being caused by a current flowing through adjacent two light-emitting layers 87. Thus, the contrast of the display device 10 can be increased, so that the display quality of the display device 10 can be improved.

A protective layer 91 is provided over the common electrode 81. The protective layer 91 has a function of preventing diffusion of impurities such as water into each light-emitting element from the above.

The protective layer 91 can have, for example, a single-layer structure or a stacked-layer structure at least including an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, or a hafnium oxide film. Alternatively, a semiconductor material such as an indium gallium oxide or an indium gallium zinc oxide may be used for the protective layer 91.

Note that in this specification and the like, oxynitride refers to a material that contains more oxygen than nitrogen in its composition, and nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

A stack of an inorganic insulating film and an organic insulating film can be used as the protective layer 91. For example, a structure where an organic insulating film is provided between a pair of inorganic insulating films is preferably employed. Furthermore, an organic insulating film preferably functions as a planarization film. This planarizes the top surface of the organic insulating film, resulting in improved coverage with an inorganic insulating film thereover and an enhanced barrier property. The top surface of the protective layer 91 is flat, which is preferable because the influence of an uneven shape due to a structure below the protective layer 91 can be reduced in the case where a structure (e.g., a color filter, an electrode of a touch sensor, or a lens array) is provided above the protective layer 91.

FIG. 20C illustrates a cross-sectional structure example of the display device 10 in the Y direction shown in FIG. 18B and the like, specifically, a cross-sectional structure example of the light-emitting element 61R and the light-receiving element 62. The light-emitting element 61G, the light-emitting element 61B, and the light-emitting element 61IR can be arranged in the Y direction like the light-emitting element 61R.

FIG. 20D illustrates a connection portion 93 where the connection electrode 82 and the common electrode 81 are electrically connected to each other. In the connection portion 93, the common electrode 81 is provided over and in contact with the connection electrode 82, and the protective layer 91 is provided so as to cover the common electrode 81. The insulating layer 92 is provided so as to cover end portions of the connection electrode 82.

Figure 20E:
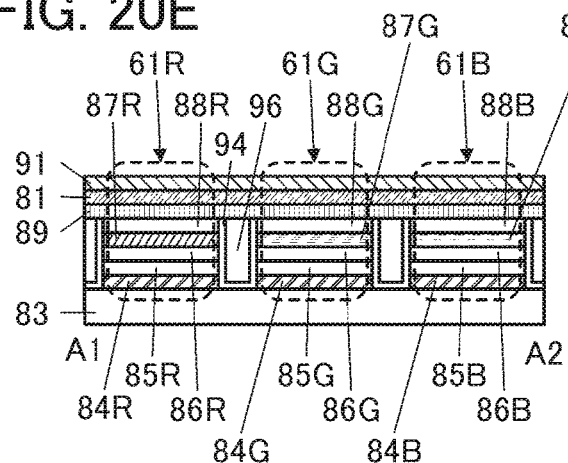

FIG. 20A to FIG. 20C illustrate a structure in which the insulating layer 92 is provided to cover the end portions of the pixel electrode 84R, the end portions of the pixel electrode 84G, the end portions of the pixel electrode 84B, and the end portions of the pixel electrode 84PD; however, one embodiment of the present invention is not limited to this structure. A structure without the insulating layer 92 as illustrated in FIG. 20E may be employed.

An insulating layer may be provided in the region between adjacent light-emitting elements 61 and the region between the light-emitting element 61 and the light-receiving element 62 which are adjacent to each other. FIG. 20E is a schematic cross-sectional view taken along the dashed-dotted line A1-A2 in FIG. 18B. In FIG. 20E, an insulating layer 94 and an insulating layer 96 are provided in such regions.

The insulating layers 94 and the insulating layers 96 cover the side surfaces of the pixel electrode 84R, the pixel electrode 84G, the pixel electrode 84B, the hole-injection layer 85R, the hole-injection layer 85G, the hole-injection layer 85B, the hole-transport layer 86R, the hole-transport layer 86G, the hole-transport layer 86B, the light-emitting layer 87R, the light-emitting layer 87G, the light-emitting layer 87B, the electron-transport layer 88R, the electron-transport layer 88G, and the electron-transport layer 88B.

The common layer 89 is provided over the electron-transport layer 88R, the electron-transport layer 88G, the electron-transport layer 88B, the insulating layers 94, and the insulating layers 96. The common electrode 81 is provided over the common layer 89.

The above structure can inhibit contact of the common layer 89 (or the common electrode 81) with the side surface of any of the pixel electrode 84R, the pixel electrode 84G, the pixel electrode 84B, the light-emitting layer 87R, the light-emitting layer 87G, and the light-emitting layer 87B and can inhibit a short circuit between the light-emitting elements.

The insulating layers 94 preferably cover at least the side surfaces of the pixel electrode 84R, the pixel electrode 84G, and the pixel electrode 84B. Moreover, the insulating layers 94 preferably cover the side surfaces of the hole-injection layer 85R, the hole-injection layer 85G, the hole-injection layer 85B, the hole-transport layer 86R, the hole-transport layer 86G, the hole-transport layer 86B, the light-emitting layer 87R, the light-emitting layer 87G, the light-emitting layer 87B, the electron-transport layer 88R, the electron-transport layer 88G, and the electron-transport layer 88B. The insulating layers 94 can be in contact with the side surfaces of the pixel electrode 84R, the pixel electrode 84G, the pixel electrode 84B, the hole-injection layer 85R, the hole-injection layer 85G, the hole-injection layer 85B, the hole-transport layer 86R, the hole-transport layer 86G, the hole-transport layer 86B, the light-emitting layer 87R, the light-emitting layer 87G, the light-emitting layer 87B, the electron-transport layer 88R, the electron-transport layer 88G, and the electron-transport layer 88B.

The insulating layers 96 are provided over the insulating layers 94 to fill depressed portions formed in the insulating layers 94. The insulating layers 96 can overlap with the side surfaces of the pixel electrode 84R, the pixel electrode 84G, the pixel electrode 84B, the hole-injection layer 85R, the hole-injection layer 85G, the hole-injection layer 85B, the hole-transport layer 86R, the hole-transport layer 86G, the hole-transport layer 86B, the light-emitting layer 87R, the light-emitting layer 87G, the light-emitting layer 87B, the electron-transport layer 88R, the electron-transport layer 88G, and the electron-transport layer 88B, with the insulating layers 94 provided between the insulating layers 96 and the side surfaces.

Note that one of the insulating layer 94 and the insulating layer 96 is not necessarily provided. In the case where the insulating layers 94 are not provided, the insulating layers 96 can be in contact with the side surfaces of the light-emitting layer 87R, the light-emitting layer 87G, and the light-emitting layer 87B. In addition, the display device may include an insulating layer covering an end portion of the pixel electrode. In this case, the insulating layers 94 and/or the insulating layers 96 may be provided over the insulating layer.

The common layer 89 and the common electrode 81 are provided over the electron-transport layer 88R, the electron-transport layer 88G, the electron-transport layer 88B, the insulating layers 94, and the insulating layers 96. Before the insulating layers 94 and the insulating layers 96 are provided, a step is generated due to a difference between a region where the pixel electrode and the light-emitting layer are provided and a region where neither the pixel electrode nor the light-emitting layer is provided (region between the light-emitting elements). In the display device of one embodiment of the present invention, the step can be planarized with the insulating layers 94 and the insulating layers 96, and the coverage with the common layer 89 and the common electrode 81 can be improved. Thus, connection defects caused by step disconnection can be inhibited. Alternatively, it is possible to inhibit an increase in electric resistance due to local thinning of the common electrode 81 by the step.

To improve the planarity of the formation surface of the common layer 89 and the common electrode 81, the top surfaces of the insulating layers 94 and the top surfaces of the insulating layers 96 are preferably level or substantially level with the top surface of at least one of the electron-transport layer 88R, the electron-transport layer 88G, and the electron-transport layer 88B. Although the top surface of the insulating layer 96 preferably has a flat surface, a projection or a depressed portion may be provided.

The insulating layers 94 have regions in contact with the side surfaces of the light-emitting layer 87R, the light-emitting layer 87G, and the light-emitting layer 87B and function as protective insulating layers for the light-emitting layer 87R, the light-emitting layer 87G, and the light-emitting layer 87B. Providing the insulating layers 94 can inhibit entry of impurities (e.g., oxygen and moisture) through the side surfaces of the light-emitting layer 87R, the light-emitting layer 87G, and the light-emitting layer 87B, whereby the display device can have high reliability.

When the insulating layers 94 have large widths (thicknesses) in the regions in contact with the side surfaces of the light-emitting layer 87R, the light-emitting layer 87G, and the light-emitting layer 87B in a cross-sectional view, the gaps between the light-emitting layer 87R, the light-emitting layer 87G, and the light-emitting layer 87B increase to cause a reduction in the aperture ratio in some cases. When the insulating layers 94 have small widths (thicknesses) in the regions in contact with the side surfaces of the light-emitting layer 87R, the light-emitting layer 87G, and the light-emitting layer 87B in a cross-sectional view, entry of impurities through the side surfaces of the light-emitting layer 87R, the light-emitting layer 87G, and the light-emitting layer 87B cannot be effectively inhibited in some cases. The width (thickness) of the insulating layer 94 in the region in contact with the side surfaces of the light-emitting layer 87R, the light-emitting layer 87G, and the light-emitting layer 87B in a cross-sectional view, is preferably greater than or equal to 3 nm and less than or equal to 200 nm, further preferably greater than or equal to 3 nm and less than or equal to 150 nm, further preferably greater than or equal to 5 nm and less than or equal to 150 nm, still further preferably greater than or equal to 5 nm and less than or equal to 100 nm, still further preferably greater than or equal to 10 nm and less than or equal to 100 nm, yet further preferably greater than or equal to 10 nm and less than or equal to 50 nm. When the width (thickness) of the insulating layer 94 is within the above-described range, a highly reliable display device with a high aperture ratio can be obtained.

The insulating layer 94 can be an insulating layer containing an inorganic material. As the insulating layer 94, an inorganic insulating film such as an oxide insulating film, a nitride insulating film, an oxynitride insulating film, or a nitride oxide insulating film can be used, for example. The inorganic insulating layer 94 can have either a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, aluminum oxide is preferable because it has high selectivity with respect to the EL layer in etching and has a function of protecting the EL layer in forming the insulating layer 96 which is to be described later. In particular, an inorganic insulating film such as an aluminum oxide film, a hafnium oxide film, a silicon oxide film, or the like formed by an ALD method is used as the insulating layer 94, whereby the insulating layer 94 can have few pinholes and an excellent function of protecting the EL layer.

The insulating layer 94 can be formed by a sputtering method, a CVD method, a PLD method, an ALD method, or the like. The insulating layer 94 is preferably formed by an ALD method achieving good coverage.

The insulating layer 96 provided over the insulating layer 94 has a function of filling the depressed portion of the insulating layer 94, which is formed between the adjacent light-emitting devices. In other words, the insulating layer 96 has an effect of improving the planarity of the formation surface of the common electrode 81. An insulating layer containing an organic material can be suitably used for the insulating layer 96. For the insulating layer 96, an acrylic resin, a polyimide resin, an epoxy resin, an imide resin, a polyamide resin, a polyimide-amide resin, a silicone resin, a siloxane resin, a benzocyclobutene-based resin, a phenol resin, a precursor of any of these resins, or the like can be used, for example. For the insulating layer 96, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin can be used. Alternatively, a photosensitive resin (also referred to as an organic resin) can be used as the insulating layer 96. A photoresist may be used for the photosensitive resin. As the photosensitive resin, a positive photosensitive material or a negative photosensitive material can be used.

The difference between the level of the top surface of the insulating layer 96 and the level of the top surface of any of the light-emitting layer 87R, the light-emitting layer 87G, and the light-emitting layer 87B is preferably less than or equal to 0.5 times the thickness of the insulating layer 96, further preferably less than or equal to 0.3 times the thickness of the insulating layer 96, for example. The insulating layer 96 may be provided such that the level of the top surface of any of the light-emitting layer 87R, the light-emitting layer 87G, and the light-emitting layer 87B is higher than the level of the top surface of the insulating layer 96, for example. Alternatively, for example, the insulating layer 96 may be provided such that the level of the top surface of the insulating layer 96 is higher than the level of the top surface of any of the light-emitting layer 87R, the light-emitting layer 87G, and the light-emitting layer 87B.

In the display device 10 illustrated in each of FIG. 18A, FIG. 18B, FIG. 19A, and FIG. 19B, the pixel 80 is formed of the subpixel including the light-emitting element 61R, the subpixel including the light-emitting element 61G, the subpixel including the light-emitting element 61B, the subpixel including the light-emitting element 61IR, and the subpixel including the light-receiving element 62; however, one embodiment of the present invention is not limited to this structure. A display device different from the display device 10 illustrated in FIG. 18A and the like is illustrated in FIG. 21A to FIG. 23B.

Figure 21A:
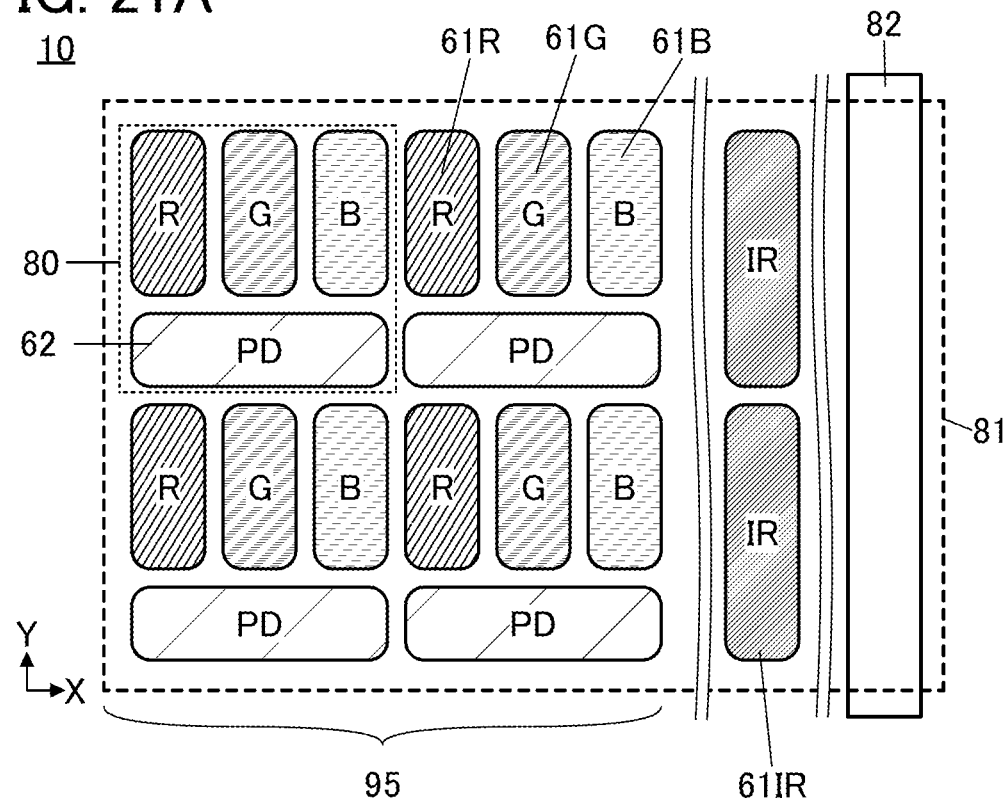
FIG. 21A and FIG. 21B are diagrams illustrating structure examples of a display device.
Figure 21B:
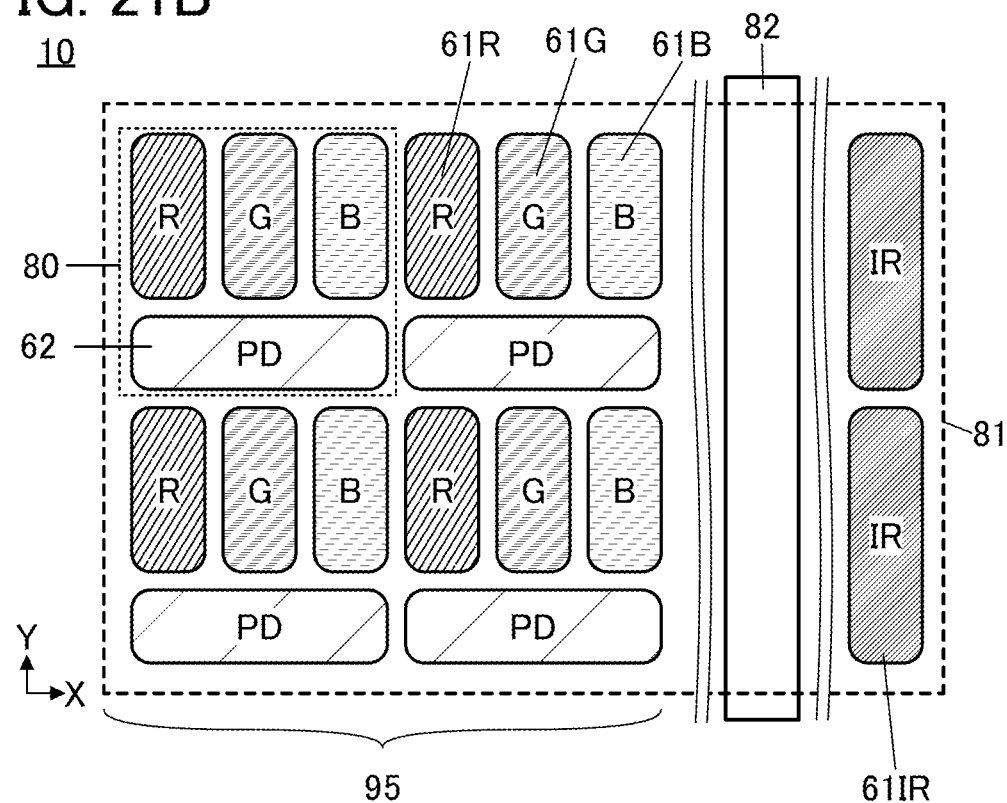

The display device 10 illustrated in FIG. 21A is different from the display device 10 illustrated in FIG. 18A in that the pixel 80 is formed of the subpixel including the light-emitting element 61R, the subpixel including the light-emitting element 61G, the subpixel including the light-emitting element 61B, and the subpixel including the light-receiving element 62. In this case, the light-emitting element 61IR is preferably provided between a display region 95 and the connection electrode 82. Alternatively, the light-emitting element 61IR may be provided along the outer periphery of the display region 95 and the connection electrode 82 as illustrated in FIG. 21B. The area occupied by the light-receiving element 62 in the display device 10 can be made larger, and the light detection sensitivity of the light-receiving element 62 can be increased.

In the display device 10 illustrated in FIG. 21A, the light-emitting element 61IR can be provided along the outer periphery of the display region 95. For example, the light-emitting element 61IR may be provided along one side of the outer periphery of the display region 95 or two or more sides of the outer periphery of the display region 95. That is, in the case where the display region 95 has a rectangular top surface, the arrangement of the light-emitting elements 61IR in a top view can have a belt-like shape, an L-like shape, a U-like shape (a square bracket shape), a quadrangular shape, or the like.

In the display device 10 illustrated in FIG. 21B, the light-emitting element 61IR can be provided along the outer periphery of the connection electrode 82. For example, the light-emitting element 61IR may be provided along one side of the outer periphery of the connection electrode 82 or two or more sides of the outer periphery of the connection electrode 82. That is, in the case where the connection electrode 82 has a rectangular top surface, the light-emitting elements 61IR in a top view can be arranged in a belt-like shape, an L-like shape, a U-like shape (a square bracket shape), a quadrangular shape, or the like.

Although FIG. 21A and FIG. 21B illustrate examples in which the width of the light-emitting element 61IR in the Y direction is substantially the same as the width of the pixel 80 in the Y direction, one embodiment of the present invention is not limited to these examples. The width of the light-emitting element 61IR in the Y direction may be larger or smaller than the width of the pixel 80 in the Y direction. Although FIG. 21A and FIG. 21B illustrate examples in which the number of the light-emitting elements 61IR is the same as that of the pixels 80 in the Y direction, one embodiment of the present invention is not limited to the examples. The number of the light-emitting elements 61IR in the Y direction may be different from that of the pixels 80 in the Y direction and may be one or more. Although FIG. 21A and FIG. 21B illustrate examples in which the number of the light-emitting elements 61IR in the X direction is one, one embodiment of the present invention is not limited to these examples. The number of the light-emitting elements 61IR in the X direction may be two or more.

Figure 22A:
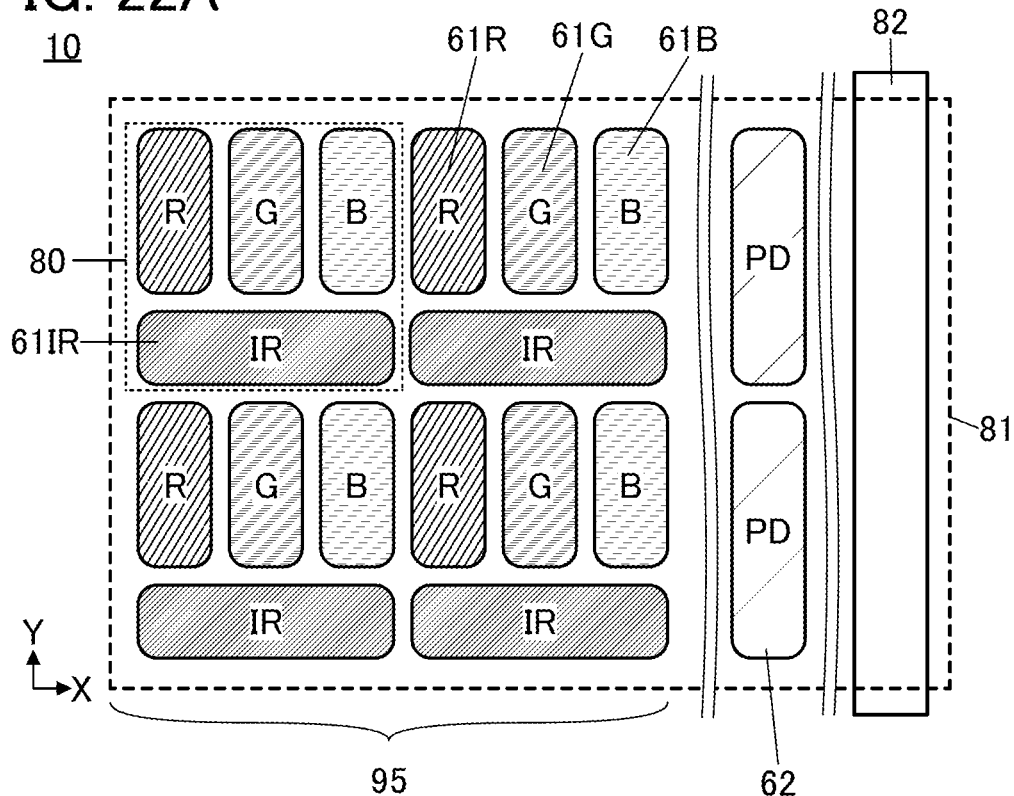
FIG. 22A and FIG. 22B are diagrams illustrating structure examples of a display device.
Figure 22B:
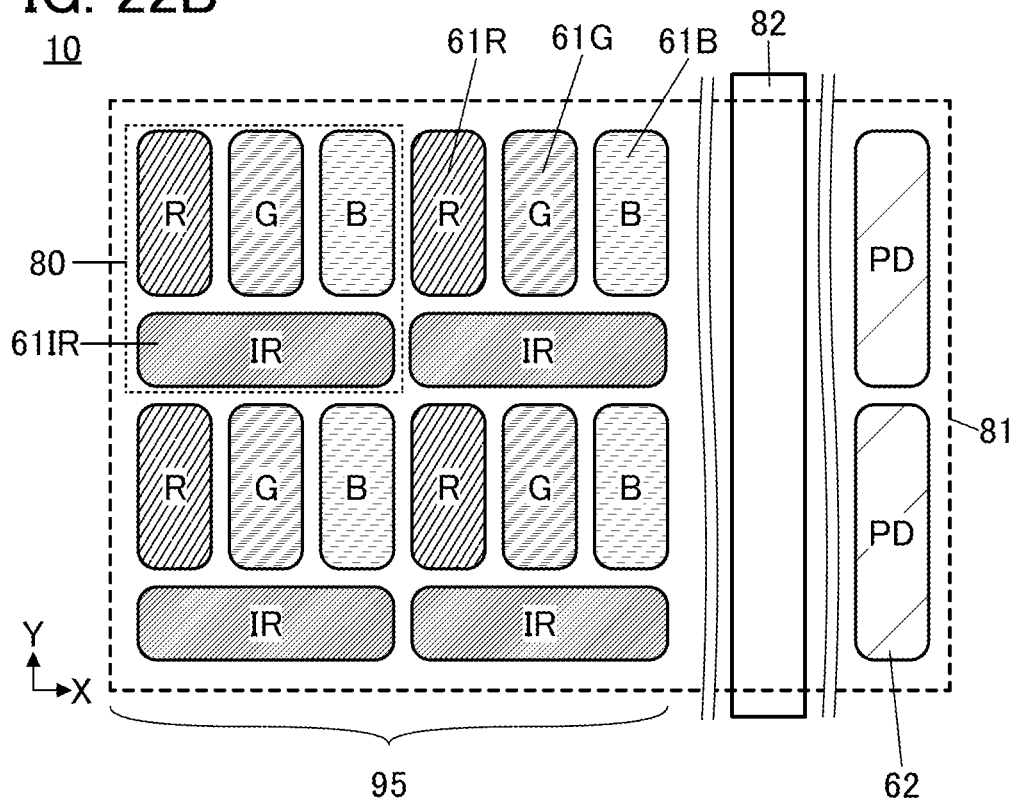

The display device 10 illustrated in FIG. 22A is different from the display device 10 illustrated in FIG. 18A in that the pixel 80 is formed of the subpixel including the light-emitting element 61R, the subpixel including the light-emitting element 61G, the subpixel including the light-emitting element 61B, and the subpixel including the light-receiving element 61IR. In this case, the light-receiving element 62 is preferably provided between the display region 95 and the connection electrode 82. Alternatively, the light-receiving element 62 may be provided along the outer periphery of the display region 95 and the connection electrode 82 as illustrated in FIG. 22B. The area occupied by the light-receiving element 62 in the display device 10 can be made larger, and the light detection sensitivity of the light-receiving element 62 can be increased.

In the display device 10 illustrated in FIG. 22A, the light-receiving element 62 can be provided along the outer periphery of the display region 95. For example, the light-receiving element 62 may be provided along one side of the outer periphery of the display region 95 or two or more sides of the outer periphery of the display region 95. That is, in the case where the display region 95 has a rectangular top surface, the arrangement of the light-emitting elements 62 in a top view can have a belt-like shape, an L-like shape, a U-like shape (a square bracket shape), a quadrangular shape, or the like.

In the display device 10 illustrated in FIG. 22B, the light-receiving element 62 can be provided along the outer periphery of the connection electrode 82. For example, the light-receiving element 62 may be provided along one side of the outer periphery of the connection electrode 82 or two or more sides of the outer periphery of the connection electrode 82. That is, in the case where the connection electrode 82 has a rectangular top surface, the light-receiving elements 62 in a top view can be arranged in a belt-like shape, an L-like shape, a U-like shape (a square bracket shape), a quadrangular shape, or the like.

Although FIG. 22A and FIG. 22B illustrate examples in which the width of the light-receiving element 62 in the Y direction is substantially the same as the width of the pixel 80 in the Y direction, one embodiment of the present invention is not limited to these examples. The width of the light-receiving element 62 in the Y direction may be larger or smaller than the width of the pixel 80 in the Y direction. Although FIG. 22A and FIG. 22B illustrate examples in which the number of the light-receiving elements 62 is the same as that of the pixels 80 in the Y direction, one embodiment of the present invention is not limited to the examples. The number of the light-receiving elements 62 in the Y direction may be different from that of the pixels 80 in the Y direction and may be one or more. Although FIG. 22A and FIG. 22B illustrate examples in which the number of the light-receiving elements 62 in the X direction is one, one embodiment of the present invention is not limited to these examples. The number of the light-receiving elements 62 in the X direction may be two or more.

Figure 23A:
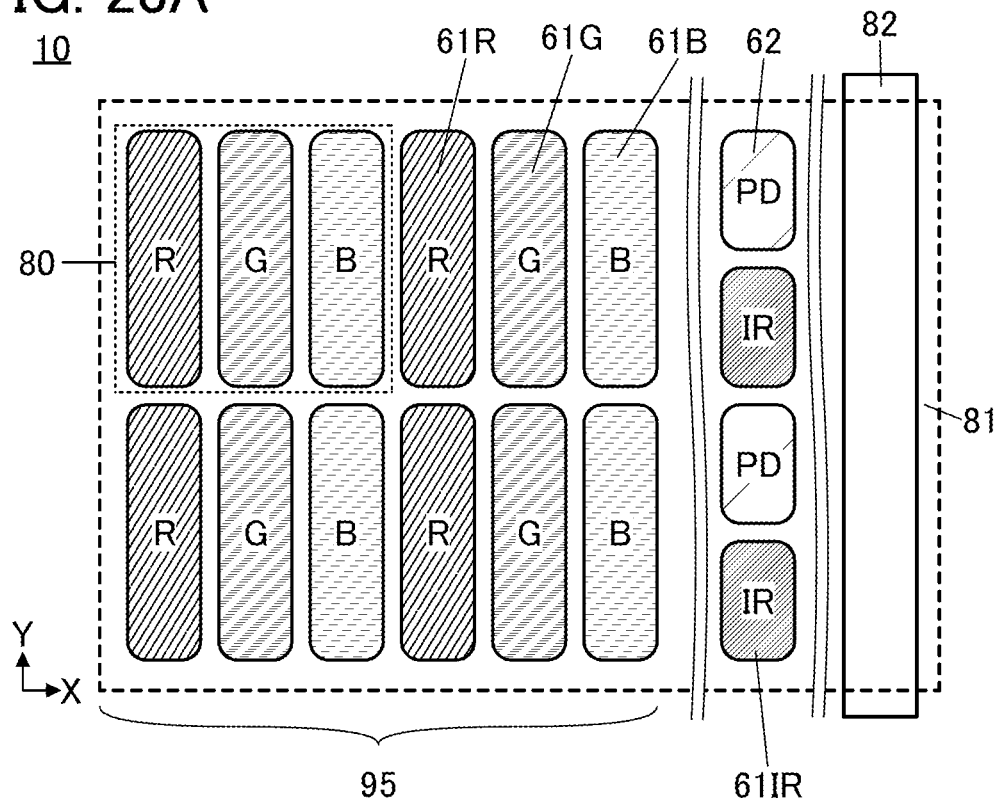
FIG. 23A and FIG. 23B are diagrams illustrating structure examples of a display device.
Figure 23B:
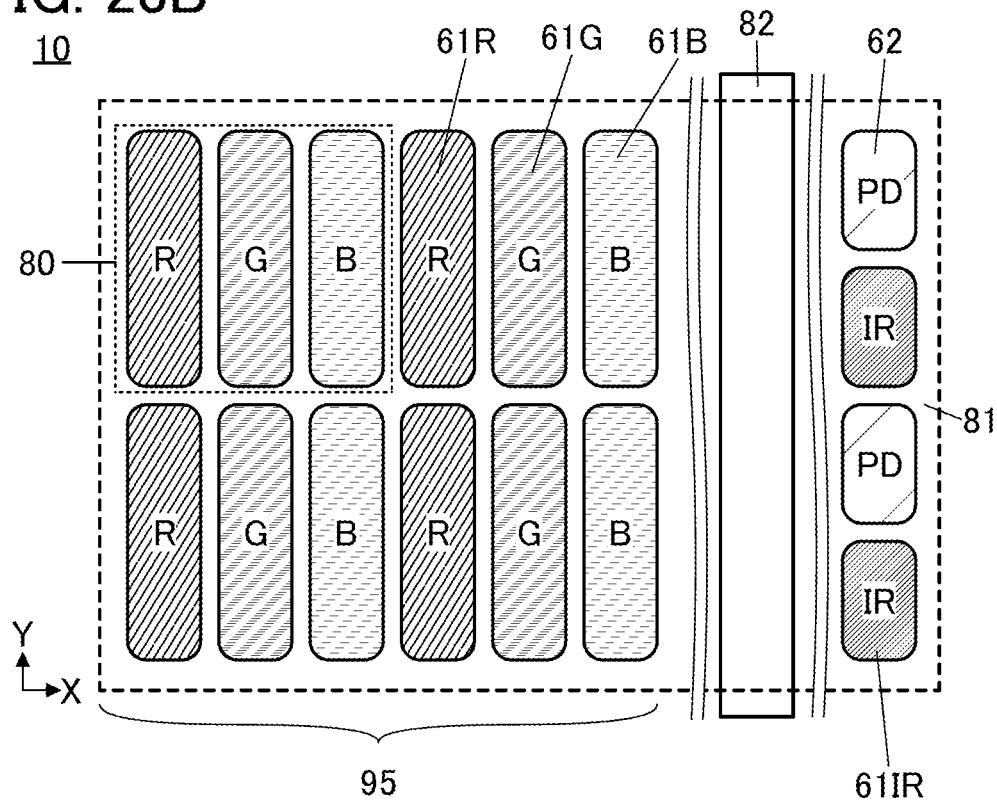

The display device 10 illustrated in FIG. 23A is different from the display device 10 illustrated in FIG. 18A in that the pixel 80 is formed of the subpixel including the light-emitting element 61R, the subpixel including the light-emitting element 61G, and the subpixel including the light-emitting element 61B. In this case, the light-emitting element 61IR and the light-receiving element 62 are preferably provided between the display region 95 and the connection electrode 82. Alternatively, the light-emitting element 61IR and the light-receiving element 62 may be provided along the outer periphery of the display region 95 and the connection electrode 82 as illustrated in FIG. 23B. Thus, the light-emitting element 61R, the light-emitting element 61G, and the light-emitting element 61B can have larger lengths in the Y direction, so that the luminance of light emitted from the pixel 80 can be increased.

In the display device 10 illustrated in FIG. 23A, the light-emitting element 61IR and the light-receiving element 62 can be provided along the outer periphery of the display region 95. For example, the light-emitting element 61IR and the light-receiving element 62 may be provided along one side of the outer periphery of the display region 95 or two or more sides of the outer periphery of the display region 95. That is, in the case where the display region 95 has a rectangular top surface, the light-emitting elements 61IR in a top view and the light-receiving elements 62 in a top view can each be arranged in a belt-like shape, an L-like shape, a U-like shape (a square bracket shape), a quadrangular shape, or the like. The arrangement of the light-emitting elements 61IR may be different from the arrangement of the light-receiving elements 62. For example, the light-emitting elements 61IR in a top view may be placed along two sides of the display region 95 that face each other and the light-receiving elements 62 in a top view may be placed along the other two sides.

In the display device 10 illustrated in FIG. 23B, the light-emitting element 61IR and the light-receiving element 62 can be provided along the outer periphery of the connection electrode 82. For example, the light-emitting element 61IR and the light-receiving element 62 may be provided along one side of the outer periphery of the connection electrode 82 or two or more sides of the outer periphery of the connection electrode 82. That is, in the case where the connection electrode 82 has a rectangular top surface, the light-emitting elements 61IR in a top view and the light-receiving elements 62 in a top view can each be arranged in a belt-like shape, an L-like shape, a U-like shape (a square bracket shape), a quadrangular shape, or the like. The arrangement of the light-emitting elements 61IR may be different from the arrangement of the light-receiving elements 62. For example, the light-emitting elements 61IR in a top view may be placed along two sides of the connection electrode 82 that face each other and the light-receiving elements 62 in a top view may be placed along the other two sides.

Although FIG. 23A and FIG. 23B illustrate examples in which the sum of the width of the light-emitting element 61IR in the Y direction and the width of the light-receiving element 62 in the Y direction is substantially the same as the width of the pixel 80 in the Y direction, one embodiment of the present invention is not limited to these examples. The width of each of the light-emitting element 61IR and the light-receiving element 62 in the Y direction may be larger or smaller than the width of the pixel 80 in the Y direction. Although FIG. 23A and FIG. 23B illustrate examples in which the number of the light-emitting elements 61IR, that of the light-receiving elements 62, and that of the pixels 80 are the same in the Y direction, one embodiment of the present invention is not limited to the examples. The number of the light-emitting elements 61IR and that of the light-receiving elements 62 in the Y direction may be different from that of the pixels 80 in the Y direction and may be one or more. In addition, the number of the light-emitting elements 61IR and that of the light-receiving elements 62 in the Y direction may be different from each other. Although FIG. 23A and FIG. 23B illustrate examples in which the number of the light-emitting elements 61IR in the X direction is one and the number of the light-receiving elements 62 in the X direction is one, one embodiment of the present invention is not limited to these examples. The number of the light-emitting elements 61IR and the number of the light-receiving elements 62 in the X direction may each be two or more.

In FIG. 23A, the light-emitting element 61IR and the light-receiving element 62 are provided between the display region 95 and the connection electrode 82, and in FIG. 23B, the light-emitting element 61IR and the light-receiving element 62 are provided along the outer periphery of the display region 95 and the connection electrode 82; however, one embodiment of the present invention is not limited thereto. For example, the light-emitting element 61IR may be provided between the display region 95 and the connection electrode 82, and the light-receiving element 62 may be provided along the outer periphery of the display region 95 and the connection electrode 82. Alternatively, the light-receiving element 62 may be provided between the display region 95 and the connection electrode 82, and the light-emitting element 61IR may be provided along the outer periphery of the display region 95 and the connection electrode 82. The area occupied by the light-receiving element 62 in the display device 10 can be made larger, and the light detection sensitivity of the light-receiving element 62 can be increased.

Here, the display device 10 illustrated in each of FIG. 21A and FIG. 21B corresponds to the display device 100 illustrated in FIG. 3A. Furthermore, the display device 10 illustrated in each of FIG. 22A and FIG. 22B corresponds to the display device 100 illustrated in FIG. 6B. In addition, the display device 10 illustrated in each of FIG. 23A and FIG. 23B corresponds to the display device 100 illustrated in FIG. 6A.

Next, structure examples of a display device included in an electronic device with an eye tracking function utilizing visible light are described with reference to FIG. 24A to FIG. 25B.

Figure 24A:
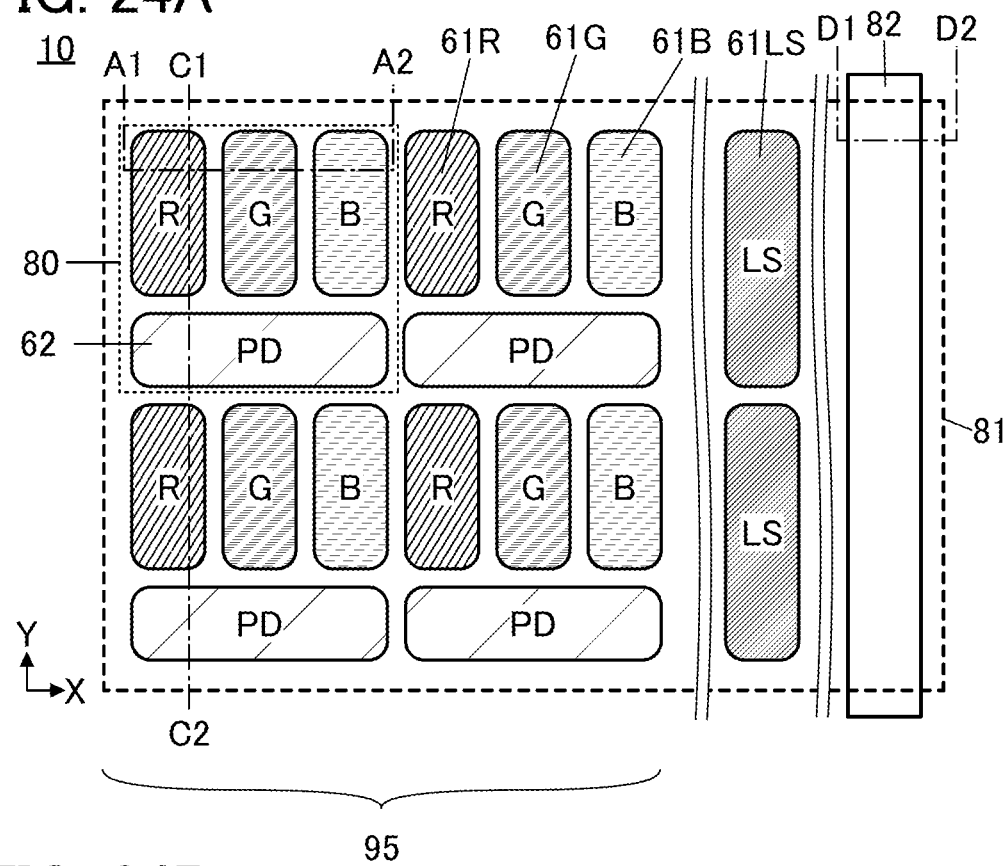
FIG. 24A and FIG. 24B are diagrams illustrating structure examples of a display device.

The display device 10 illustrated in FIG. 24A includes the light-emitting elements 61R that emit red light, the light-emitting elements 61G that emit green light, the light-emitting elements 61B that emit blue light, the light-emitting elements 61LS that emit visible light, and the light-receiving elements 62.

In FIG. 24A, light-emitting regions of the light-emitting elements 61 are denoted by R, G, B, and LS to easily differentiate the light-emitting elements 61. In addition, light-receiving regions of the light-emitting elements 62 are denoted by PD.

The display device 10 illustrated in FIG. 24A corresponds to the display device 100 in Embodiment 1. The light-emitting element 61R, the light-emitting element 61G, the light-emitting element 61B, and the light-emitting element 61LS respectively correspond to the light-emitting element 110R, the light-emitting element 110G, the light-emitting element 110B, and the light-emitting element 110LS in Embodiment 1. Furthermore, the light-receiving element 62 corresponds to the light-receiving element in the sensor portion 104 in Embodiment 1.

The display device 10 illustrated in FIG. 24A is different from the display device 10 illustrated in FIG. 21A in including the light-emitting element 61LS instead of the light-emitting element 61IR. Note that the other components are similar to those of the display device 10 illustrated in FIG. 21A and thus, for their details, the above description relating to FIG. 21A or the like can be referred to.

The light-emitting elements 61R, the light-emitting elements 61G, the light-emitting elements 61B, and the light-receiving elements 62 are arranged in a matrix. FIG. 24A illustrates an example where the light-emitting elements 61R, the light-emitting elements 61G, and the light-emitting elements 61B are arranged in the X direction and the light-receiving elements 62 are arranged thereunder. FIG. 24A illustrates a structure example where the light-emitting elements 61 that emit light of the same color are arranged in the Y direction intersecting the X direction. In the display device 10 in FIG. 24A, the pixel 80 can be composed of the subpixel including the light-emitting element 61R, the subpixel including the light-emitting element 61G, and the subpixel including the light-emitting element 61B, which are arranged in the X direction, and a subpixel including the light-receiving element 62 provided under the subpixels, for example. The light-receiving element 62 illustrated in FIG. 24A has a function of detecting visible light.

In the display device 10 illustrated in FIG. 24A, the light-emitting element 61LS is provided between the display region 95 and the connection electrode 82.

In the display device 10 illustrated in FIG. 24A, the light-emitting element 61LS can be provided along the outer periphery of the display region 95. For example, the light-emitting element 61LS may be provided along one side of the outer periphery of the display region 95 or two or more sides of the outer periphery of the display region 95. That is, in the case where the display region 95 has a rectangular top surface, the arrangement of the light-emitting elements 61LS in a top view can have a belt-like shape, an L-like shape, a U-like shape (a square bracket shape), a quadrangular shape, or the like.

Although FIG. 24A illustrates an example in which the width of the light-emitting element 61LS in the Y direction is substantially the same as the width of the pixel 80 in the Y direction, one embodiment of the present invention is not limited thereto. The width of the light-emitting element 61LS in the Y direction may be larger or smaller than the width of the pixel 80 in the Y direction. Although FIG. 24A illustrates an example in which the number of the light-emitting elements 61LS is the same as that of the pixels 80 in the Y direction, one embodiment of the present invention is not limited thereto. The number of the light-emitting elements 61LS in the Y direction may be different from that of the pixels 80 in the Y direction and may be one or more. Although FIG. 24A illustrates an example in which the number of the light-emitting elements 61LS in the X direction is one, one embodiment of the present invention is not limited thereto. The number of the light-emitting elements 61LS in the X direction may be two or more.

In the display device 10 illustrated in FIG. 24A, the light-emitting element 61LS is provided between the display region 95 and the connection electrode 82, but one embodiment of the present invention is not limited thereto. The display device 10 illustrated in FIG. 24B is different from the display device 10 illustrated in FIG. 24A in that the light-emitting element 61LS is provided along the outer periphery of the display region 95 and the connection electrode 82.

Figure 24B:
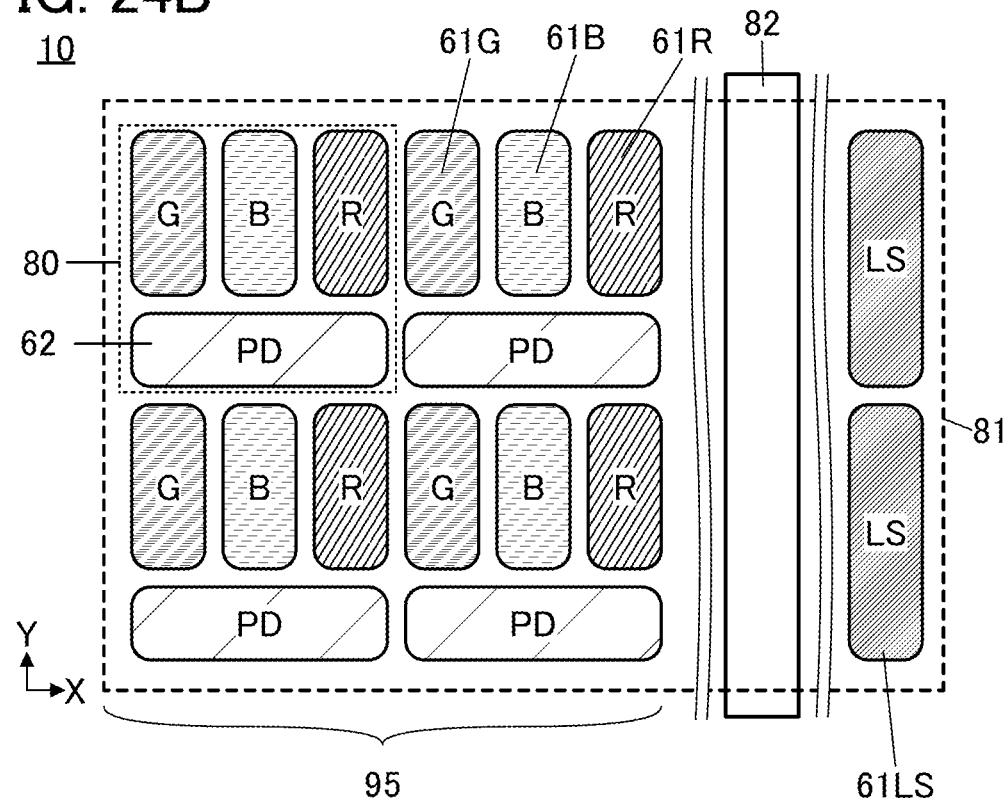

In the display device 10 illustrated in FIG. 24B, the light-emitting element 61LS can be provided along the outer periphery of the connection electrode 82. For example, the light-emitting element 61LS may be provided along one side of the outer periphery of the connection electrode 82 or two or more sides of the outer periphery of the connection electrode 82. That is, in the case where the connection electrode 82 has a rectangular top surface, the light-emitting elements 61LS in a top view can be arranged in a belt-like shape, an L-like shape, a U-like shape (a square bracket shape), a quadrangular shape, or the like.

Here, the display device 10 illustrated in each of FIG. 24A and FIG. 24B corresponds to the display device 100 illustrated in FIG. 9B.

A cross-sectional view taken along the dashed-dotted line A1-A2 in FIG. 24A is similar to the cross-sectional view illustrated in FIG. 20A. Furthermore, a cross-sectional view taken along the dashed-dotted line C1-C2 in FIG. 24A is similar to the cross-sectional view illustrated in FIG. 20C. In addition, a cross-sectional view taken along the dashed-dotted line D1-D2 in FIG. 24A is similar to the cross-sectional view illustrated in FIG. 20D. Note that the light-emitting element 61LS has a structure similar to the light-emitting element 61R, the light-emitting element 61G, or the light-emitting element 61B, and thus the description of the light-emitting element 61R, the light-emitting element 61G, or the light-emitting element 61B can be referred to for the structure of the light-emitting element 61LS.

The light-receiving layer 90 of the light-receiving element 62 illustrated in FIG. 24A includes an organic compound having detection sensitivity in a wavelength range of visible light, for example.

In the display device 10 illustrated in each of FIG. 24A and FIG. 24B, the pixel 80 is formed of the subpixel including the light-emitting element 61R, the subpixel including the light-emitting element 61G, the subpixel including the light-emitting element 61B, and the subpixel including the light-receiving element 62; however, one embodiment of the present invention is not limited to this structure. A display device different from the display device 10 illustrated in each FIG. 24A and FIG. 24B is illustrated in FIG. 25A and FIG. 25B.

Figure 25A:
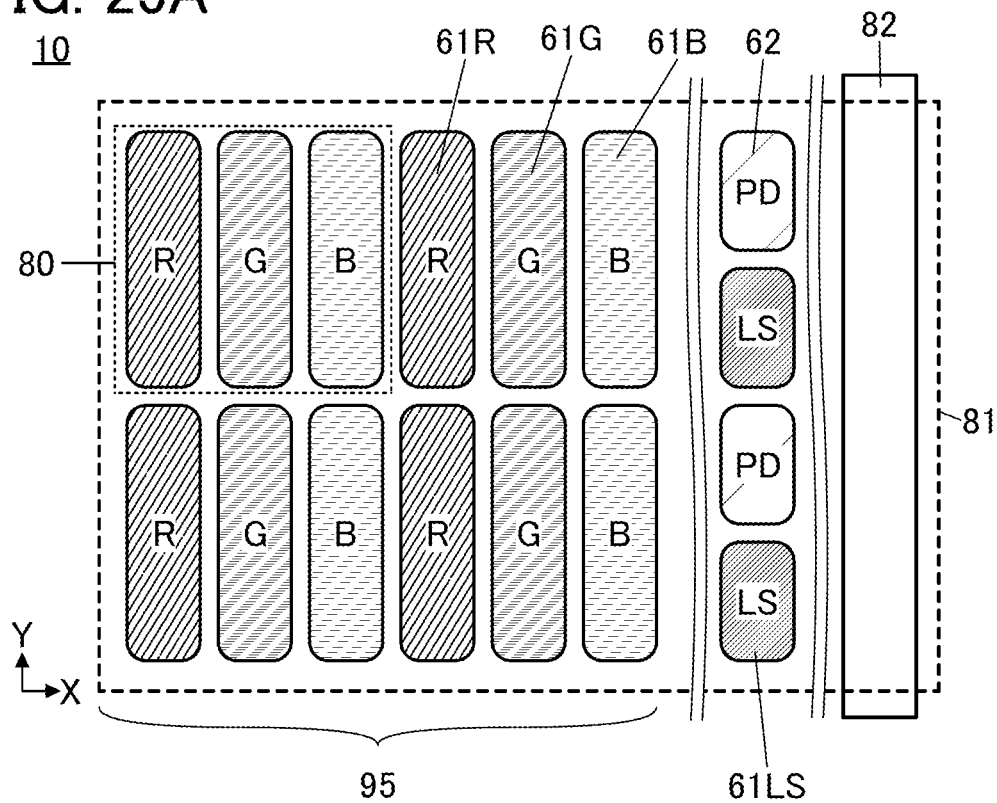
FIG. 25A and FIG. 25B are diagrams illustrating structure examples of a display device.

The display device 10 illustrated in FIG. 25A is different from the display device 10 illustrated in FIG. 24A in that the pixel 80 is formed of the subpixel including the light-emitting element 61R, the subpixel including the light-emitting element 61G, and the subpixel including the light-emitting element 61B. In this case, the light-emitting element 61LS and the light-receiving element 62 are preferably provided between the display region 95 and the connection electrode 82. Alternatively, the light-emitting element 61LS and the light-receiving element 62 may be provided along the outer periphery of the display region 95 and the connection electrode 82 as illustrated in FIG. 25B. Thus, the light-emitting element 61R, the light-emitting element 61G, and the light-emitting element 61B can have larger lengths in the Y direction, so that the luminance of light emitted from the pixel 80 can be increased.

In the display device 10 illustrated in FIG. 25A, the light-emitting element 61LS and the light-receiving element 62 can be provided along the outer periphery of the display region 95. For example, the light-emitting element 61LS and the light-receiving element 62 may be provided along one side of the outer periphery of the display region 95 or two or more sides of the outer periphery of the display region 95. That is, in the case where the display region 95 has a rectangular top surface, the light-emitting elements 61LS in a top view and the light-receiving elements 62 in a top view can each be arranged in a belt-like shape, an L-like shape, a U-like shape (a square bracket shape), a quadrangular shape, or the like. The arrangement of the light-emitting elements 61LS may be different from the arrangement of the light-receiving elements 62. For example, the light-emitting elements 61LS in a top view may be placed along two sides of the display region 95 that face each other and the light-receiving elements 62 in a top view may be placed along the other two sides.

Figure 25B:
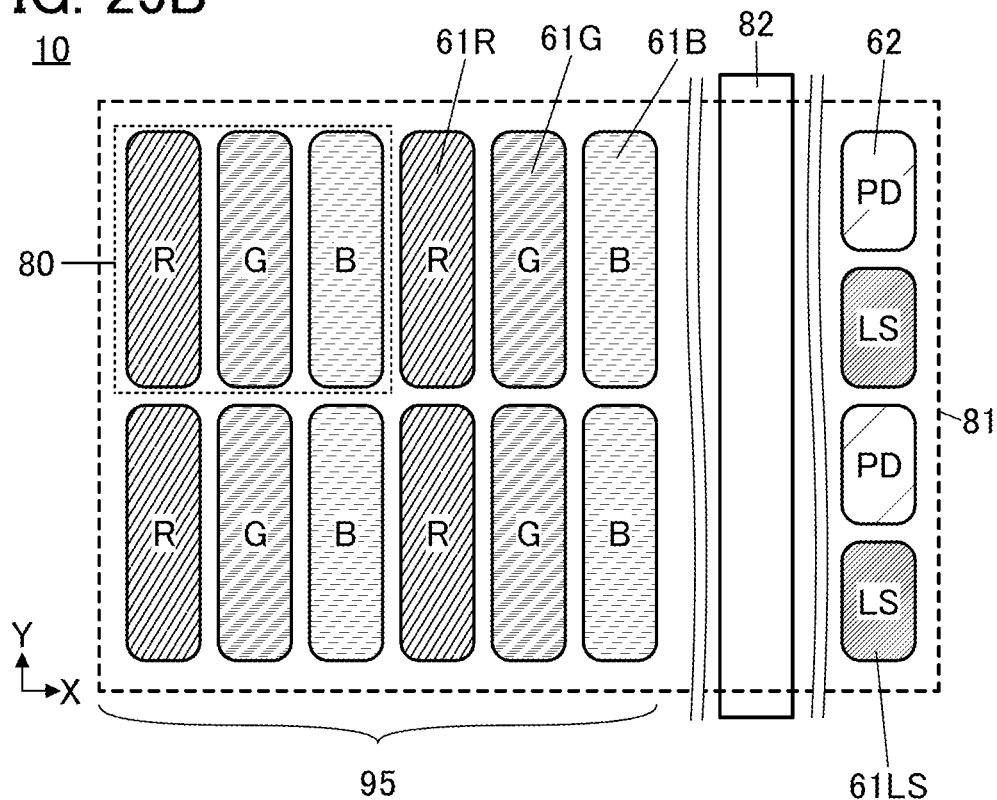

In the display device 10 illustrated in FIG. 25B, the light-emitting element 61LS and the light-receiving element 62 can be provided along the outer periphery of the connection electrode 82. For example, the light-emitting element 61LS may be provided along one side of the outer periphery of the connection electrode 82 or two or more sides of the outer periphery of the connection electrode 82. That is, in the case where the connection electrode 82 has a rectangular top surface, the light-emitting elements 61LS in a top view and the light-receiving elements 62 in a top view can each be arranged in a belt-like shape, an L-like shape, a U-like shape (a square bracket shape), a quadrangular shape, or the like. The arrangement of the light-emitting elements 61LS may be different from the arrangement of the light-receiving elements 62. For example, the light-emitting elements 61LS in a top view may be placed along two sides of the connection electrode 82 that face each other and the light-receiving elements 62 in a top view may be placed along the other two sides.

Although FIG. 25A and FIG. 25B illustrate examples in which the sum of the width of the light-emitting element 61LS in the Y direction and the width of the light-receiving element 62 in the Y direction is substantially the same as the width of the pixel 80 in the Y direction, one embodiment of the present invention is not limited to these examples. The width of each of the light-emitting element 61LS and the light-receiving element 62 in the Y direction may be larger or smaller than the width of the pixel 80 in the Y direction. Although FIG. 25A and FIG. 25B illustrate examples in which the number of the light-emitting elements 61LS, that of the light-receiving elements 62, and that of the pixels 80 are the same in the Y direction, one embodiment of the present invention is not limited to the examples. The number of the light-emitting elements 61LS and that of the light-receiving elements 62 in the Y direction may be different from that of the pixels 80 in the Y direction and may be one or more. In addition, the number of the light-emitting elements 61LS and that of the light-receiving elements 62 in the Y direction may be different from each other. Although FIG. 25A and FIG. 25B illustrate examples in which the number of the light-emitting elements 61LS in the X direction is one and the number of the light-receiving elements 62 in the X direction is one, one embodiment of the present invention is not limited to these examples. The number of the light-emitting elements 61LS and the number of the light-receiving elements 62 in the X direction may each be two or more.

In FIG. 25A, the light-emitting element 61LS and the light-receiving element 62 are provided between the display region 95 and the connection electrode 82, and in FIG. 25B, the light-emitting element 61LS and the light-receiving element 62 are provided along the outer periphery of the display region 95 and the connection electrode 82; however, one embodiment of the present invention is not limited thereto. For example, the light-emitting element 61LS may be provided between the display region 95 and the connection electrode 82, and the light-receiving element 62 may be provided along the outer periphery of the display region 95 and the connection electrode 82. Alternatively, the light-receiving element 62 may be provided between the display region 95 and the connection electrode 82, and the light-emitting element 61LS may be provided along the outer periphery of the display region 95 and the connection electrode 82. The area occupied by the light-receiving element 62 in the display device 10 can be made larger, and the light detection sensitivity of the light-receiving element 62 can be increased.

Here, the display device 10 illustrated in each of FIG. 25A and FIG. 25B corresponds to the display device 100 illustrated in FIG. 11B.

Structure Example of Light-Emitting Element

Figure 26A:
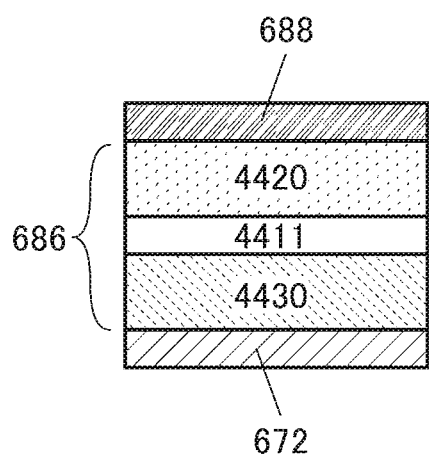
FIG. 26A to FIG. 26D are diagrams illustrating structure examples of a light-emitting element.

As illustrated in FIG. 26A, a light-emitting element includes an EL layer 686 between a pair of electrodes (an electrode 672 and an electrode 688). The EL layer 686 can be formed of a plurality of layers such as a layer 4420, a light-emitting layer 4411, and a layer 4430. The layer 4420 can include, for example, a layer containing a substance with a high electron-injection property (electron-injection layer) and a layer containing a substance with a high electron-transport property (electron-transport layer). The light-emitting layer 4411 contains a light-emitting compound, for example. The layer 4430 can include, for example, a layer containing a substance with a high hole-injection property (hole-injection layer) and a layer containing a substance with a high hole-transport property (hole-transport layer).

The structure including the layer 4420, the light-emitting layer 4411, and the layer 4430, which is provided between a pair of electrodes, can function as a single light-emitting unit, and the structure in FIG. 26A is referred to as a single structure in this specification.

Figure 26B:
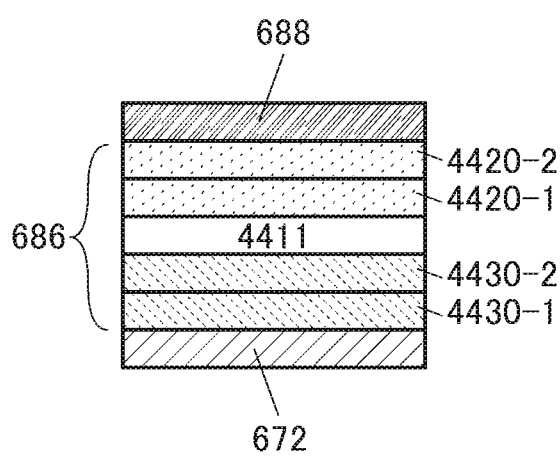

FIG. 26B is a modification example of the EL layer 686 included in the light-emitting element illustrated in FIG. 26A. Specifically, a light-emitting element illustrated in FIG. 26B includes a layer 4430-1 over the electrode 672, a layer 4430-2 over the layer 4430-1, the light-emitting layer 4411 over the layer 4430-2, a layer 4420-1 over the light-emitting layer 4411, a layer 4420-2 over the layer 4420-1, and the electrode 688 over the layer 4420-2. For example, in the case where the electrode 672 is an anode and the electrode 688 is a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, in the case where the electrode 672 is as a cathode and the electrode 688 is an anode, the layer 4430-1 functions as an electron-injection layer, the layer 4430-2 functions as an electron-transport layer, the layer 4420-1 functions as a hole-transport layer, and the layer 4420-2 functions as a hole-injection layer. With such a layer structure, carriers can be efficiently injected to the light-emitting layer 4411, and the efficiency of the recombination of carriers in the light-emitting layer 4411 can be enhanced.

Figure 26C:
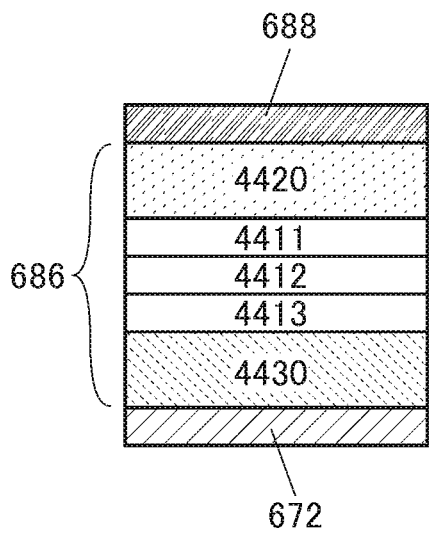

Note that the structure in which a plurality of light-emitting layers (the light-emitting layer 4411, a light-emitting layer 4412, and a light-emitting layer 4413) are provided between the layer 4420 and the layer 4430 as illustrated in FIG. 26C is a variation of the single structure.

Figure 26D:
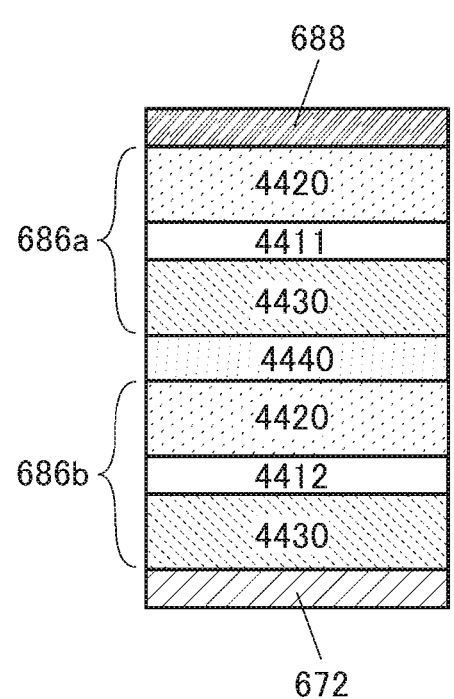

The structure in which a plurality of light-emitting units (an EL layer 686a and an EL layer 686b) are connected in series with an intermediate layer (charge-generation layer) 4440 therebetween as illustrated in FIG. 26D is referred to as a tandem structure in this specification. The structure illustrated in FIG. 26D is referred to as a tandem structure in this specification and the like; however, the name of the structure is not limited thereto. A tandem structure may be referred to as a stack structure, for example. The tandem structure enables a light-emitting element capable of high luminance light emission.

In FIG. 26C and FIG. 26D, the layer 4420 and the layer 4430 may each have a stacked-layer structure of two or more layers as illustrated in FIG. 26B.

The emission colors of the light-emitting elements can be changed to red, green, blue, cyan, magenta, yellow, white, or the like depending on a material of the EL layer 686. When the light-emitting elements have a microcavity structure, the color purity can be further increased.

In a light-emitting element that emits white light, a light-emitting layer preferably contains two or more kinds of light-emitting substances. To obtain white light emission, the two or more kinds of light-emitting substances are selected so as to emit light of complementary colors. For example, when the emission color of a first light-emitting layer and the emission color of a second light-emitting layer are complementary colors, so that a light-emitting element can emit white light as a whole. This can be applied to a light-emitting element including three or more light-emitting layers.

A light-emitting layer preferably contains two or more of light-emitting substances that emit light of R (red), G (green), B (blue), Y (yellow), O (orange), and the like. Alternatively, a light-emitting layer preferably contains two or more light-emitting substances each of which emits light containing two or more of spectral components of R, G, and B.

Structure Example of Light-Emitting Element and Light-Receiving Element

The display device of one embodiment of the present invention is a top-emission display device where light is emitted in the direction opposite to a substrate over which light-emitting elements are formed. In this embodiment, a top-emission display device provided with light-emitting elements and a light-receiving element will be described as an example.

In this specification and the like, unless otherwise specified, in describing a structure including a plurality of elements (e.g., light-emitting elements and light-emitting layers), alphabets are not added when a common part of the elements is described. For example, when a common part of a light-emitting layer 383R, a light-emitting layer 383G, and the like is described, the term "light-emitting layer 383" is used in some cases.

Figure 27:
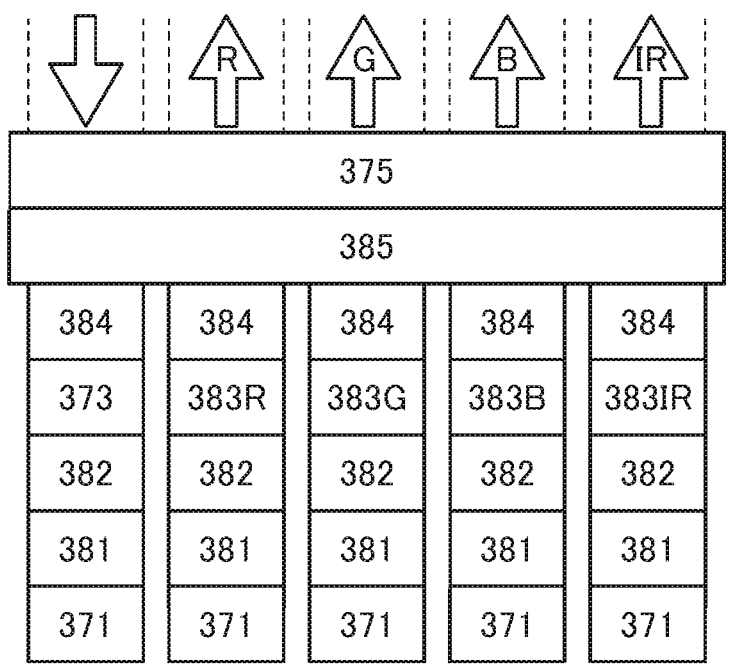
FIG. 27 is a diagram illustrating a structure example of a display device.

A display device 380A illustrated in FIG. 27 includes a light-receiving element 370PD, a light-emitting element 370R which emits red (R) light, a light-emitting element 370G which emits green (G) light, a light-emitting element 370B which emits blue (B) light, and a light-emitting element 370IR which emits infrared light (IR).

Each of the light-emitting elements includes a pixel electrode 371, a hole-injection layer 381, a hole-transport layer 382, a light-emitting layer, an electron-transport layer 384, an electron-injection layer 385, and a common electrode 375 which are stacked in this order. The light-emitting element 370R includes the light-emitting layer 383R, the light-emitting element 370G includes the light-emitting layer 383G, the light-emitting element 370B includes a light-emitting layer 383B, and the light-emitting element 370IR includes a light-emitting layer 383IR. The light-emitting layer 383R includes a light-emitting substance which emits red light, the light-emitting layer 383G includes a light-emitting substance which emits green light, the light-emitting layer 383B includes a light-emitting substance which emits blue light, and the light-emitting layer 383IR includes a light-emitting substance which emits infrared light.

The light-emitting elements are electroluminescent elements which emit light to the common electrode 375 side on voltage application between the pixel electrode 371 and the common electrode 375.

The light-receiving element 370PD includes the pixel electrode 371, the hole-injection layer 381, the hole-transport layer 382, an active layer 373, the electron-transport layer 384, the electron-injection layer 385, and the common electrode 375 which are stacked in this order.

The light-receiving element 370PD is a photoelectric conversion element that receives light incident from the outside of the display device 380A and converts the light into an electric signal.

This embodiment is described assuming that the pixel electrode 371 functions as an anode and the common electrode 375 functions as a cathode in the light-emitting elements and the light-receiving element. In other words, the light-receiving element is driven by application of reverse bias between the pixel electrode 371 and the common electrode 375, whereby light incident on the light-receiving element can be detected and electric charge can be generated and extracted as a current.

In the display device of this embodiment, an organic compound is used for the active layer 373 of the light-receiving element 370PD. The light-receiving element 370PD can share the layers other than the active layer 373 with the light-emitting elements. Therefore, the light-receiving element 370PD can be formed concurrently with the formation of the light-emitting elements only by adding a step of forming the active layer 373 in the manufacturing process of the light-emitting elements. The light-emitting elements and the light-receiving element 370PD can be formed over one substrate. Accordingly, the light-receiving element 370PD can be incorporated into the display device without a significant increase in the number of manufacturing steps.

In the display device 380A, for example, the light-receiving element 370PD and the light-emitting elements have a common structure except that the active layer 373 of the light-receiving element 370PD and the light-emitting layers 383 of the light-emitting elements are separately formed. The structures of the light-receiving element 370PD and the light-emitting elements are not limited thereto. The light-receiving element 370PD and the light-emitting elements may have separately formed layers in addition to the active layer 373 and the light-emitting layer 383. The light-receiving element 370PD and the light-emitting elements preferably include at least one layer used in common (common layer). Thus, the light-receiving element 370PD can be incorporated into the display device without a significant increase in the number of manufacturing steps.

A conductive film that transmits visible light is used as the electrode through which light is extracted, which is either the pixel electrode 371 or the common electrode 375. A conductive film that reflects visible light is preferably used as the electrode through which light is not extracted.

The light-emitting elements included in the display device of this embodiment preferably employ a micro-optical resonator (microcavity) structure. Therefore, one of the pair of electrodes of the light-emitting elements is preferably an electrode having properties of transmitting and reflecting visible light (transflective electrode), and the other is preferably an electrode having a property of reflecting visible light (reflective electrode). When the light-emitting elements have a microcavity structure, light obtained from the light-emitting layers can be resonated between the electrodes, whereby light emitted from the light-emitting elements can be intensified.

The transparent electrode has a light transmittance higher than or equal to 40%. For example, an electrode having a visible light (light with a wavelength greater than or equal to 400 nm and less than 750 nm) transmittance higher than or equal to 40% is preferably used in the light-emitting elements. The visible light reflectivity of the transflective electrode is higher than or equal to 10% and less than or equal to 95%, preferably higher than or equal to 30% and lower than or equal to 80%. The visible light reflectivity of the reflective electrode is higher than or equal to 40% and lower than or equal to 100%, preferably higher than or equal to 70% and lower than or equal to 100%. These electrodes preferably have a resistivity of $1\times10^{-2}$ Ωcm or lower. Note that in the case where any of the light-emitting elements emits near-infrared light (light with a wavelength greater than or equal to 750 nm and less than or equal to 1300 nm), the near-infrared light transmittance and reflectivity of these electrodes preferably satisfy the above-described numerical ranges of the visible light transmittance and reflectivity.

The light-emitting element includes at least the light-emitting layer 383. In addition to the light-emitting layer 383, the light-emitting element may further include a layer containing any of a substance with a high hole-injection property, a substance with a high hole-transport property, a hole-blocking material, a substance with a high electron-transport property, a substance with a high electron-injection property, an electron-blocking material, a substance with a bipolar property (a substance with a high electron- and hole-transport property), and the like.

For example, the light-emitting elements and the light-receiving element can share at least one of the hole-injection layer, the hole-transport layer, the electron-transport layer, and the electron-injection layer. At least one of the hole-injection layer, the hole-transport layer, the electron-transport layer, and the electron-injection layer can each be separately formed for the light-emitting elements and the light-receiving element.

In the light-receiving element, the hole-transport layer transports holes generated in the active layer on the basis of incident light, to the anode. In the light-receiving element, the electron-transport layer transports electrons generated in the active layer on the basis of incident light, to the cathode.

Note that for the hole-injection layer, the hole-transport layer, the electron-transport layer, the electron-injection layer, and the light-emitting layer, the content described in <Schematic top view and cross-sectional schematic view of light-emitting element and its surroundings> can be referred to.

The active layer 373 includes a semiconductor. Examples of the semiconductor include an inorganic semiconductor such as silicon and an organic semiconductor including an organic compound. This embodiment shows an example in which an organic semiconductor is used as the semiconductor included in the active layer 373. The use of an organic semiconductor is preferable because the light-emitting layer 383 and the active layer 373 can be formed by the same method (e.g., a vacuum evaporation method) and thus the same manufacturing apparatus can be used.

Examples of an n-type semiconductor material included in the active layer 373 are electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases. Although π-electrons widely spread in fullerene having a spherical shape, its electron-accepting property is high. The high electron-accepting property efficiently causes rapid charge separation and is useful for the light-receiving element. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of fullerene derivatives include [6,6]-phenyl-C71-butyric acid methyl ester (abbreviation: PC70BM), [6,6]-phenyl-C61-butyric acid methyl ester (abbreviation: PC60BM), and 1',1'',4',4''-Tetrahydro-di[1,4]methanonaphthaleno[1,2:2',3',56,60:2'',3''][5,6]fullerene-C60 (abbreviation: ICBA).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer 373 include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer 373 is preferably formed by co-evaporation of an n-type semiconductor and a p-type semiconductor. Alternatively, the active layer 373 may be formed by stacking an n-type semiconductor and a p-type semiconductor.

Either a low molecular compound or a high molecular compound can be used for the light-emitting elements and the light-receiving element, and an inorganic compound may also be included. Each of the layers included in the light-emitting elements and the light-receiving element can be formed by any of the following methods: an evaporation method (including a vacuum evaporation method), a transfer method, a printing method, an inkjet method, a coating method, and the like.

As the hole-transport material, a high molecular compound such as poly(3,4-ethylenedioxythiophene)/poly(styrenesulfonic acid) (PEDOT/PSS), or an inorganic compound such as a molybdenum oxide or copper iodide (CuI) can be used, for example. As the electron-transport material, an inorganic compound such as a zinc oxide (ZnO) can be used.

For the active layer 373, a high molecular compound such as poly[[4,8-bis[5-(2-ethylhexyl)-2-thienyl]benzo[1,2-b:4,5-H]dithiophene-2,6-diyl]-2,5-thiophenediyl[5,7-bis(2-ethylhexyl)-4,8-dioxo-4H, 8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

The active layer 373 may contain a mixture of three or more kinds of materials. For example, a third material may be mixed with an n-type semiconductor material and a p-type semiconductor material in order to extend the wavelength range. The third material may be a low molecular compound or a high molecular compound.

Figure 28A:
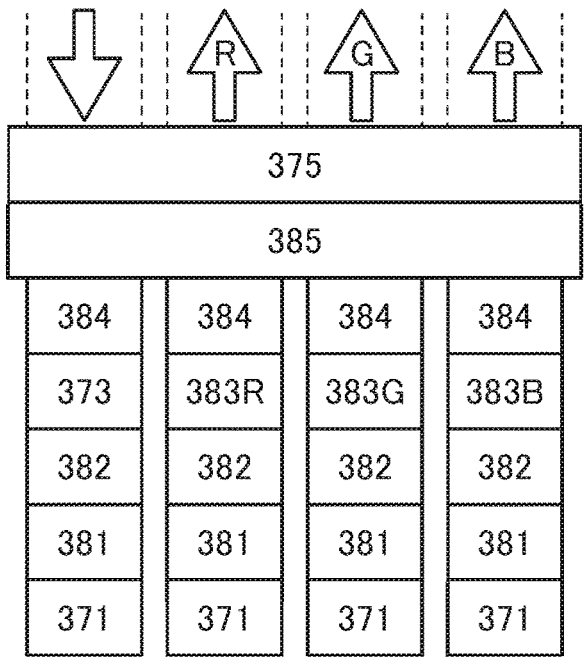
FIG. 28A and FIG. 28B are diagrams illustrating structure examples of display devices.

A display device 380B illustrated in FIG. 28A includes a light-receiving element 370PD, a light-emitting element 370R which emits red (R) light, a light-emitting element 370G which emits green (G) light, and a light-emitting element 370B which emits blue (B) light.

The display device 380B illustrated in FIG. 28A is different from the display device 380A illustrated in FIG. 27 in not including the light-emitting element 370IR that emits infrared light (IR). Note that the other components are similar to those of the display device 380A and thus, for their details, the above description relating to FIG. 27 or the like can be referred to.

Figure 28B:
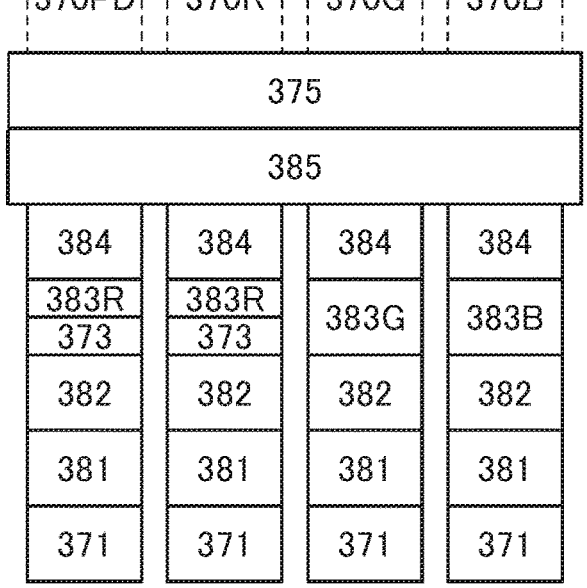

A display device 380C illustrated in FIG. 28B is different from the display device 380B in that the light-receiving element 370PD and the light-emitting element 370R have the same structure.

The light-receiving element 370PD and the light-emitting element 370R share the active layer 373 and the light-emitting layer 383R.

Here, it is preferable that the light-receiving element 370PD have a structure in common with the light-emitting element that emits light with a wavelength longer than that of the light desired to be detected. For example, the light-receiving element 370PD having a structure in which blue light is detected can have a structure which is similar to that of one or both of the light-emitting element 370R and the light-emitting element 370G. For example, the light-receiving element 370PD having a structure in which green light is detected can have a structure similar to that of the light-emitting element 370R.

When the light-receiving element 370PD and the light-emitting element 370R have a common structure, the number of film formation steps and the number of masks can be reduced from those used in the structure where the light-receiving element 370PD and the light-emitting element 370R include separately formed layers. Consequently, the manufacturing steps and the manufacturing costs of the display device can be reduced.

When the light-receiving element 370PD and the light-emitting element 370R have the common structure, a margin for misalignment can be reduced compared with the structure in which the light-receiving element 370PD and the light-emitting element 370R include separately formed layers. Accordingly, the aperture ratio of pixels can be increased and the light extraction efficiency of the display device can be increased. This can extend the life of the light-emitting element. Furthermore, the display device can exhibit a high luminance. Moreover, the resolution of the display device can be increased.

The light-emitting layer 383R includes a light-emitting material that emits red light. The active layer 373 contains an organic compound that absorbs light with a wavelength shorter than that of red light (e.g., either or both of green light and blue light). The active layer 373 preferably contains an organic compound that does not easily absorb red light and that absorbs light with a wavelength shorter than that of red light. In this way, red light can be efficiently extracted from the light-emitting element 370R, and the light-receiving element 370PD can detect light with a wavelength shorter than that of red light at high accuracy.

Although the display device 380C is an example where the light-emitting element 370R and the light-receiving element 370PD have the same structure, the optical adjustment layer of the light-emitting element 370R may have a thickness different from that of the optical adjustment layer of the light-receiving element 370PD.

Figure 29A:
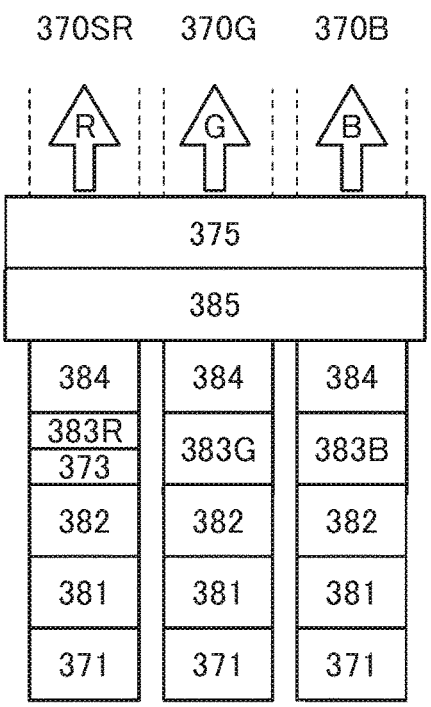
FIG. 29A to FIG. 29G are diagrams illustrating structure examples of a display device.
Figure 29B:
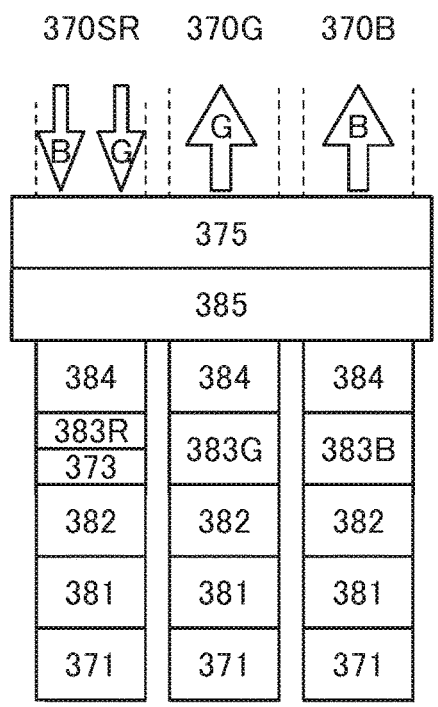

A display device 380D illustrated in FIG. 29A and FIG. 29B includes a light-emitting and light-receiving element 370SR that emits red (R) light and has a light-receiving function, the light-emitting element 370G, and the light-emitting element 370B. The above description of the display device 380A and the like can be referred to for the structures of the light-emitting element 370G and the light-emitting element 370B.

The light-emitting and light-receiving element 370SR includes the pixel electrode 371, the hole-injection layer 381, the hole-transport layer 382, the active layer 373, the light-emitting layer 383R, the electron-transport layer 384, the electron-injection layer 385, and the common electrode 375 which are stacked in this order. The light-emitting and light-receiving element 370SR has the same structure as the light-emitting element 370R and the light-receiving element 370PD illustrated in the display device 380C.

FIG. 29A illustrates a case where the light-emitting and light-receiving element 370SR functions as a light-emitting element. FIG. 29A illustrates an example in which the light-emitting element 370B emits blue light, the light-emitting element 370G emits green light, and the light-emitting and light-receiving element 370SR emits red light.

FIG. 29B illustrates a case where the light-emitting and light-receiving element 370SR functions as a light-receiving element. FIG. 29B illustrates an example in which the light-emitting and light-receiving element 370SR receives blue light emitted by the light-emitting element 370B and green light emitted by the light-emitting element 370G.

The light-emitting element 370B, the light-emitting element 370G, and the light-emitting and light-receiving element 370SR each include the pixel electrode 371 and the common electrode 375. In this embodiment, the case where the pixel electrode 371 functions as an anode and the common electrode 375 functions as a cathode is described as an example. The light-emitting and light-receiving element 370SR is driven by application of reverse bias between the pixel electrode 371 and the common electrode 375, whereby light incident on the light-emitting and light-receiving element 370SR can be detected and electric charge can be generated and extracted as a current.

It can be said that the light-emitting and light-receiving element 370SR has a structure in which the active layer 373 is added to the light-emitting element. That is, the light-emitting and light-receiving element 370SR can be formed concurrently with the light-emitting element only by adding a step of forming the active layer 373 in the manufacturing process of the light-emitting element. The light-emitting elements and the light-emitting and light-receiving element can be formed over one substrate. Thus, one or both of an image capturing function and a sensing function can be provided to a display region without a significant increase in the number of manufacturing steps.

The stacking order of the light-emitting layer 383R and the active layer 373 is not limited. In FIG. 29A and FIG. 29B, the active layer 373 is provided over the hole-transport layer 382, and the light-emitting layer 383R is provided over the active layer 373. The stacking order of the light-emitting layer 383R and the active layer 373 may be reversed.

The light-emitting and light-receiving element may exclude at least one of the hole-injection layer 381, the hole-transport layer 382, the electron-transport layer 384, and the electron-injection layer 385. The light-emitting and light-receiving element may include another functional layer such as a hole-blocking layer or an electron-blocking layer.

In the light-emitting and light-receiving element, a conductive film that transmits visible light is used as the electrode through which light is extracted. A conductive film that reflects visible light is preferably used as the electrode through which light is not extracted.

The functions and materials of the layers constituting the light-emitting and light-receiving element are similar to those of the layers constituting the light-emitting elements and the light-receiving element and not described in detail here.

FIG. 29C to FIG. 29G illustrate examples of stacked-layer structures of light-emitting and light-receiving elements.

Figures 29C, 29D, 29E, 29F, 29G:
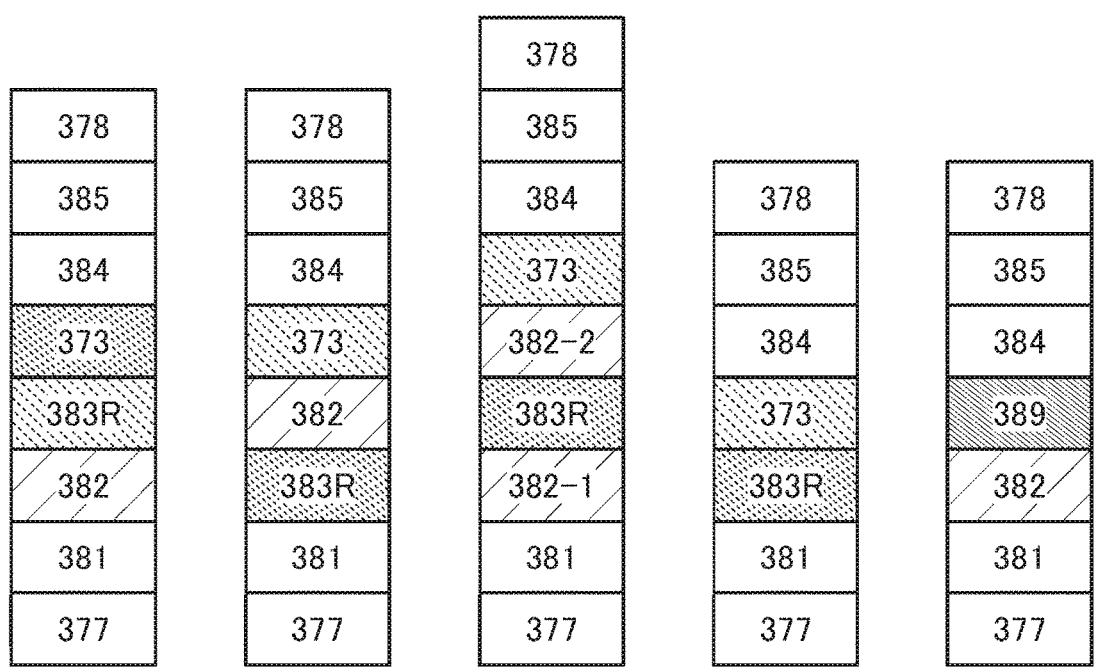

A light-emitting and light-receiving element illustrated in FIG. 29C includes a first electrode 377, the hole-injection layer 381, the hole-transport layer 382, the light-emitting layer 383R, the active layer 373, the electron-transport layer 384, the electron-injection layer 385, and a second electrode 378.

FIG. 29C illustrates an example in which the light-emitting layer 383R is provided over the hole-transport layer 382, and the active layer 373 is stacked over the light-emitting layer 383R.

As illustrated in FIG. 29A to FIG. 29C, the active layer 373 and the light-emitting layer 383R may be in contact with each other.

A buffer layer is preferably provided between the active layer 373 and the light-emitting layer 383R. In that case, the buffer layer preferably has a hole-transport property and an electron-transport property. For example, a bipolar substance is preferably used for the buffer layer. Alternatively, as the buffer layer, at least one of a hole-injection layer, a hole-transport layer, an electron-transport layer, an electron-injection layer, a hole-blocking layer, an electron-blocking layer, and the like can be used. FIG. 29D illustrates an example where the hole-transport layer 382 is used as the buffer layer.

The buffer layer provided between the active layer 373 and the light-emitting layer 383R can inhibit transfer of excitation energy from the light-emitting layer 383R to the active layer 373. Furthermore, the optical path length (cavity length) of the microcavity structure can be adjusted with the buffer layer. Thus, high emission efficiency can be obtained from the light-emitting and light-receiving element including the buffer layer between the active layer 373 and the light-emitting layer 383R.

FIG. 29E illustrates an example in which a hole-transport layer 382-1, the active layer 373, a hole-transport layer 382-2, and the light-emitting layer 383R are stacked in this order over the hole-injection layer 381. The hole-transport layer 382-2 functions as a buffer layer. The hole-transport layer 382-1 and the hole-transport layer 382-2 may contain the same material or different materials. Instead of the hole-transport layer 382-2, a layer that can be used as the buffer layer may be used. The positions of the active layer 373 and the light-emitting layer 383R may be interchanged.

The light-emitting and light-receiving element illustrated in FIG. 29F is different from the light-emitting and light-receiving element illustrated in FIG. 29A in that the hole-transport layer 382 is not included. Thus, the light-emitting and light-receiving element may exclude at least one of the hole-injection layer 381, the hole-transport layer 382, the electron-transport layer 384, and the electron-injection layer 385. The light-emitting and light-receiving element may include another functional layer such as a hole-blocking layer or an electron-blocking layer.

The light-emitting and light-receiving element illustrated in FIG. 29G is different from the light-emitting and light-receiving element illustrated in FIG. 29A in including a layer 389 serving as both a light-emitting layer and an active layer instead of including the active layer 373 and the light-emitting layer 383R.

As the layer serving as both a light-emitting layer and an active layer, a layer containing three materials which are an n-type semiconductor that can be used for the active layer 373, a p-type semiconductor that can be used for the active layer 373, and a light-emitting substance that can be used for the light-emitting layer 383R can be used, for example.

An absorption band on the lowest energy side of an absorption spectrum of a mixed material of the n-type semiconductor and the p-type semiconductor and a maximum peak of an emission spectrum (PL spectrum) of the light-emitting substance preferably do not overlap with each other and are further preferably positioned fully apart from each other.

Structure Example of Display Device

Figure 30:
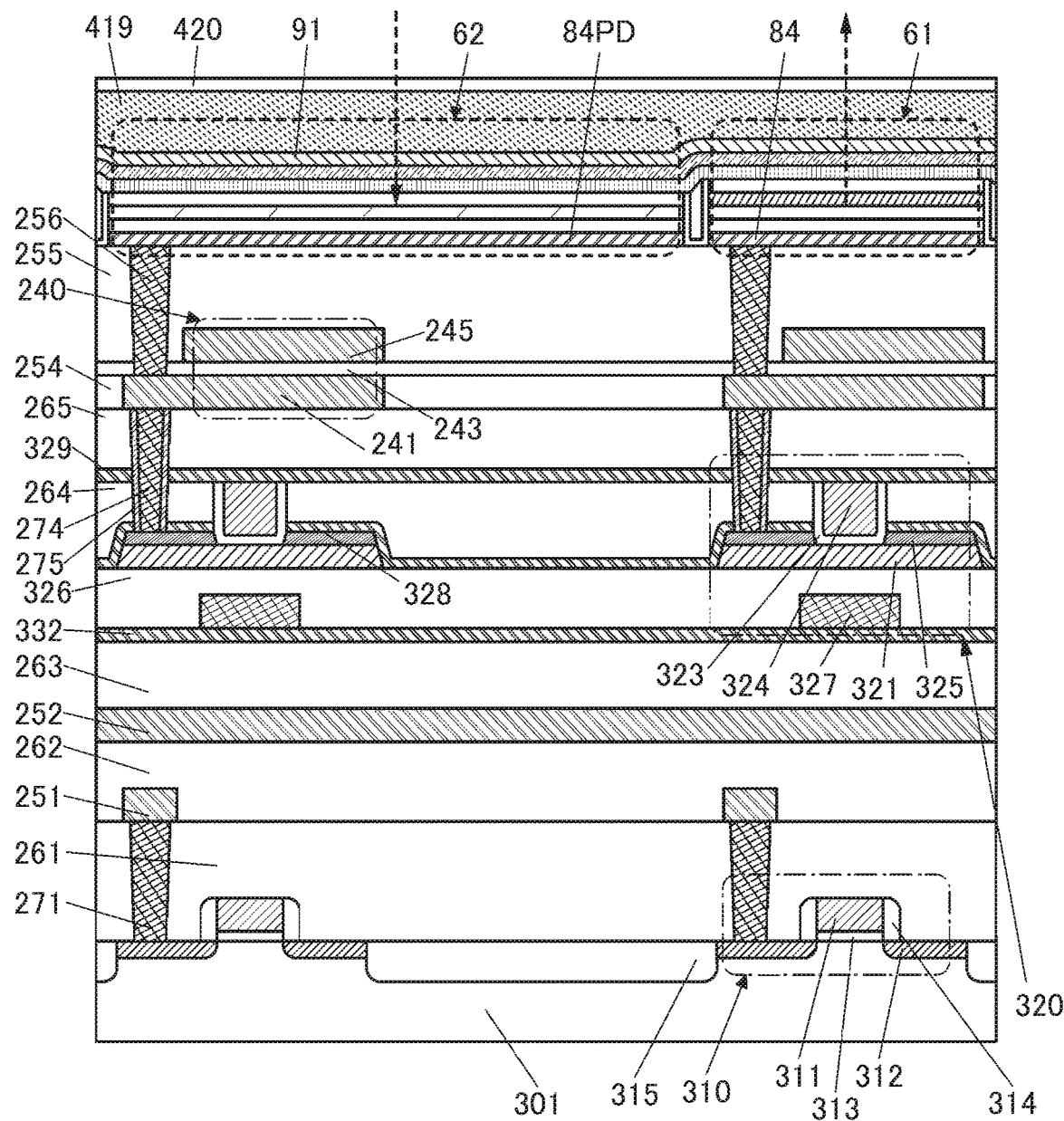
FIG. 30 is a diagram illustrating a structure example of a display device.

FIG. 30 is a cross-sectional view illustrating a structure example of the display device 10. The display device 10 has a structure in which a transistor 310 whose channel is formed in a substrate 301 and a transistor 320 including a metal oxide in a semiconductor layer where a channel is formed are stacked.

An insulating layer 261 is provided so as to cover the transistor 310, and a conductive layer 251 is provided over the insulating layer 261. An insulating layer 262 is provided so as to cover the conductive layer 251, and a conductive layer 252 is provided over the insulating layer 262. The conductive layer 251 and the conductive layer 252 each function as a wiring. An insulating layer 263 and an insulating layer 332 are provided so as to cover the conductive layer 252, and the transistor 320 is provided over the insulating layer 332. An insulating layer 265 is provided so as to cover the transistor 320, and a capacitor 240 is provided over the insulating layer 265. The capacitor 240 and the transistor 320 are electrically connected to each other through a plug 274.

The transistor 320 can be used as a transistor included in a pixel circuit or a transistor included in a memory cell. The transistor 310 can be used as a transistor included in a memory cell, a transistor included in a driver circuit for driving the pixel circuit, or a transistor included in an arithmetic circuit. The transistor 310 and the transistor 320 can also be used as transistors included in a variety of circuits such as an arithmetic circuit and a memory circuit.

The transistor 310 includes a channel formation region in the substrate 301. As the substrate 301, a semiconductor substrate such as a single crystal silicon substrate can be used, for example. The transistor 310 includes part of the substrate 301, a conductive layer 311, a pair of low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The pair of low-resistance regions 312 are regions where the substrate 301 is doped with an impurity, and function as a source and a drain. The insulating layer 314 is provided so as to cover a side surface of the conductive layer 311 and functions as an insulating layer.

An element isolation layer 315 is provided between two adjacent transistors 310 so as to be embedded in the substrate 301.

The transistor 320 contains a metal oxide (also referred to as an oxide semiconductor) in a semiconductor layer where a channel is formed.

The transistor 320 includes a semiconductor layer 321, an insulating layer 323, a conductive layer 324, a pair of conductive layers 325, an insulating layer 326, and a conductive layer 327.

The insulating layer 332 functions as a barrier layer that prevents diffusion of impurities such as water and hydrogen from the substrate 301 side into the transistor 320 and release of oxygen from the semiconductor layer 321 to the insulating layer 332 side. As the insulating layer 332, for example, a film in which hydrogen or oxygen is less likely to diffuse than in a silicon oxide film such as an aluminum oxide film, a hafnium oxide film, and a silicon nitride film can be used.

The conductive layer 327 is provided over the insulating layer 332, and the insulating layer 326 is provided so as to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

It is preferable that the conductive layer 327 be a single conductive layer or two or more conductive layers stacked. In the case where the conductive layer 327 has a structure in which two conductive layers are stacked, of the two conductive layers, the conductive layer in contact with the bottom surface and the side wall of an opening provided in the insulating layer 326 is preferably formed using a conductive material having a function of inhibiting diffusion of oxygen or an impurity such as water or hydrogen. Examples of such a conductive material include titanium, titanium nitride, tantalum, tantalum nitride, ruthenium, and ruthenium oxide. The above structure can inhibit diffusion of an impurity such as water or hydrogen into the semiconductor layer 321.

It is preferable that the insulating layer 326 be a single inorganic insulating film or two or more inorganic insulating films stacked. In the case where the insulating layer 326 is two or more inorganic insulating films stacked, one of the inorganic insulating films included in the insulating layer 326 preferably functions as a barrier layer preventing diffusion of an impurity such as water or hydrogen from the substrate 301 side into the transistor 320. As the inorganic insulating film, an insulating film similar to the insulating layer 328 can be used.

The semiconductor layer 321 is provided over the insulating layer 326. The semiconductor layer 321 preferably includes a metal oxide (also referred to as an oxide semiconductor) film having semiconductor characteristics. For the semiconductor layer 321, a metal oxide containing at least one of indium, zinc, and the element M (the element M is aluminum, gallium, yttrium, or tin) is preferably used. An OS transistor including such a metal oxide in a channel formation region has a characteristic of an extremely low off-state current. Thus, it is preferable that such an OS transistor be used as a transistor provided in a pixel circuit, in which case analog data written to the pixel circuit can be retained for a long time. Similarly, it is preferable that such an OS transistor be used as a transistor provided in a memory cell, in which case analog data written to the memory cell can be retained for a long time.

The pair of conductive layers 325 is provided on and in contact with the semiconductor layer 321, and functions as a source electrode and a drain electrode.

An insulating layer 328 is provided so as to cover top and side surfaces of the pair of conductive layers 325, a side surface of the semiconductor layer 321, and the like, and an insulating layer 264 is provided over the insulating layer 328. The insulating layer 328 functions as a barrier layer that prevents diffusion of impurities such as water and hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with side surfaces of the insulating layer 264, the insulating layer 328, and the conductive layer 325, and the top surface of the semiconductor layer 321 and the conductive layer 324 are embedded in the opening. The conductive layer 324 functions as a second gate electrode, and the insulating layer 323 functions as a second gate insulating layer.

As the insulating layer 323, for example, an inorganic insulating film such as a silicon oxide film or a silicon oxynitride film can be used. Note that the insulating layer 323 is not necessarily a single inorganic insulating film but may be two or more inorganic insulating films stacked. For example, an aluminum oxide film, a hafnium oxide film, a silicon nitride film, or the like may be provided in the form of a single layer or stacked layers on the side in contact with the conductive layer 324. Thus, oxidation of the conductive layer 324 can be inhibited. Furthermore, for example, an aluminum oxide film or a hafnium oxide film may be provided on the side in contact with the insulating layer 264, the insulating layer 328, and the conductive layer 325. In this case, it is possible to inhibit release of oxygen from the semiconductor layer 321, excessive supply of oxygen to the semiconductor layer 321, oxidation of the conductive layer 325, and the like.

The top surface of the conductive layer 324, the top surface of the insulating layer 323, and the top surface of the insulating layer 264 are planarized so that they are substantially level with each other, and an insulating layer 329 and the insulating layer 265 are provided so as to cover these layers.

Note that the conductive layer 327 and the conductive layer 324 preferably overlap with each other with an insulator therebetween on the outer side of the side surface of the semiconductor layer 321 in the channel width direction. With this structure, the channel formation region of the semiconductor layer 321 can be electrically surrounded by the electric field of the conductive layer 327 functioning as the first gate electrode and the electric field of the conductive layer 324 functioning as the second gate electrode. In this specification, a transistor structure in which the channel formation region is electrically surrounded by the electric fields of the first gate electrode and the second gate electrode is referred to as a surrounded channel (S-channel) structure.

In this specification and the like, a transistor having the S-channel structure refers to a transistor having a structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

When the transistor 320 becomes normally-off and has the above-described S-channel structure, the channel formation region can be electrically surrounded. Accordingly, the transistor 320 can be regarded as having a GAA (Gate All Around) structure or an LGAA (Lateral Gate All Around) structure. When the transistor 320 has the S-Channel structure, the GAA structure, or the LGAA structure, the channel formation region that is formed at the interface between the semiconductor layer 321 and the gate insulating film or in the vicinity of the interface can be formed in the entire bulk of the semiconductor layer 321. Therefore, the density of current flowing in the transistor can be improved, and thus the on-state current of the transistor can be expected to be improved or the field-effect mobility of the transistor can be expected to be increased.

The insulating layer 264 and the insulating layer 265 each function as an interlayer insulating layer. The insulating layer 329 functions as a barrier layer that prevents diffusion of impurities such as water and hydrogen from the insulating layer 265 and the like to the transistor 320. For the insulating layer 329, an insulating film similar to those used for the insulating layer 328 and the insulating layer 332 can be used.

The plug 274 electrically connected to one of the pair of conductive layers 325 is provided so as to be embedded in the insulating layer 265, the insulating layer 329, and the insulating layer 264. The plug 274 is formed using a single conductive layer or a stacked structure of two or more conductive layers. In the case where the plug 274 has a structure in which two conductive layers are stacked, of the two conductive layers, the conductive layer that covers the side surface of the opening in the insulating layer 265, the insulating layer 329, the insulating layer 264, and the insulating layer 328 and part of the top surface of the conductive layer 325 is preferably formed using a conductive material into which hydrogen and oxygen do not easily diffuse. This structure inhibits an impurity such as water or hydrogen from entering the semiconductor layer 321 from the insulating layer 264 and the like through the plug 274. Furthermore, the structure inhibits oxygen contained in the insulating layer 264 from being absorbed by the plug 274.

An insulating layer 275 is provided in contact with the side surface of the plug 274. That is, a structure may be employed in which the insulating layer 275 is provided in contact with the inner wall of the opening in the insulating layer 265, the insulating layer 329, and the insulating layer 264 and the plug 274 is provided in contact with the side surface of the insulating layer 275 and part of the top surface of the conductive layer 325. Note that the insulating layer 275 is not necessarily provided.

The capacitor 240 includes a conductive layer 241, a conductive layer 245, and an insulating layer 243 between the conductive layer 241 and the conductive layer 245. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 265 and is embedded in the insulating layer 254. The conductive layer 241 is electrically connected to one of a source and a drain of the transistor 310 through the plug 271 embedded in the insulating layer 261. The insulating layer 243 is provided so as to cover the conductive layer 241. The conductive layer 245 is provided in a region overlapping with the conductive layer 241 with the insulating layer 243 therebetween.

An insulating layer 255 is provided so as to cover the capacitor 240, and the light-emitting element 61, the light-receiving element 62, and the like are provided over the insulating layer 255. The protective layer 91 is provided over the light-emitting element 61 and the light-receiving element 62, and a substrate 420 is bonded to the top surface of the protective layer 91 with a resin layer 419. A light-transmitting substrate can be used as the substrate 420.

The pixel electrode 84 of the light-emitting element 61 and the pixel electrode 84PD of the light-receiving element 62 are electrically connected to one of the source and the drain of the transistor 310 through a plug 256 embedded in the insulating layer 255, the conductive layer 241 embedded in the insulating layer 254, and the plug 271 embedded in the insulating layer 261.

With such a structure, OS transistors included in a pixel circuit and a memory cell as well as the driver circuit, an arithmetic circuit, and the like can be provided directly under the light-receiving element and the light-emitting element; thus, the size of a display device with higher performance can be reduced.

FIG. 30 illustrates the display device 10 having a structure in which the transistor 310 and the transistor 320 are stacked. The structure of the display device 10 is not limited to the above, and the display device 10 may have a structure including the transistor 310 but not including the transistor 320; a structure not including the transistor 310 but including the transistor 320; a structure in which a plurality of transistors 320 are stacked; or a structure in which the transistor 310 and the plurality of transistors 320 over the transistor 310 are stacked.

In the case where a silicon substrate is used as the substrate 301, a photodiode with a photoelectric conversion layer that is formed on the silicon substrate may be provided, and the photodiode can be used as the light-receiving element in the sensor portion 104 described in Embodiment 1. In other words, the light-receiving element in the sensor portion 104 described in Embodiment 1 may be formed over a silicon substrate. In this case, the transistor 310 is not necessarily formed.

At least part of any of the structure examples, the drawings corresponding thereto, and the like described in this embodiment can be combined with the other structure examples, the other drawings, and the like as appropriate.

At least part of this embodiment can be implemented in combination with any of the other embodiments described in this specification, as appropriate.

Supplementary Notes on Description in this Specification and the Like

The description of the above embodiments and each structure in the embodiments are noted below.

One embodiment of the present invention can be constituted by combining, as appropriate, the structure described in each embodiment with the structures described in the other embodiments. In addition, in the case where a plurality of structure examples are described in one embodiment, the structure examples can be combined as appropriate.

Note that a content (or part of the content) described in an embodiment can be applied to, combined with, or replaced with another content (or part of the content) described in the embodiment and/or a content (or part of the content) described in another embodiment or other embodiments.

Note that in each embodiment, a content described in the embodiment is a content described using a variety of diagrams or a content described with text disclosed in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

In addition, in this specification and the like, components are classified on the basis of the functions, and shown as blocks independent of one another in block diagrams. However, in an actual circuit and the like, such components are sometimes hard to classify functionally, and there is a case where one circuit is associated with a plurality of functions and a case where a plurality of circuits are associated with one function. Therefore, blocks in the block diagrams are not limited by the components described in this specification, and the description can be changed appropriately depending on the situation.

In drawings, the size, the layer thickness, or the region is shown arbitrarily for description convenience. Therefore, they are not limited to the illustrated scale. Note that the drawings are schematically shown for clarity, and embodiments of the present invention are not limited to shapes, values, or the like shown in the drawings. For example, variations in a signal, a voltage, or a current due to noise, variations in a signal, a voltage, or a current due to difference in timing, or the like can be included.

In this specification and the like, the terms "one of a source and a drain" (or a first electrode or a first terminal) and "the other of the source and the drain" (or a second electrode or a second terminal) are used to describe the connection relationship of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the terms such as "electrode" and "wiring" do not limit the functions of the components. For example, an "electrode" is used as part of a "wiring" in some cases, and vice versa. Furthermore, the term such as "electrode" or "wiring" also includes the case where a plurality of "electrodes" or "wirings" are formed in an integrated manner, for example.

In this specification and the like, voltage and potential can be replaced with each other as appropriate. The term voltage refers to a potential difference from a reference potential, and when the reference potential is a ground potential, for example, voltage can be replaced with potential. The ground potential does not necessarily mean 0 V. Note that potentials are relative, and the potential supplied to a wiring or the like is changed depending on the reference potential, in some cases.

Note that in this specification and the like, the terms "film", "layer", and the like can be interchanged with each other depending on the case or according to circumstances. For example, the term "conductive layer" can be changed into the term "conductive film" in some cases. As another example, the term "insulating film" can be changed into the term "insulating layer" in some cases.

In this specification and the like, a switch has a function of controlling whether a current flows or not by being in a conduction state (an on state) or a non-conduction state (an off state). Alternatively, a switch has a function of selecting and changing a current path.

In this specification and the like, channel length refers to, for example, the distance between a source and a drain in a region where a semiconductor (or a portion where a current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where a current flows in a semiconductor when a transistor is in an on state) and a gate electrode overlap with each other or a region where a channel is formed.

In this specification and the like, the expression "A and B are connected" includes the case where A and B are electrically connected as well as the case where A and B are directly connected. Here, the expression "A and B are electrically connected" means the case where electric signals can be transmitted and received between A and B when an object having any electric action exists between A and B.

Note that in this specification and the like, an element formed using a metal mask or an FMM is sometimes referred to as an element having an MM (metal mask) structure. In this specification and the like, an element formed without using a metal mask or an FMM may be referred to as an element having a metal maskless (MML) structure.

In this specification and the like, a structure in which light-emitting layers in light-emitting elements of different colors (here, blue (B), green (G), and red (R)) are separately formed or separately patterned may be referred to as a SBS (Side By Side) structure. In this specification and the like, a light-emitting element capable of emitting white light may be referred to as a white-light-emitting element. Note that a white-light-emitting element that is combined with coloring layers (e.g., color filters) can be a light-emitting element for full-color display.

The light-emitting elements can be roughly classified into a single structure and a tandem structure. An element having a single structure includes one light-emitting unit between a pair of electrodes, and the light-emitting unit preferably includes one or more light-emitting layers. To obtain white light emission by using two light-emitting layers, two light-emitting layers are selected such that the light-emitting layers emit light of complementary colors. For example, when emission color of a first light-emitting layer and emission color of a second light-emitting layer are complementary colors, the light-emitting element can be configured to emit white light as a whole. To obtain white light emission by using three or more light-emitting layers, the light-emitting element is configured to emit white light as a whole by combining emission colors of the three or more light-emitting layers.

An element having a tandem structure includes two or more light-emitting units between a pair of electrode, and each light-emitting unit preferably includes one or more light-emitting layers. To obtain white light emission, the structure is made so that light from light-emitting layers of the light-emitting units can be combined to be white light. Note that a structure for obtaining white light emission is similar to that in the case of a single structure. In the element having a tandem structure, it is preferable that an intermediate layer such as a charge-generation layer is provided between a plurality of light-emitting units.

When the above-described white-light-emitting element (the single structure or the tandem structure) and a light-emitting element having a SBS structure are compared, the light-emitting element having a SBS structure consumes lower power than the white-light-emitting element. To reduce power consumption, the light-emitting element having an SBS structure is suitably used. In contrast, the white light-emitting element is preferable in that the manufacturing cost is low or the manufacturing yield is high because a process for manufacturing the white light-emitting element is easier than that for the light-emitting element having a SBS structure.

REFERENCE NUMERALS

ACTF: circuit, AFP: circuit, ALP: array portion, BW: bus wiring, C1: capacitor, C1r: capacitor, C5: capacitor, C5m: capacitor, CA: cell array, F1: transistor, F1m: transistor, F2: transistor, F2m: transistor, F3: transistor, F4: transistor, HC: retaining portion, ILD: circuit, ITRZ: circuit, M1: transistor, M1r: transistor, M2: transistor, M3: transistor, M3r: transistor, MAC1: arithmetic circuit, MC: circuit, MCr: circuit, MP: circuit, NN: node, NNref: node, n1: node, OL: wiring, OLB: wiring, SWL1: wiring, SWL2: wiring, SWS1: circuit, SWS2: circuit, TW: circuit, VE: wiring, VEr: wiring, WCL: wiring, WCS: circuit, WL: wiring, WLD: circuit, WSD: circuit, WSL: wiring, WX1L: wiring, XCL: wiring, XCS: circuit, XLD: circuit, 10: display device, 61: light-emitting element, 61B: light-emitting element, 61G: light-emitting element, 61IR: light-emitting element, 61LS: light-emitting element, 61R: light-emitting element, 62: light-receiving element, 80: pixel, 81: common electrode, 82: connection electrode, 83: substrate, 84: pixel electrode, 84B: pixel electrode, 84G: pixel electrode, 84IR: pixel electrode, 84PD: pixel electrode, 84R: pixel electrode, 85: hole-injection layer, 85B: hole-injection layer, 85G: hole-injection layer, 85IR: hole-injection layer, 85R: hole-injection layer, 86: hole-transport layer, 86B: hole-transport layer, 86G: hole-transport layer, 86IR: hole-transport layer, 86PD: hole-transport layer, 86R: hole-transport layer, 87: light-emitting layer, 87B: light-emitting layer, 87G: light-emitting layer, 87IR: light-emitting layer, 87R: light-emitting layer, 88: electron-transport layer, 88B: electron-transport layer, 88G: electron-transport layer, 88IR: electron-transport layer, 88PD: electron-transport layer, 88R: electron-transport layer, 89: common layer, 90: light-receiving layer, 91: protective layer, 92: insulating layer, 93: connection portion, 94: insulating layer, 95: display region, 96: insulating layer, 100: display device, 101: substrate, 102: substrate, 103: support plate, 104: sensor portion, 105: protective member, 106: layer, 108: eyeball, 109: display region, 110: light-emitting element, 110B: light-emitting element, 110G: light-emitting element, 110IR: light-emitting element, 110LS: light-emitting element, 110R: light-emitting element, 120: driver circuit portion, 121: image processing portion, 122: frame memory, 150: electronic device, 151: optical system, 153: motion detection portion, 154: audio, 155: camera, 156: control portion, 157: communication portion, 158: battery, 240: capacitor, 241: conductive layer, 243: insulating layer, 245: conductive layer, 251: conductive layer, 252: conductive layer, 254: insulating layer, 255: insulating layer, 256: plug, 261: insulating layer, 262: insulating layer, 263: insulating layer, 264: insulating layer, 265: insulating layer, 271: plug, 274: plug, 275: insulating layer, 301: substrate, 310: transistor, 311: conductive layer, 312: low-resistance region, 313: insulating layer, 314: insulating layer, 315: element isolation layer, 320: transistor, 321: semiconductor layer, 323: insulating layer, 324: conductive layer, 325: conductive layer, 326: insulating layer, 327: conductive layer, 328: insulating layer, 329: insulating layer, 332: insulating layer, 350: arithmetic circuit, 370B: light-emitting element, 370G: light-emitting element, 370IR: light-emitting element, 370PD: light-receiving element, 370R: light-emitting element, 370SR: light-emitting and light-receiving element, 371: pixel electrode, 373: active layer, 375: common electrode, 377: first electrode, 378: second electrode, 380A: display device, 380B: display device, 380C: display device, 380D: display device, 381: hole-injection layer, 382: hole-transport layer, 382-1: hole-transport layer, 382-2: hole-transport layer, 383: light-emitting layer, 383B: light-emitting layer, 383G: light-emitting layer, 383IR: light-emitting layer, 383R: light-emitting layer, 384: electron-transport layer, 385: electron-injection layer, 389: layer, 419: resin layer, 420: substrate, 672: electrode, 686: EL layer, 686a: EL layer, 686b: EL layer, 688: electrode, 700: electronic device, 701: display device, 702: housing, 703: optical member, 704: temple, 705: camera, 706: display region, 711: lens, 712: reflective plate, 713: reflective surface, 715: light, 716: transmitted light, 750: electronic device, 751: display device, 752: housing, 754: temple, 754A: earphone, 754B: earphone, 755: cushion, 756: lens, 757: input terminal, 758: output terminal, 4411: light-emitting layer, 4412: light-emitting layer, 4413: light-emitting layer, 4420: layer, 4420-1: layer, 4420-2: layer, 4430: layer, 4430-1: layer, 4430-2: layer, 8200: electronic device, 8201: temple, 8202: lens, 8203: main body, 8204: display portion, 8205: cable, 8206: battery, 8300: electronic device, 8301: housing, 8302: display portion, 8304: fixing unit, 8305: lens, 8400: electronic device, 8401: housing, 8402: temple, 8403: cushion, 8404: display portion, 8405: lens

The invention claimed is:

1. An electronic device with an eye tracking function comprising:
   a display device; and
   an optical system,
   wherein the display device comprises a first light-emitting element, a second light-emitting element, a sensor portion, and a driver circuit portion,
   wherein the sensor portion comprises a light-receiving element,
   wherein the first light-emitting element is configured to emit infrared light,
   wherein the second light-emitting element is configured to emit visible light,
   wherein the light-receiving element is configured to detect the infrared light that is emitted from the first light-emitting element and reflected by an eyeball of a user,
   wherein the first light-emitting element and the second light-emitting element are placed in one layer,
   wherein the first light-emitting element and the second light-emitting element have a common electrode, and
   wherein the common electrode and the light-receiving element overlap each other.

2. The electronic device according to claim 1,
wherein the display device further comprises a first substrate and a second substrate,
wherein the first substrate is placed between the first light-emitting element and the second light-emitting element and the sensor portion,
wherein the second substrate overlaps with the first substrate with the first light-emitting element and the second light-emitting element therebetween,
wherein the first substrate has a light-transmitting property at least with respect to infrared light, and
wherein the second substrate has a light-transmitting property with respect to visible light and infrared light.

3. The electronic device according to claim 1,
wherein the light-receiving element is formed over a silicon substrate.

4. The electronic device according to claim 1,
wherein the first light-emitting element is placed outside a display region in a top view.

5. The electronic device according to claim 1,
wherein the first light-emitting element is placed in a display region in a top view.

6. The electronic device according to claim 1,
wherein the sensor portion is placed in a display region in a top view.

7. The electronic device according to claim 1,
wherein the sensor portion is placed outside a display region in a top view.

8. The electronic device according to claim 1,
wherein the display device further comprises an image processing portion, and
wherein eye tracking is performed using the first light-emitting element, the sensor portion, and the image processing portion.

9. The electronic device according to claim 8,
wherein the image processing portion comprises an arithmetic circuit configured to perform a product-sum operation.

10. The electronic device according to claim 9,
wherein the arithmetic circuit comprises a transistor comprising a metal oxide in a channel formation region.

11. The electronic device according to claim 1,
wherein a light-emitting layer included in the first light-emitting element and a light-emitting layer included in the second light-emitting element each comprise a light-emitting organic compound.

12. An electronic device with an eye tracking function comprising:
a display device; and
an optical system,
wherein the display device comprises a first light-emitting element, a second light-emitting element, a sensor portion, and a driver circuit portion,
wherein the sensor portion comprises a light-receiving element,
wherein the first light-emitting element is configured to emit infrared light,
wherein the second light-emitting element is configured to emit visible light,
wherein the light-receiving element is configured to detect the infrared light that is emitted from the first light-emitting element and reflected by an eyeball of a user,
wherein the first light-emitting element, the second light-emitting element, and the sensor portion are placed parallel to a top surface of a pixel electrode included in the first light-emitting element and the second light-emitting element,
wherein the first light-emitting element and the second light-emitting element have a common electrode, and
wherein the common electrode and the light-receiving element overlap each other.

13. The electronic device according to claim 12,
wherein the display device further comprises a first substrate and a second substrate,
wherein the first substrate overlaps with the second substrate with the first light-emitting element, the second light-emitting element, and the sensor portion therebetween, and
wherein the second substrate has a light-transmitting property with respect to visible light and infrared light.

14. An electronic device with an eye tracking function comprising:
a display device; and
an optical system,
wherein the display device comprises a first light-emitting element, a second light-emitting element, a third light-emitting element, an organic photodiode, and a driver circuit portion,
wherein the first light-emitting element, the second light-emitting element, and the third light-emitting element are configured to emit visible light,
wherein the organic photodiode is configured to detect the visible light emitted from the first light-emitting element and reflected by an eyeball of a user,
wherein the first light-emitting element is placed outside a display region in a top view,
wherein the second light-emitting element is placed inside the display region in the top view,
wherein the first light-emitting element and the second light-emitting element have a common electrode,
wherein the first light-emitting element and the second light-emitting element are placed in one layer,
wherein the common electrode and the organic photodiode overlap each other, and
wherein light emitted from the third light-emitting element is introduced into eyes through an optical route using total reflection and a half mirror.

15. The electronic device according to claim 14,
wherein the display device further comprises a first substrate and a second substrate,
wherein the first light-emitting element, the second light-emitting element, and the organic photodiode are placed between the first substrate and the second substrate,
wherein the first light-emitting element, the second light-emitting element, and the organic photodiode are placed parallel to a top surface of the first substrate, and
wherein the second substrate has a light-transmitting property with respect to visible light.

16. The electronic device according to claim 14,
wherein the organic photodiode is placed inside the display region in the top view.

17. The electronic device according to claim 14,
wherein the organic photodiode is placed outside the display region in the top view.

18. The electronic device according to claim 14,
wherein the display device further comprises an image processing portion, and
wherein eye tracking is performed using the first light-emitting element, the organic photodiode, and the image processing portion.

19. The electronic device according to claim 18,
wherein the image processing portion comprises an arithmetic circuit configured to perform a product-sum operation.

20. The electronic device according to claim 19,
wherein the arithmetic circuit comprises a transistor comprising a metal oxide in a channel formation region.

21. The electronic device according to claim 14,
wherein a light-emitting layer included in the first light-emitting element and a light-emitting layer included in the second light-emitting element each comprise a light-emitting organic compound.

* * * * *